(12) United States Patent
Carlson

(10) Patent No.: US 8,101,481 B1
(45) Date of Patent: Jan. 24, 2012

(54) SPACER LITHOGRAPHY PROCESSES

(75) Inventor: Andrew E. Carlson, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 787 days.

(21) Appl. No.: 12/036,836

(22) Filed: Feb. 25, 2008

(51) Int. Cl.
*H01L 21/8234* (2006.01)

(52) U.S. Cl. .... 438/238; 430/311; 430/314; 257/E21.22

(58) Field of Classification Search .................. 430/311, 430/314; 438/238
See application file for complete search history.

(56) References Cited

U.S. PATENT DOCUMENTS

| 2008/0038910 | A1 | 2/2008 | Carlson | |
| 2008/0286449 | A1* | 11/2008 | Park | 427/123 |

OTHER PUBLICATIONS

Choi, Yang-Kyu et al., "A Spacer Patterning Technology for Nanoscale CMOS," IEEE Transactions on Electronic Devices, Mar. 2002, pp. 436-441, vol. 49, No. 3, IEEE.

* cited by examiner

*Primary Examiner* — Alexander Ghyka
(74) *Attorney, Agent, or Firm* — Withrow & Terranova, P.L.L.C.

(57) ABSTRACT

A spacer lithography process for creating negative features such as, for example, cut-lines, or trenches, and holes is provided. The negative spacer lithography process may be utilized along with positive spacer lithography to fabricate electronic devices or the like. In one embodiment, a process is provided for fabricating a 6-transistor Static Random-Access Memory (SRAM) cell or arrays of 6-transistor SRAM cells using only, or at least primarily, positive and negative spacer lithography.

8 Claims, 66 Drawing Sheets

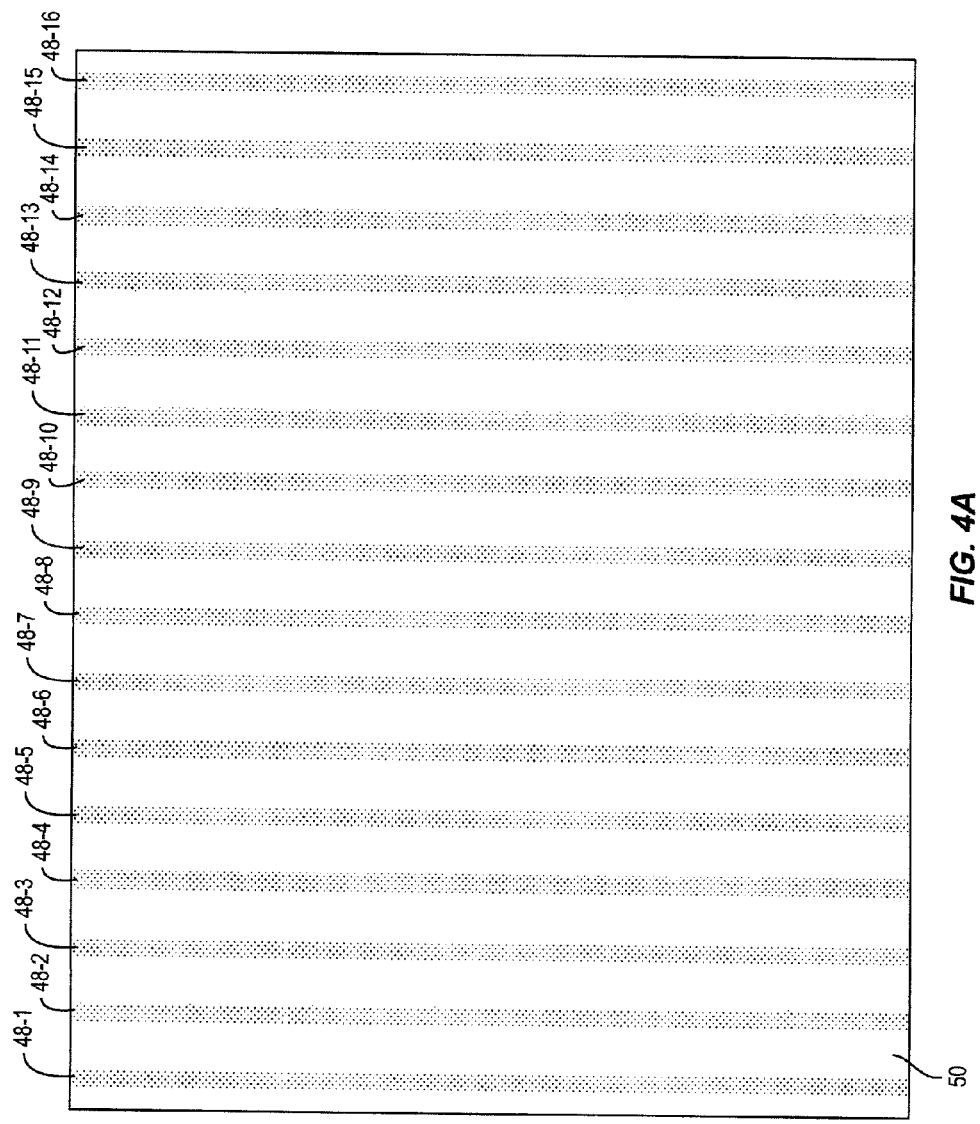

SPACER LITHOGRAPHY PROCESSES

FIELD OF THE INVENTION

The present invention relates to spacer lithography processes for fabricating negative features such as cut-lines, or trenches, and holes and a related fabrication process utilizing both positive and negative spacer lithography.

BACKGROUND OF THE INVENTION

The minimum size of a Static Random-Access Memory (SRAM) cell is determined in part by the minimum pitch of the lithography used to manufacture the cell and in part by the variability in certain dimensions of the transistors (e.g. length of the gate), which contributes to variability in the overall performance of the entire cell. Spacer lithography processes for creating positive features such as lines have been demonstrated and are capable of providing a pitch below the limit of conventional lithography processes with little variation in thickness. However, in devices, such as SRAM cells, that require both positive features and negative features (ex. cut-lines, contact holes, etc.), the degree of integration capable when using positive spacer lithography is limited by the size of the negative features obtainable with conventional processes. As such, there is a need for a process for fabricating negative features at a substantially reduced size. There is also a need for a process of fabricating an SRAM cell at a size substantially less than that which is currently achievable.

SUMMARY OF THE INVENTION

The present invention relates to a spacer lithography process for creating negative features. More specifically, a negative spacer lithography process is provided for creating negative features such as, for example, cut-lines, or trenches, and holes. In one embodiment, the negative spacer lithography process is used to create a cut-line. First, a linear sacrificial structure is fabricated on top of a substrate in which the cut-line is to be created. A spacer material is deposited, or otherwise formed, on top of the linear sacrificial structure and an exposed surface of the substrate. The spacer material is then anisotropically etched such that only portions of the spacer material adjacent to side-walls of the linear sacrificial structure remain, thereby forming spacers along the side-walls of the linear sacrificial structure. A sacrificial layer is thereafter deposited on top of the spacers and the linear sacrificial structure. The sacrificial layer is then processed, or thinned, to expose the spacers. In order to form the desired cut-line, the spacers are then etched, thereby exposing an area of the substrate where the cut-line is to be created. The substrate is then anisotropically etched using the linear sacrificial structure and the sacrificial layer as a mask in order to create the desired cut-line. The linear sacrificial structure and the sacrificial layer may then be removed.

In another embodiment, the negative spacer lithography process is used to create one or more holes. First, a first linear sacrificial structure is fabricated on top of a substrate in which the one or more holes are to be created. A spacer material is deposited, or otherwise formed, on top of the first linear sacrificial structure and the substrate. The spacer material is then anisotropically etched such that only portions of the spacer material adjacent to side-walls of the first linear sacrificial layer remain, thereby forming first spacers along the side-walls of the first linear sacrificial structure. A first sacrificial layer is thereafter deposited on top of the first spacers and the first linear sacrificial structure. The first sacrificial layer is then processed, or thinned, in order to expose the first spacers.

A second linear sacrificial structure is then formed on top of the first linear sacrificial structure, the first spacers, and the first sacrificial layer. A second spacer material is deposited, or otherwise formed, on top of the second linear sacrificial structure and the lower layers. The second spacer material is anisotropically etched such that only portions of the second spacer material adjacent to side-walls of the second linear sacrificial structure remain, thereby forming second spacers along the side-walls of the second linear sacrificial structure. A second sacrificial layer is thereafter deposited on top of the second spacers, the second linear sacrificial structure, and the lower layers. The second sacrificial layer is then processed or thinned to expose the second spacers. The second linear sacrificial structure is positioned such that the second spacers cross over the first spacers at the desired locations of the one or more holes to be formed in the substrate. For example, the second spacers may be perpendicular to the first spacers.

The first and second spacers are then etched to expose an area of the substrate where the one or more holes are to be created. The substrate is then etched using the remaining first and second linear sacrificial structures and the first and second sacrificial layers as a mask in order to create the desired one or more holes in the substrate. The first and second linear sacrificial structures and the first and second sacrificial layers may then be removed.

The negative spacer lithography process may be utilized along with a positive spacer lithography process to provide a process for fabricating an electronic device. In one embodiment, the spacer lithography process is a process for fabricating a six transistor Static Random-Access Memory (SRAM) cell or arrays of six transistor SRAM cells using only positive and negative spacer lithography. More specifically, in one embodiment, one or more arrays of SRAM cells are fabricated using only lines, cut-lines, and holes, where the lines are formed using positive spacer lithography and the cut-lines and holes are formed using negative spacer lithography.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIGS. 4A through 4K illustrate a process for fabricating arrays of SRAM cells using positive and negative spacer lithography processes according to one embodiment of the present invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to a spacer lithography process for creating negative features. In addition, the present invention relates to a process for fabricating structures, such as integrated circuits, using both positive and negative spacer lithography processes. More specifically, in one embodiment of the present invention, a process is provided for fabricating Static Random-Access Memory (SRAM) cells using both positive and negative spacer lithography processes. It should be noted that the inventive negative spacer lithography process is discussed below primarily with respect to the fabrication of SRAM cells. However, the negative spacer lithography process is not limited thereto. The negative spacer lithography process may be utilized in the fabrication of any desired type of integrated circuit. The negative spacer lithography process may additionally be used in other similar applications such as Microelectromechanical Systems (MEMS), carbon nanotube growth, and permeable membrane fabrication.

Figure 1:
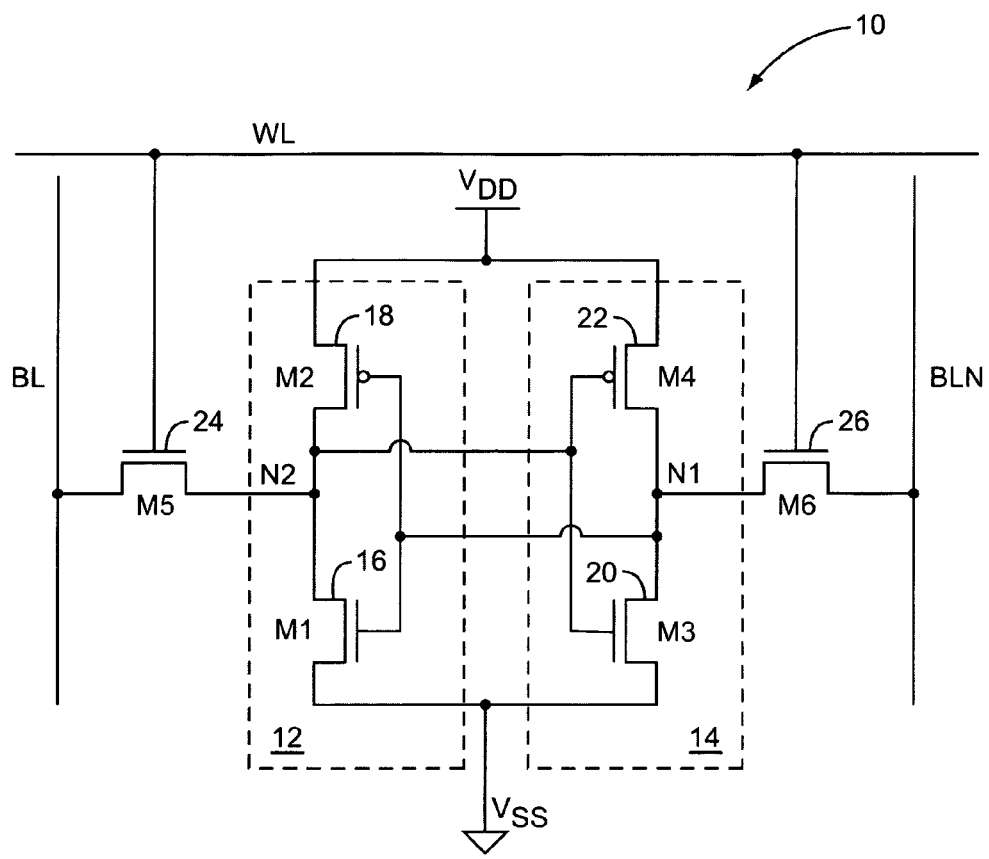
FIG. 1 illustrates a conventional 6-transistor Static Random-Access Memory (SRAM) cell.

FIG. 1 illustrates an exemplary six transistor SRAM cell 10 that may be fabricated utilizing positive and negative spacer lithography processes according to one embodiment of the present invention. As illustrated, the SRAM cell 10 includes a pair of cross-coupled inverters 12 and 14. The inverter 12 includes a pull-down transistor 16 and a pull-up transistor 18 connected as illustrated and has an output node N2. In this embodiment, the pull-down transistor 16 is an n-type Metal Oxide Semiconductor (NMOS) transistor, and the pull-up transistor 18 is a p-type Metal Oxide Semiconductor (PMOS) transistor. Likewise, the inverter 14 includes a pull-down transistor 20 and a pull-up transistor 22 connected as illustrated and has an output node N1. Again, in this embodiment, the pull-down transistor 20 is an NMOS transistor and the pull-up transistor 22 is a PMOS transistor. The output node N2 of the inverter 12 is coupled to the input of the inverter 14. Likewise, the output node N1 of the inverter 14 is coupled to the input of the inverter 12. The output nodes N1 and N2 operate to differentially store a bit of data. If a logic value of "1" is stored at the output node N1, a logic value of "0" is stored at the output node N2. In contrast, if a logic value of "0" is stored at the output node N1, a logic value of "1" is stored at the output node N2.

The SRAM cell 10 also includes access transistors 24 and 26. In this embodiment, gates of the access transistors 24 and 26 are connected to a word line (WL). The word line (WL) therefore controls the state (on/off) of the access transistors 24 and 26. When the word line (WL) is active, the access transistors 24 and 26 are on. As such, the output nodes N2 and N1 of the inverters 12 and 14, respectively, are coupled to bit lines (BL, BLN) in order to perform the desired read or write operation.

Figure 2A:
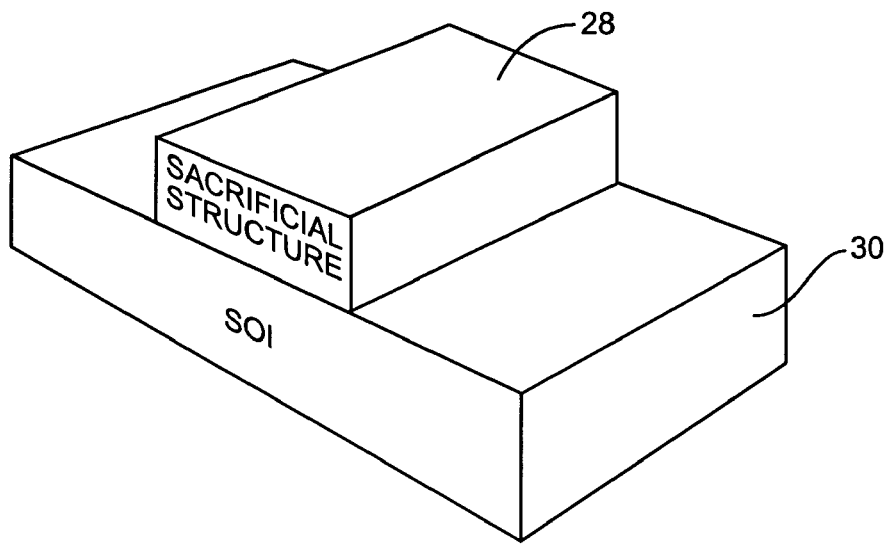
FIGS. 2A through 2D illustrate an exemplary positive spacer lithography process.

Before discussing fabrication of the SRAM cell 10 using only positive and negative spacer lithography process according to one embodiment of the present invention, exemplary positive and negative lithography processes are first described. FIGS. 2A through 2D illustrate a positive spacer lithography process. As used herein, a positive spacer lithography process is a spacer lithography process for creating positive features such as, for example, lines. First, as shown in FIG. 2A, a sacrificial structure 28 is deposited or otherwise formed on a substrate 30. The shape of the sacrificial structure 28 may be defined using, for example, a traditional photolithography process. Alternatively, the sacrificial structure 28 may have been formed using a prior positive spacer process. In this example, the substrate 30 is a Semiconductor-On-Insulator (SOI) substrate. However, the present invention is not limited thereto. The substrate 30 may alternatively be, for example, a homogenous, bulk substrate. The sacrificial structure 28 may be formed using a sacrificial material such as, for example, Silicon, Silicon Germanium, or the like.

Figure 2B:
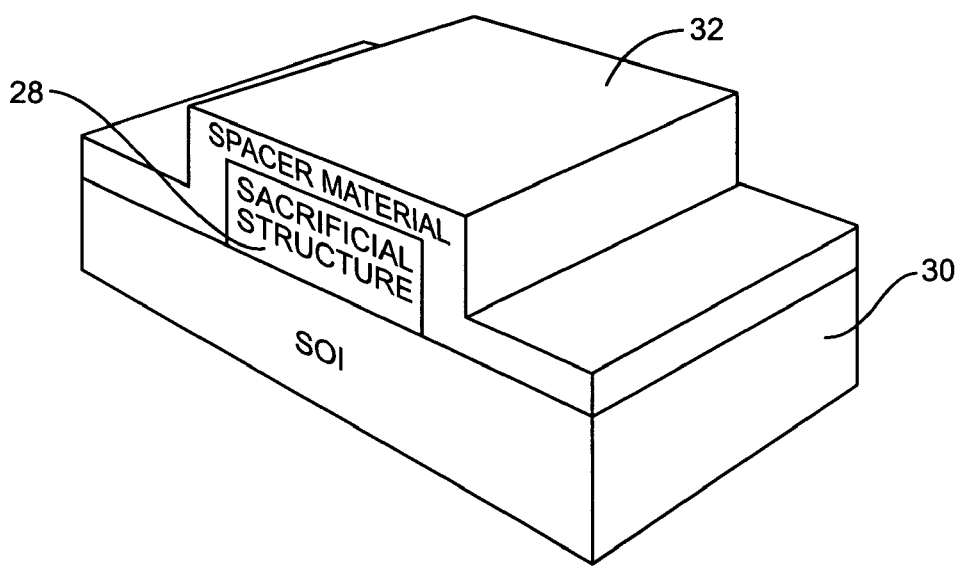
Figure 2C:
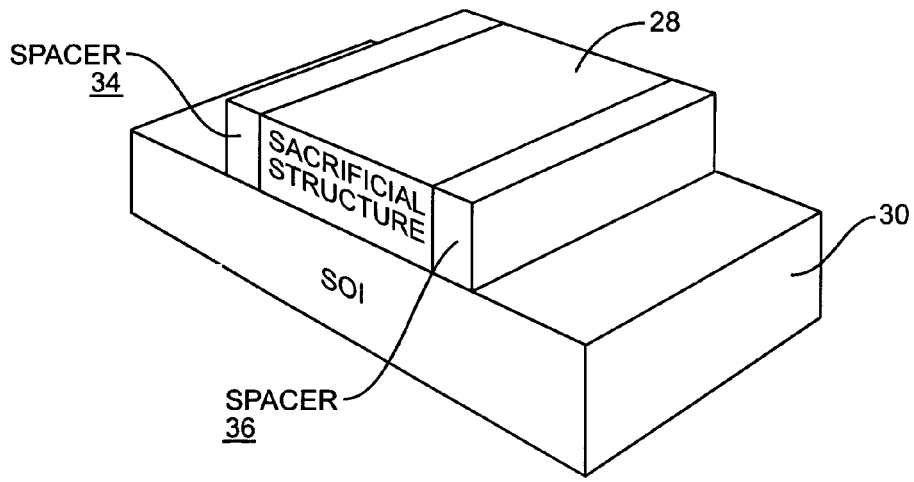
Figure 2D:
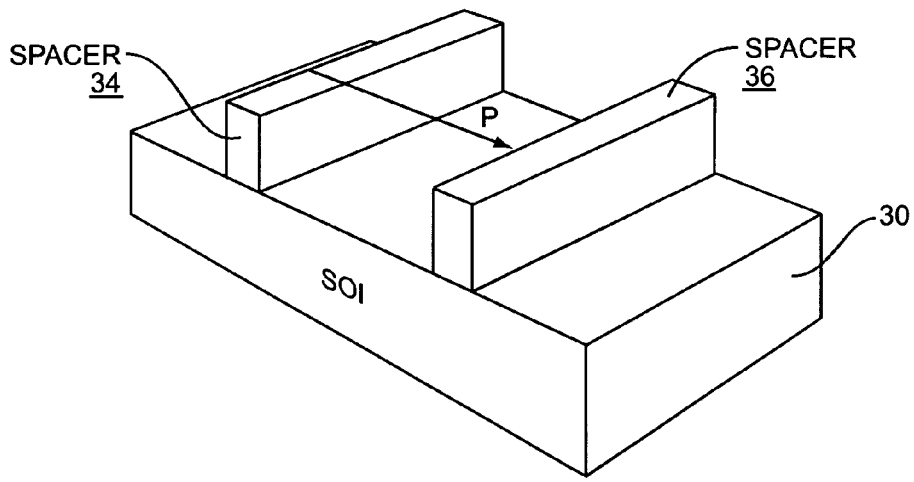

As shown in FIG. 2B, a spacer material layer 32 is then deposited, or otherwise formed, on top of the sacrificial structure 28 and the exposed portion of the substrate 30. The spacer material layer 32 is formed using a sacrificial material that is different than that used for the sacrificial structure 28. For example, if the sacrificial structure 28 is formed using Silicon or Silicon Germanium, the spacer material layer 32 may be formed using Silicon Dioxide, Phosphosilicate Glass (PSG), Silicon Nitride, or the like. However, the present invention is not limited thereto. Next, as shown in FIG. 2C, the spacer material layer 32 is anisotropically etched such that only a portion of the spacer material layer 32 adjacent to side-walls of the sacrificial structure 28 remains, thereby providing spacers 34 and 36. Note that, as used herein, anisotropic etching is defined as etching substantially or preferentially in one direction. In contrast, isotropic etching is defined as etching in many or all directions. Lastly, the sacrificial structure 28 is removed or etched, as shown in FIG. 2D. A pitch (P) of the two spacers 34 and 36 is as shown. Pitch is defined as the distance between an identical point in two neighboring features.

Note that the positive spacer process may be repeated using the spacers 34 and 36 as the initial sacrificial structures in order to further decrease the pitch between the resultant spacers until a desired pitch is achieved. Using the positive spacer process, the pitch between positive features may be reduced to nanometer scale, thereby allowing higher integration densities and/or smaller die areas for integrated circuits. The size of the positive feature, which is the spacer, and thus the final pitch is only limited by the minimum deposition thickness of the spacer material layer 32.

One issue with respect to the positive spacer process is that integrated circuits also include negative features such as cut-lines (or trenches), contact holes, and the like. Thus, while the positive spacer process enables the fabrication of positive features on a nanoscale such as, for example, on the scale of 10 s of nanometers, the fabrication of negative features having dimensions less than a few hundred nanometers presents challenges. The fabrication of negative features places technical and/or cost limitations on the degree of integration that can be achieved with positive spacer processes.

FIGS. 3A through 3F illustrate a negative spacer lithography process for creating negative features such as cut-lines and contact holes according to one embodiment of the present invention. The size of the negative features is limited only by the minimum deposition thickness. As such, using the negative spacer lithography process, negative features can be fabricated at substantially smaller sizes than that achievable with conventional processes. Note that while much of the discussion herein focuses on utilizing the inventive negative spacer lithography process in the fabrication of an SRAM cell or one or more arrays of SRAM cells, the negative spacer lithography process is not limited thereto. The negative spacer lithography process may be used in the fabrication of any type of integrated circuit where such negative features are desired. The negative spacer lithography process may additionally be used in other similar applications such as, for example, MEMS, carbon nanotube growth, and permeable membrane fabrication.

Figure 3A:
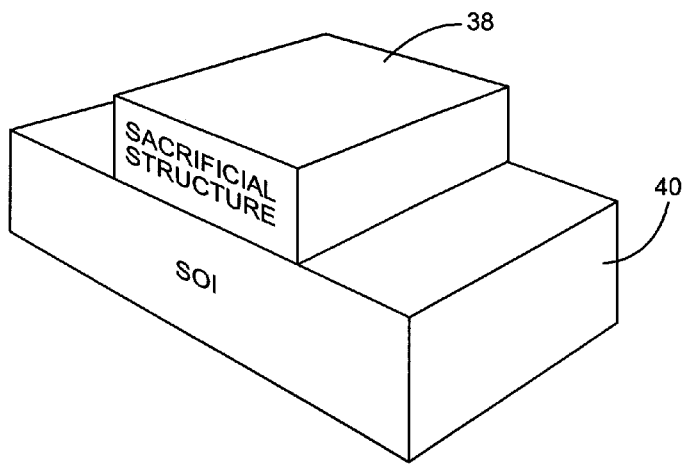
FIGS. 3A through 3F illustrate exemplary negative spacer lithography processes according to one embodiment of the present invention.

First, as shown in FIG. 3A, a sacrificial structure 38 is deposited or otherwise formed on a substrate 40. The shape of the sacrificial structure 38 may be defined using, for example, a traditional photolithography process. Alternatively, the sacrificial structure 38 may be formed using one or more iterations of a prior positive spacer lithography process. In this example, the substrate 40 is an SOI substrate. However, the present invention is not limited thereto. The substrate 40 may alternatively be, for example, a homogenous, bulk substrate. The sacrificial structure 38 may be formed using a sacrificial material such as, for example, Silicon, Silicon Germanium, or the like.

Figure 3B:
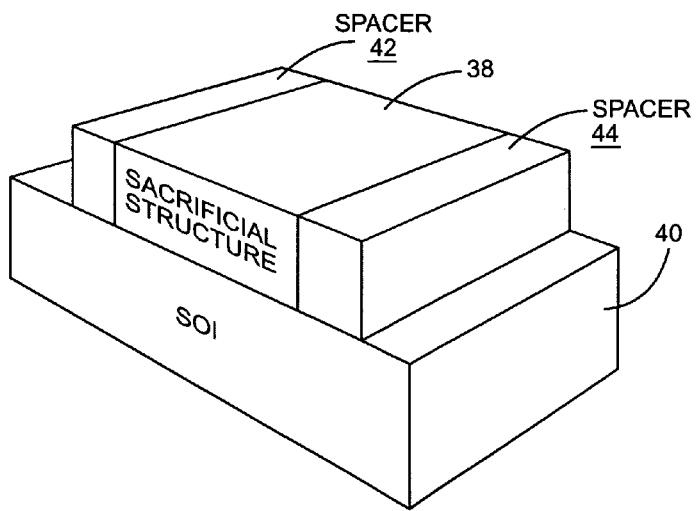

Next, a spacer material layer (not shown) is deposited, or otherwise formed, on top of the sacrificial structure 38 and the exposed portion of the substrate 40 using a process such as, for example, chemical vapor deposition. The spacer material layer may also be referred to as a conformal layer. The spacer material layer is formed using a sacrificial material other than that used for the sacrificial structure 38. For example, if the sacrificial structure 38 is formed using Silicon or Silicon Germanium, the spacer material layer may be formed using Silicon Dioxide, PSG, Silicon Nitride, or the like. However, the present invention is not limited thereto. As shown in FIG. 3B, the spacer material layer is then anisotropically etched such that only a portion of the spacer material layer adjacent to side-walls of the sacrificial structure 38 remains, thereby providing spacers 42 and 44, as shown in FIG. 3B. A width of the spacers 42 and 44 correspond to one dimension of the negative features to be formed.

Figure 3C:
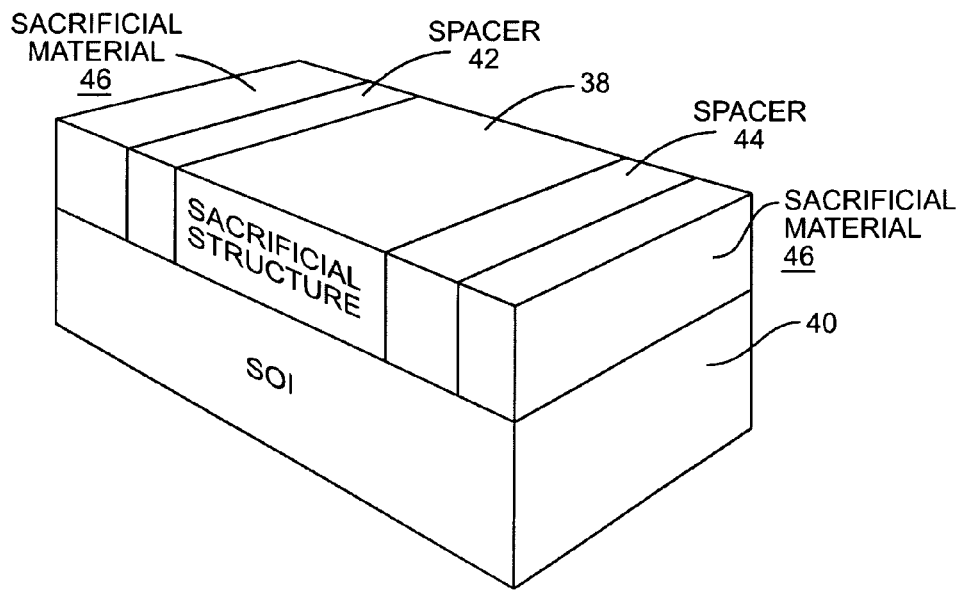

As shown in FIG. 3C, a sacrificial material 46 is then deposited or otherwise formed on top of the sacrificial structure 38, the spacers 42 and 44, and the exposed portion of the substrate 40 and processed (or thinned) to expose the spacers 42 and 44. The sacrificial material 46 is preferably the same material used to form the sacrificial structure 38. Preferably, the thickness of the sacrificial material 46 deposited must be large enough to mask the exposed portion of the substrate 40. As will become apparent below, the masking of the exposed portion of the substrate 40 is needed in order to prevent undesired etching when the spacers 42 and 44 and the portions of the substrate 40 below the spacers 42 and 44 are subsequently etched. In one embodiment, the thickness of the sacrificial material 46 deposited is governed by the following equation:

$$\frac{2}{3} \cdot (h-t) > \frac{s}{2} - t,$$

where h is a height of the spacers 42 and 44 as well as the sacrificial structure 38, t is a width of the spacers 42 and 44, and s is a space between each spacer 42, 44 and an adjacent feature (not shown), which may be, for example, another spacer formed on the side-walls of another sacrificial structure. Note that large areas of the substrate 40 may alternatively be protected using a planarization step, such as chemical mechanical polishing, or a layer of photoresist. It should also be noted that the spacers 42 and 44 are preferably flanked by materials of the same composition in order to ensure uniform cut-lines. However, the present invention is not limited thereto.

Figure 3D:
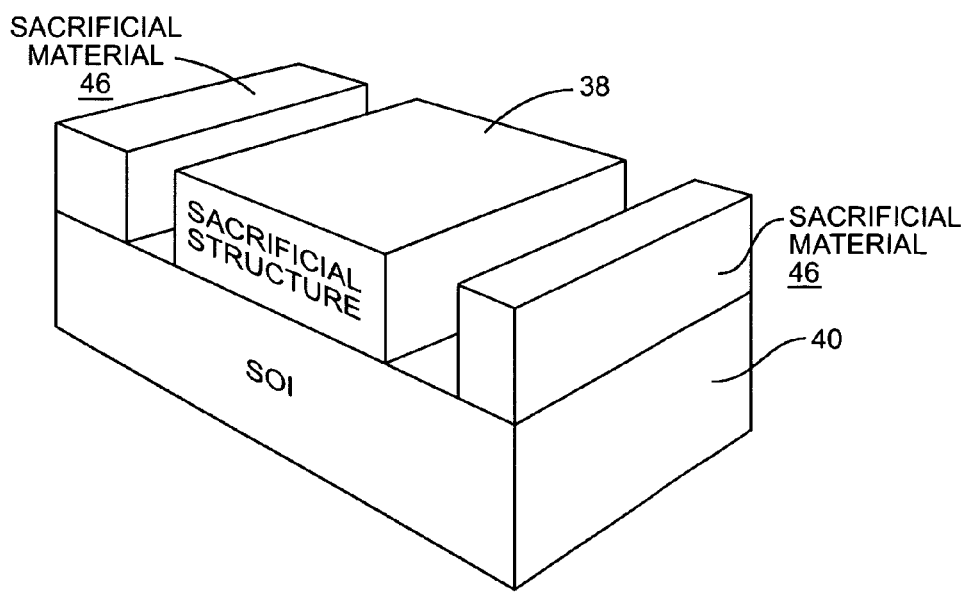
Figure 3E:
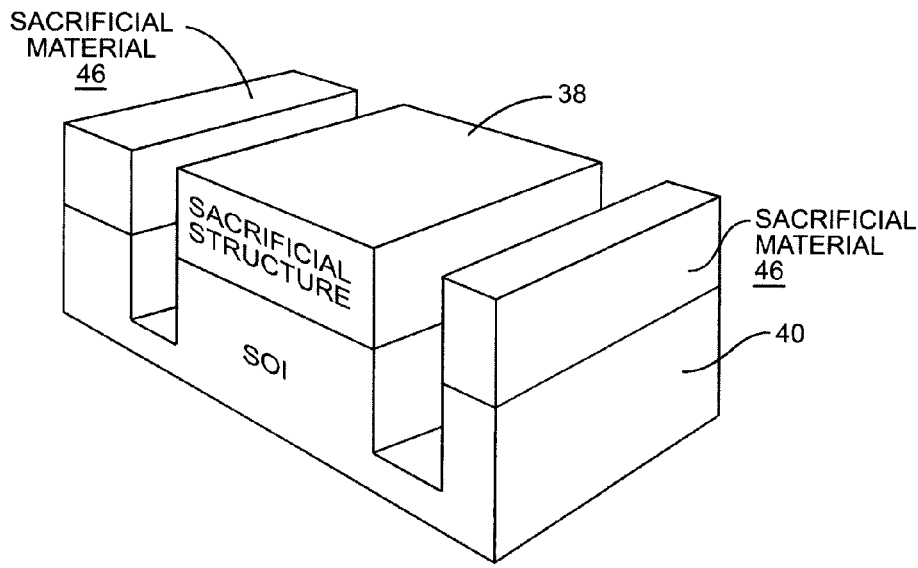

In this example, the desired negative features are cut-lines. As such, as shown in FIG. 3D, the spacers 42 and 44 are removed by etching. More specifically, a selective etch is used to etch the spacers 42 and 44 but not the sacrificial structure 38 and the sacrificial material 46. As such, the sacrificial structure 38 and the sacrificial material 46 form a mask for subsequent etching of the substrate 40. Using this mask, the substrate 40 is etched to form the desired negative feature, as shown in FIG. 3E.

Figure 3F:
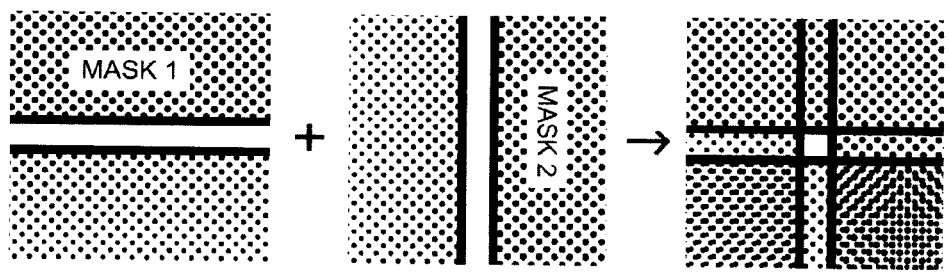

FIG. 3F illustrates a manner in which the negative spacer process of FIGS. 3A through 3E may be modified in order to create a contact hole. More specifically, the process illustrated in FIGS. 3A through 3C may first be performed to provide a spacer, such as the spacer 42. The process of FIGS. 3A through 3C may then be repeated to provide an additional spacer that intersects or crosses over the spacer 42 at a point corresponding to the location of the desired contact hole. The two spacers may then be anisotropically or isotropically etched to expose a portion of the substrate 40 where the contact hole is to be created. The substrate 40 is then etched using the remaining sacrificial structure 38 and sacrificial material 46 as a mask to form the desired contact hole.

FIGS. 4A through 4K illustrate a process for fabricating arrays of SRAM cells 10 on a substrate using positive and negative spacer lithography processes according to one embodiment of the present invention. The SRAM cells 10 may be fabricated using only positive and negative spacer lithography processes. Alternatively, the SRAM cells 10 may be fabricated using primarily positive and negative spacer lithography processes. For example, some lines or holes may be fabricated using conventional photolithography processes if the desired pitch between those lines or holes can be obtained using the conventional photolithography processes. Shapes defined using conventional photolithography processes may be different than the shapes defined using the inventive process, even if the shapes are used for the same purpose, such as forming a conductive interconnect. For example, the shapes may not be quadrilaterals. As another example, conventional photolithography processes may be used to define boundaries of the SRAM cell arrays. It should be noted that this process may also be used to fabricate a single SRAM cell in isolation.

In this example, the transistors of the SRAM cells 10 are double-gate transistors, in which the gate regions of the transistors are separated from the sidewalls of the active regions by a thin gate dielectric material. However, the present invention is not limited thereto. Alternatively, for example, the transistors of the SRAM cells 10 may be planar transistors. The use of alternative transistors may result in a different sequence or number of process steps without substantively affecting the patterns or arrangement of the cell illustrated in FIGS. 4A through 4K.

FIG. 4A illustrates a number of lines 48-1 through 48-16 formed on top of a substrate 50 using one or more iterations of a positive spacer process. The lines 48-1 through 48-16 may also be referred to generally as lines 48. As an example, the fabrication of the lines 48 may begin with the fabrication of two or more lines having a pitch of $2^N P$. The positive spacer process may be repeated N times to provide the lines 48 having a desired final pitch P.

Figure 4B:
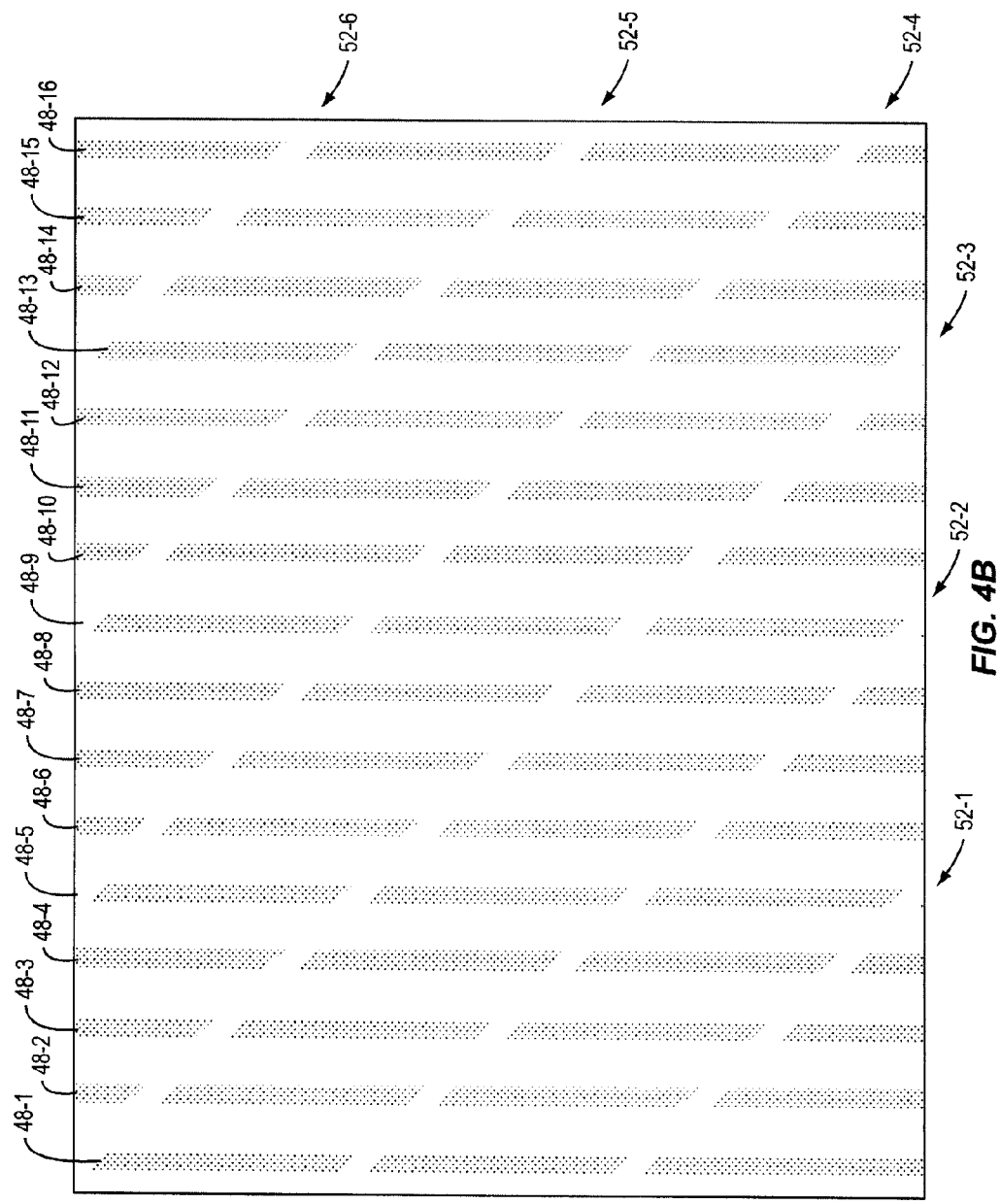

Next, as illustrated in FIG. 4B, cut-lines 52-1 through 52-6 are formed using a negative spacer lithography process. The cut-lines 52-1 through 52-6 are also generally referred to herein as cut-lines 52. The cut lines 52 operate to cut the lines 48 to define active regions for the PMOS and NMOS transistors of the SRAM cells 10. In this example, in order to create the cut-lines 52, a negative spacer lithography process is performed starting from one or more initial lines rotated −45 degrees from horizontal. Multiple iterations of the negative spacer process may be required to define the cut-lines 52 having the desired pitch of, in this example, $2\sqrt{2} \cdot P$. The effect of this step is to cut the lines 48 into diagonally repeating segments defining the active regions for the PMOS and NMOS transistors of the SRAM cells 10. At this point, the substrate 50 is etched using the remaining portions of the lines 48 as a mask to form the active regions of the PMOS and NMOS transistors. An isolation or dielectric material may then be deposited and planarized. Lastly, a gate dielectric and gate materials are deposited. The surface may then be planarized to avoid the development of extra spacers.

Figure 4C:
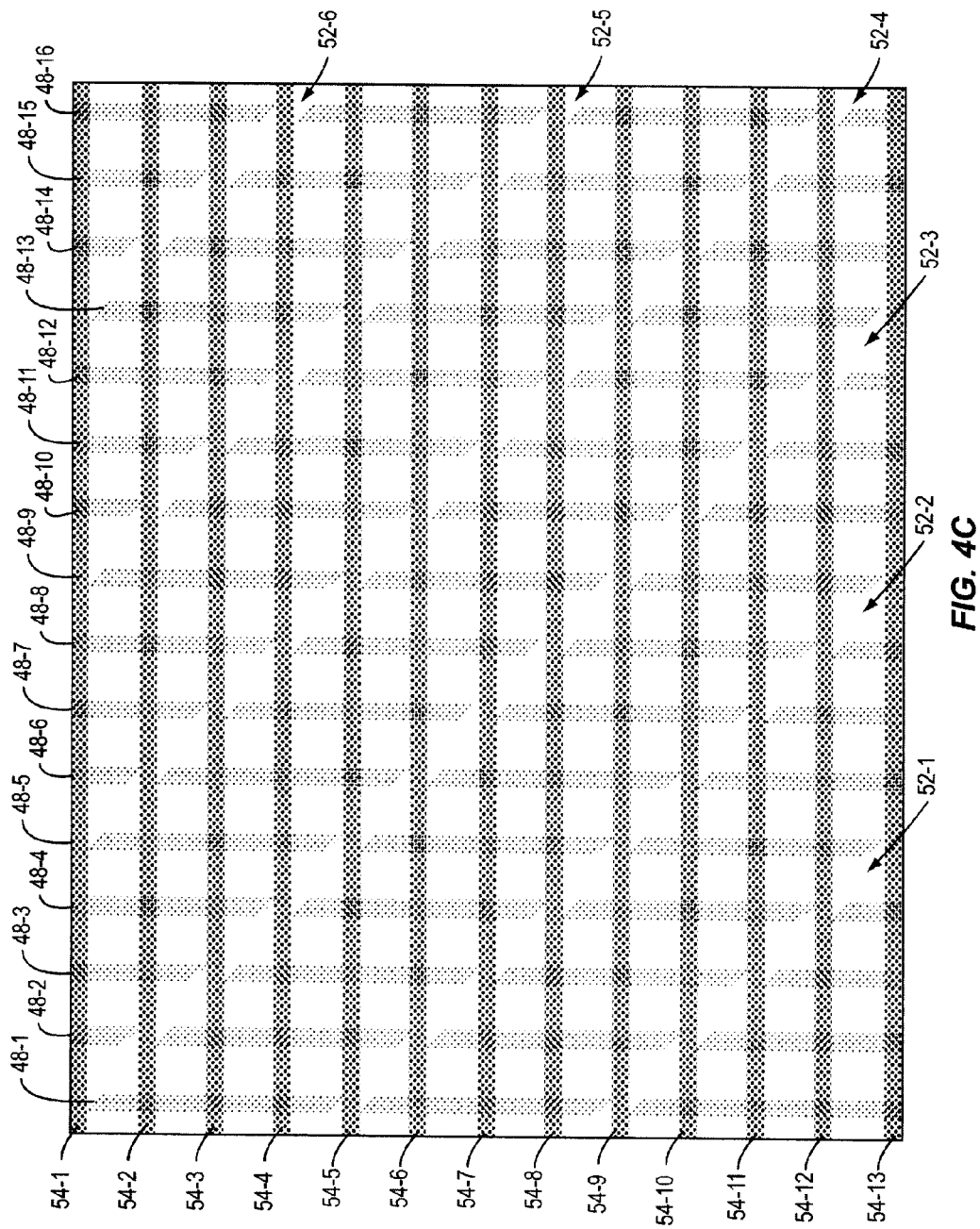
Figure 4D:
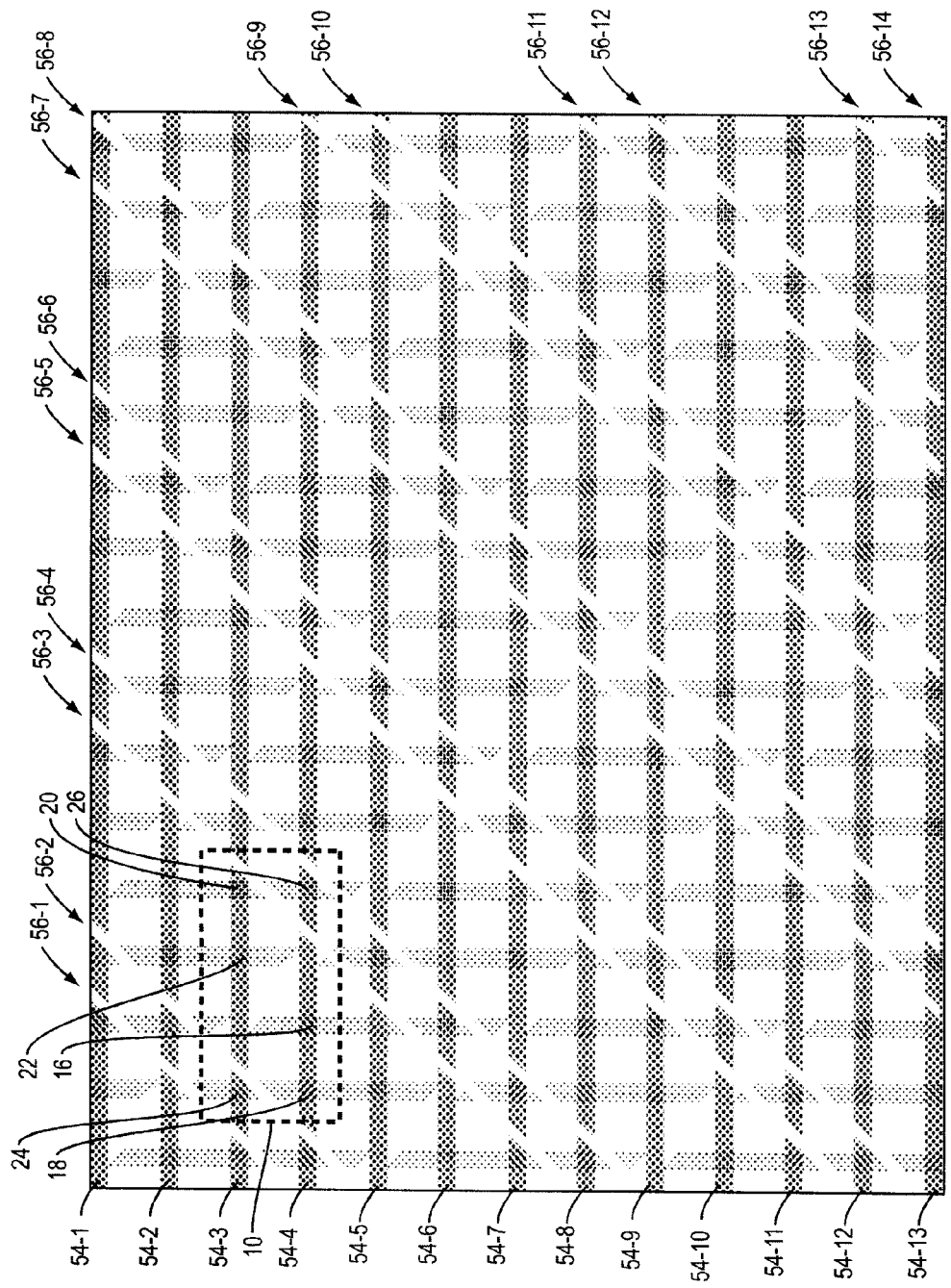

FIGS. 4C and 4D illustrate the formation of transistor gate regions (hereinafter gate regions) for the transistors of the SRAM cells 10. More specifically, in order to form the gate regions, one or more iterations of a positive spacer lithography process are used to form lines 54-1 through 54-13, as illustrated in FIG. 4C. The lines 54-1 through 54-13 are also referred to generally as lines 54. In this example, the lines 54 are perpendicular to the lines 48.

As illustrated in FIG. 4D, a negative spacer lithography process is used to create cut-lines 56-1 through 56-14. The cut-lines 56-1 through 56-14 are generally referred to herein as cut-lines 56. In this example, the cut-lines 56 are formed at a direction of +45 degrees. The cut lines 56 operate to cut the lines 54 to form the desired gate regions for the transistors of the SRAM cells 10. More specifically, in this example, the positive spacer lithography process begins by forming one or more lines in a +45 degree direction. The positive spacer lithography process is repeated until a positive feature pitch of $2\sqrt{2} \cdot P$ is achieved with a width equal to $2\sqrt{2}$ times a desired total width of the gates for the access transistors 24 and 26 of the SRAM cells 10 including a desired amount of overlap beyond the width of the active region. A negative spacer process is used to cut the lines 54 on both sides of the resulting diagonal lines, thus dividing the lines 54 into alternating short and long segments. The short segments correspond to the gates of the access transistors 24 and 26 of the SRAM cells 10, and the long segments correspond to the gates of the transistors 16 and 18 of the inverters 12 and the gates of the transistors 20 and 22 of the inverters 14 of the SRAM cells 10. Thus, the short segments correspond to the inputs of the access transistors 24 and 26, and the long segments correspond to the inputs of the inverters 12 and 14.

After the gate regions are defined, using remaining portions of the line 54 as a mask, the gate materials are etched to form the gate regions of the transistors of the SRAM cells 10. Additional process steps may be performed at this time to differentiate between NMOS and PMOS transistors with the assistance of a negative spacer-defined mask. More specifically, two negative spacer lithography processes beginning from lines of +45 degrees and zero (0) or 90 degrees can be used to isolate PMOS transistors. Once all appropriate source/drain process steps such as, for example, implanting, epitaxy, and the like are performed, an interlayer dielectric is deposited. The surface may then be planarized.

At this point, the transistors of the SRAM cells 10 are formed. As an example, the transistors forming the exemplary SRAM cell 10 have been indicated in FIG. 4D. More specifically, as shown, the exemplary SRAM cell 10 includes the transistors 16 and 18 of the inverter 12, the transistors 20 and 22 of the inverter 14, and the access transistors 24 and 26. The subsequent steps of the fabrication process operate to interconnect the transistors 16, 18, 20, 22, 24, and 26 as shown in FIG. 1 and provide external connections for reference voltages $V_{DD}$ and $V_{SS}$ as well as external connections for the bit lines (BL, BLN) and the word line (WL).

Figure 4E:
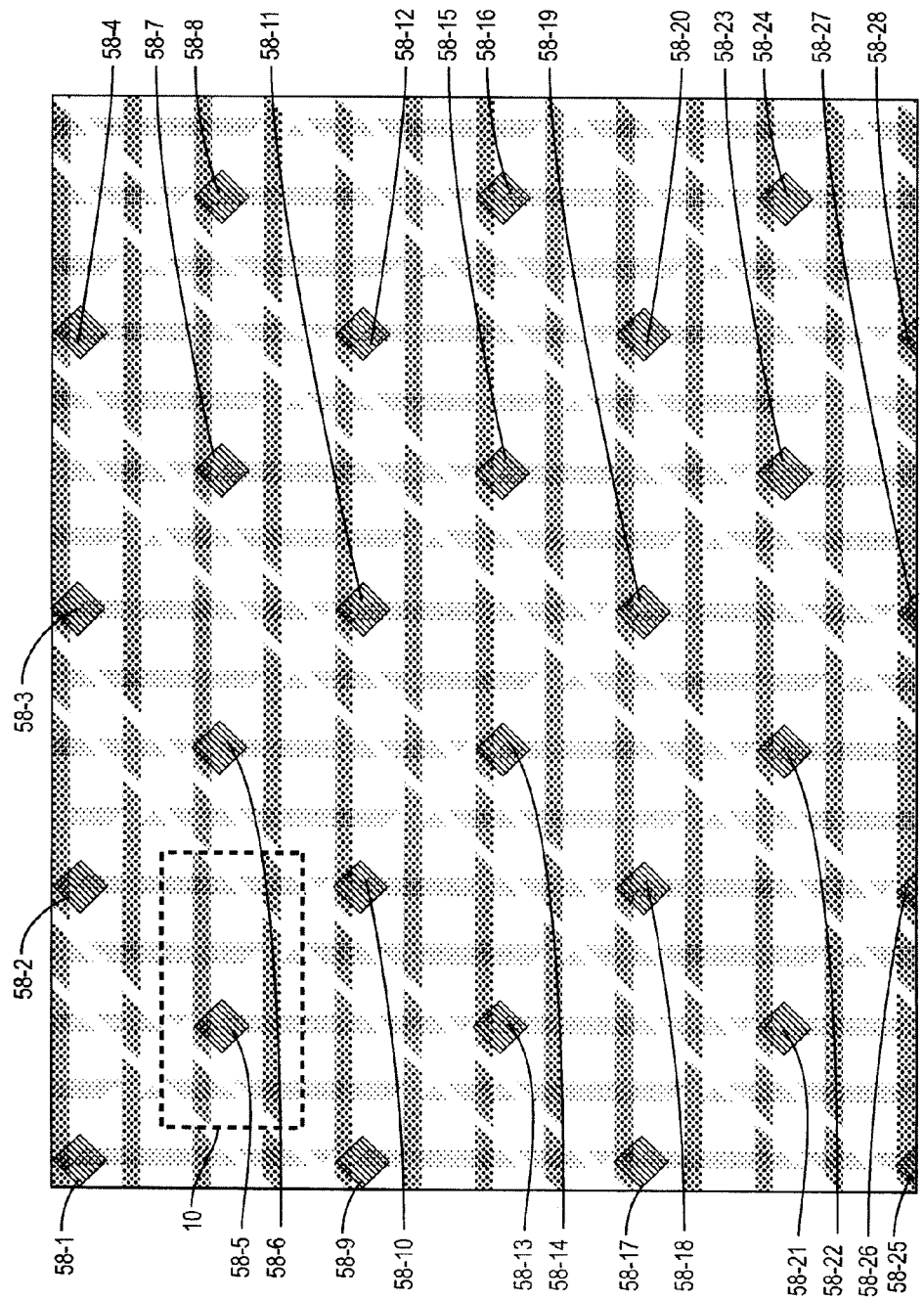
Figure 4F:
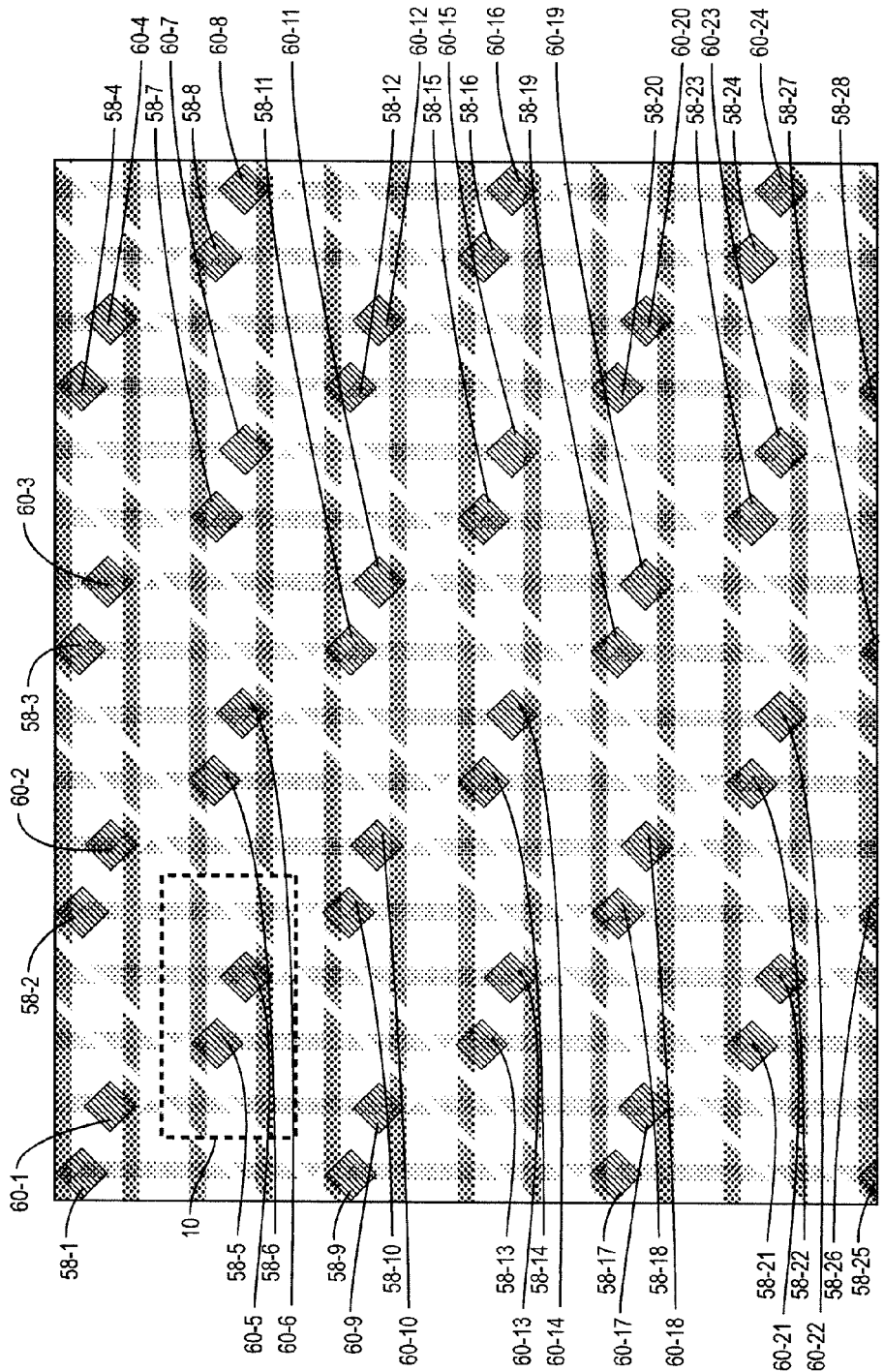

FIGS. 4E and 4F illustrate the cross-coupling of the inverters 12 and 14 of the SRAM cells 10 using two sets of contact holes. More specifically, FIG. 4E illustrates first contact holes 58-1 through 58-28 formed using a negative spacer lithography process. The first contact holes 58-1 through 58-28 are also generally referred to herein as contact holes 58. The first contact holes 58 are aligned such that each of the first contact holes 58 bridges the gate region defining the input of a first inverter of the SRAM cell 10 to the active region defining the output of a second inverter of the SRAM cell 10. FIG. 4F illustrates second contact holes 60-1 through 60-24 formed using a negative spacer lithography process. The second contact holes 60-1 through 60-24 are also generally referred to herein as second contact holes 60. The second contact holes 58 are aligned such that each of the second contact holes 60 bridges the gate region defining the input of the second inverter of the SRAM cell 10 to the active region defining the output of the first inverter of the SRAM cell 10. The first and second contact holes 58 and 60 are filled with a conductive material such as metal.

Figure 4G:
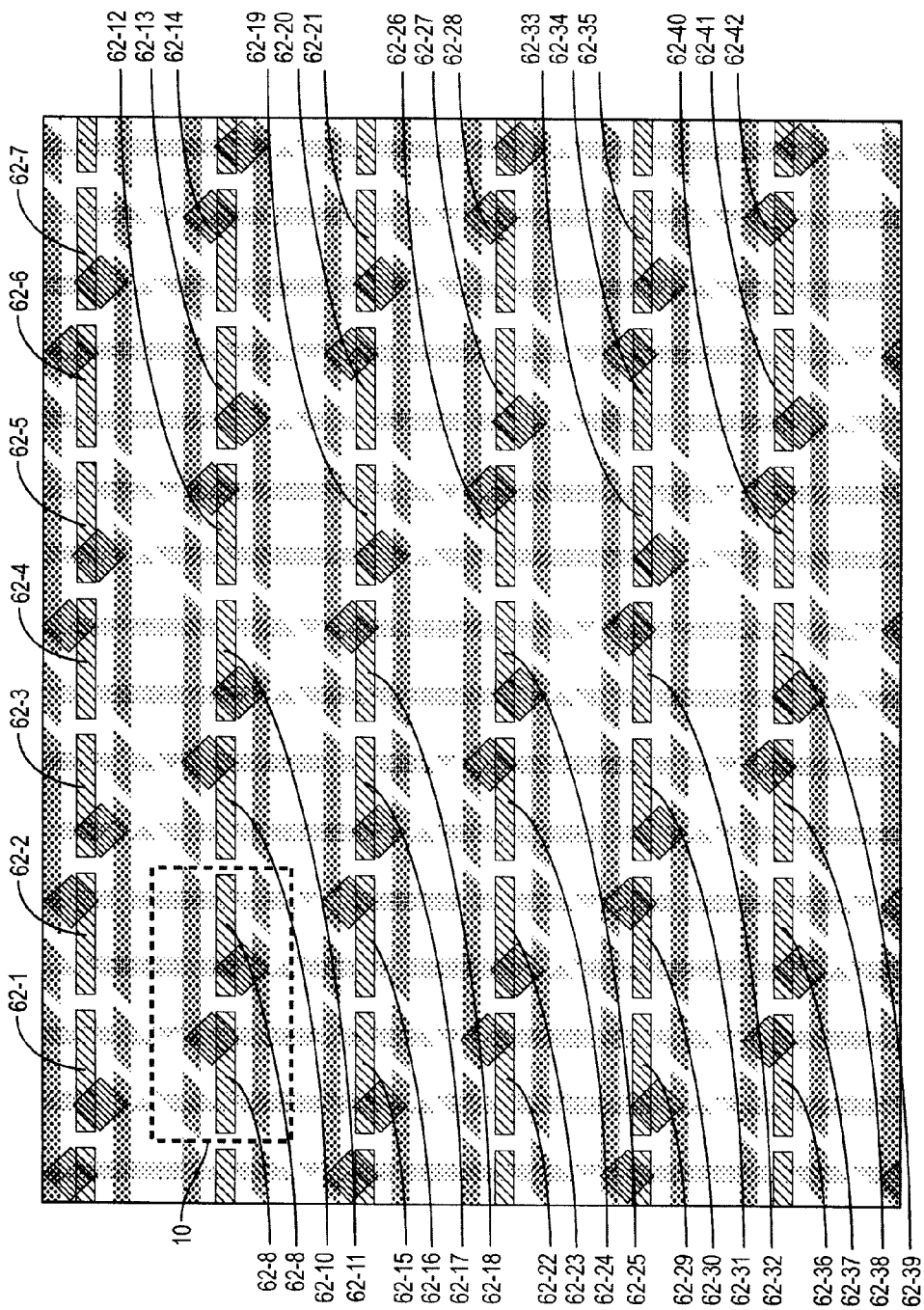

FIG. 4G illustrates the formation of local interconnects 62-1 through 62-42 that operate to interconnect the active regions for each of the inverters of the SRAM cells 10. The local interconnects 62-1 through 62-42 are generally referred to herein as local interconnects 62. Each of the local interconnects 62 operates to interconnect or bridge the active regions of two transistors forming an inverter of one of the SRAM cells 10. The local interconnects 62 are formed using a negative spacer process in which the substrate 50 is first etched to provide cut-lines, or trenches, interconnecting the active regions of the transistors forming the inverters 24 and 26 of the SRAM cells 10. The cut-lines are then filled with a conductive material such as metal.

Figure 4H:
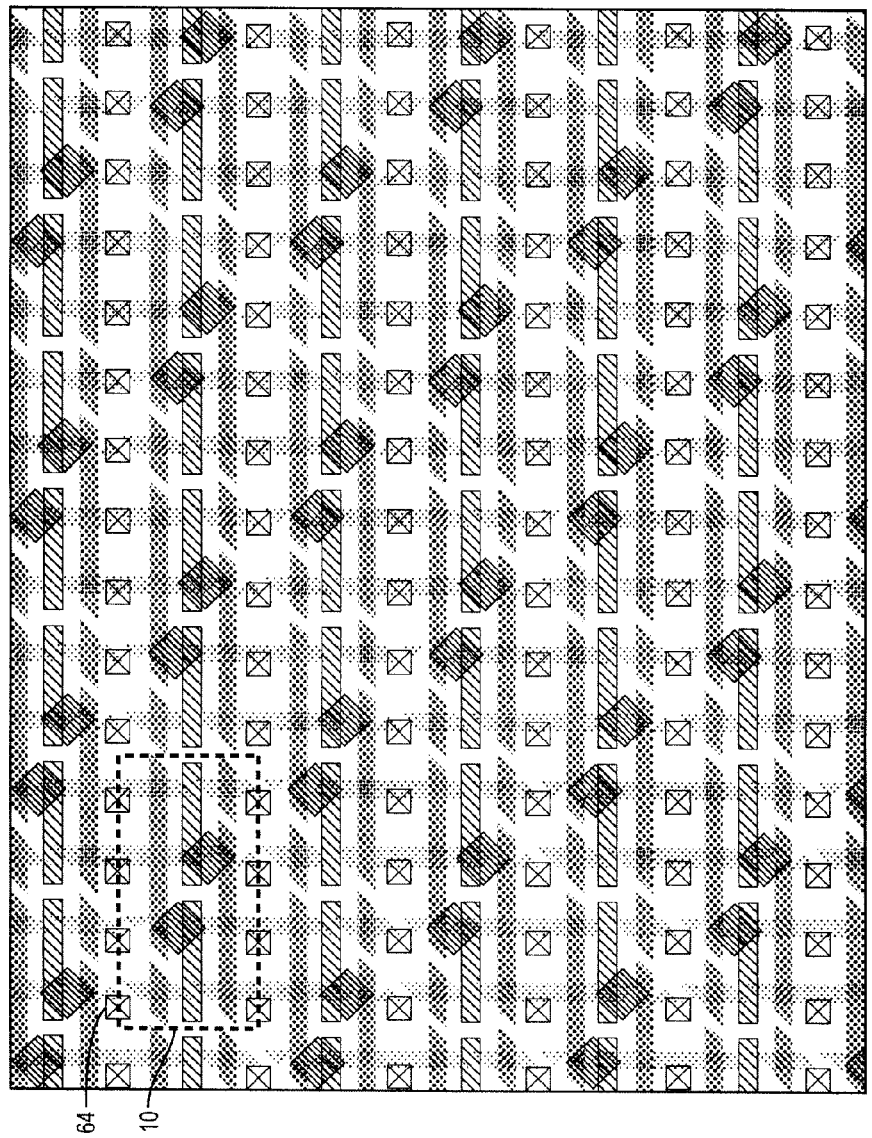

FIG. 4H illustrates the formation of contacts for external connections to the SRAM cells 10. More specifically, contact holes 64 are formed using a negative spacer lithography process. Due to the number of contact holes 64, each of the contact holes 64 is not labeled individually on FIG. 4H for clarity.

The contact holes 64 are then filled with a conductive material such as metal. The resulting contacts provide connections for the bit lines (BL, BLN) and the two reference voltages $V_{SS}$ and $V_{DD}$. In this embodiment, connections for the word line (WL) are formed in a later processing step, which is discussed below.

Figure 4I:
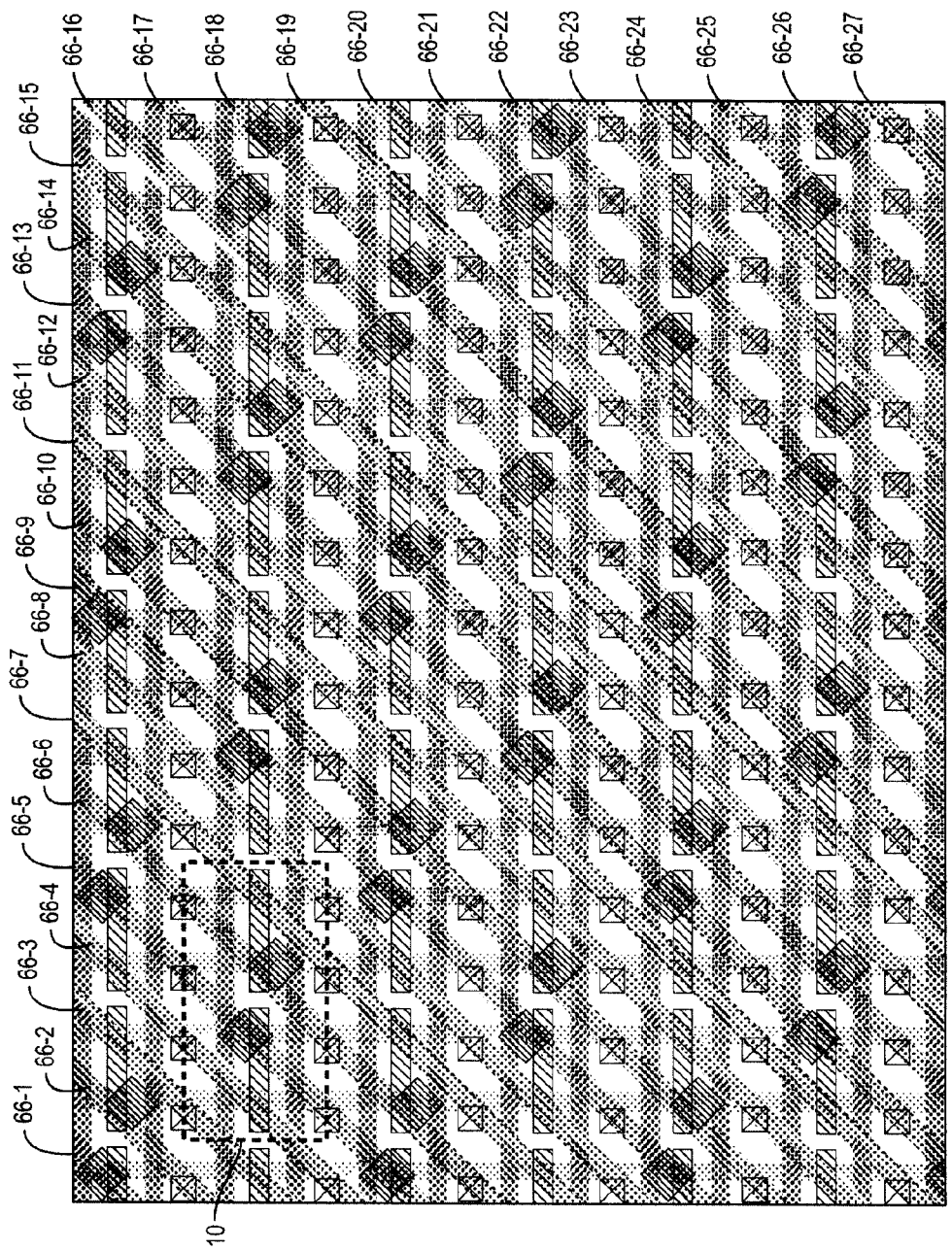

FIG. 4I illustrates the formation of contact lines 66-1 through 66-27 interconnecting the corresponding ones of the contacts of the SRAM cells 10. The contact lines 66-1 through 66-27 are generally referred to herein as contact lines 66. The contact lines 66 are formed using a positive spacer lithography process. For each SRAM cell 10, the contact lines 66 provide the needed connections to the bit lines (BL, BLN) and the reference voltages $V_{SS}$ and $V_{DD}$.

Figure 4J:
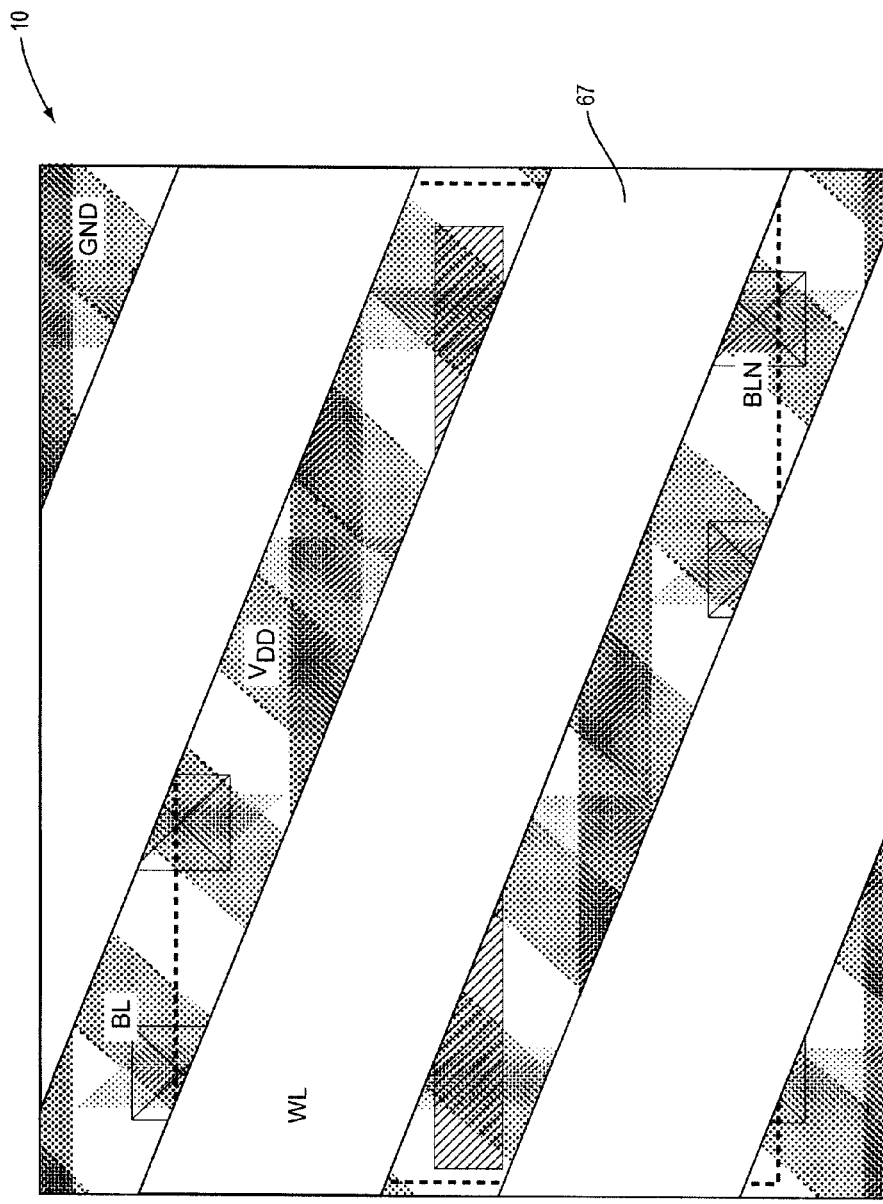
Figure 4K:
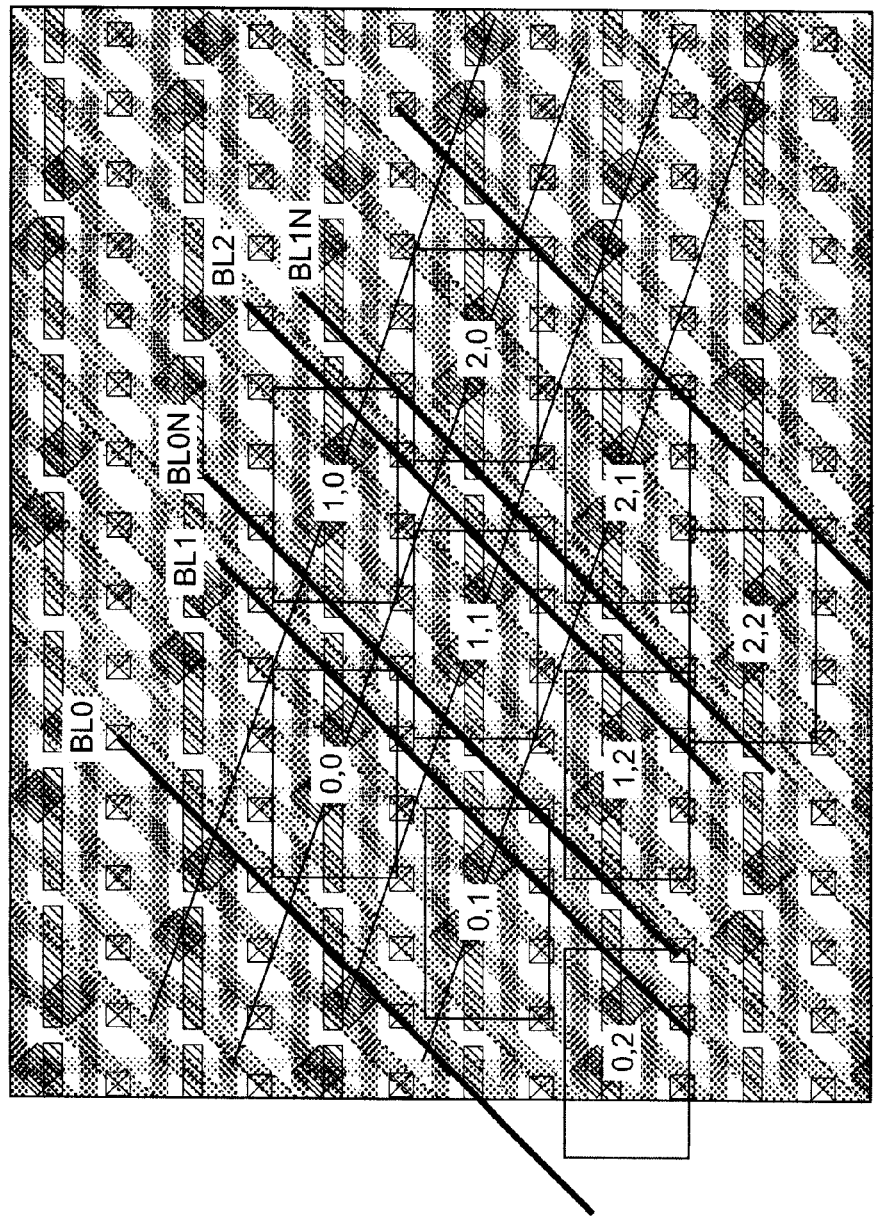

FIG. 4J illustrates a single SRAM cell 10 after the formation of contact line 66 providing the connection to the word line (WL). More specifically, first, a negative spacer lithography process is used for form contact holes to the gate regions of the access transistors 24 and 26 of the SRAM cells 10. The contact holes are filled with a conductive material such as metal. The contact lines 66 are then formed using a positive spacer lithography process, thereby providing the word line (WL) and the connection of the word line (WL) to the gates of the access transistors 24 and 26 of the SRAM cells 10. FIG. 4K illustrates the resulting layout of the arrays of SRAM cells 10 according to this exemplary embodiment of the present invention without the word line (WL) or word line (WL) connections shown for clarity.

In an alternative embodiment, the contact holes to the gates of the access transistors 24 and 26 of the SRAM cells 10 and the corresponding contact lines may be created earlier in the process. For example, after forming the contact holes 58 and 60 and the local interconnects 62, an insulation layer may be deposited. Contact holes to the gate regions of the access transistors 24 and 26 may then be created using a negative spacer lithography process and filled with a conductive material such as metal. Contact lines formed of a conductive material may then be formed horizontally in order to provide the connection the word line (WL). The process may then proceed as described above to form the contacts and corresponding contact lines for the bit lines (BL, BLN) and the reference voltages $V_{SS}$ and $V_{DD}$.

Figure 5:
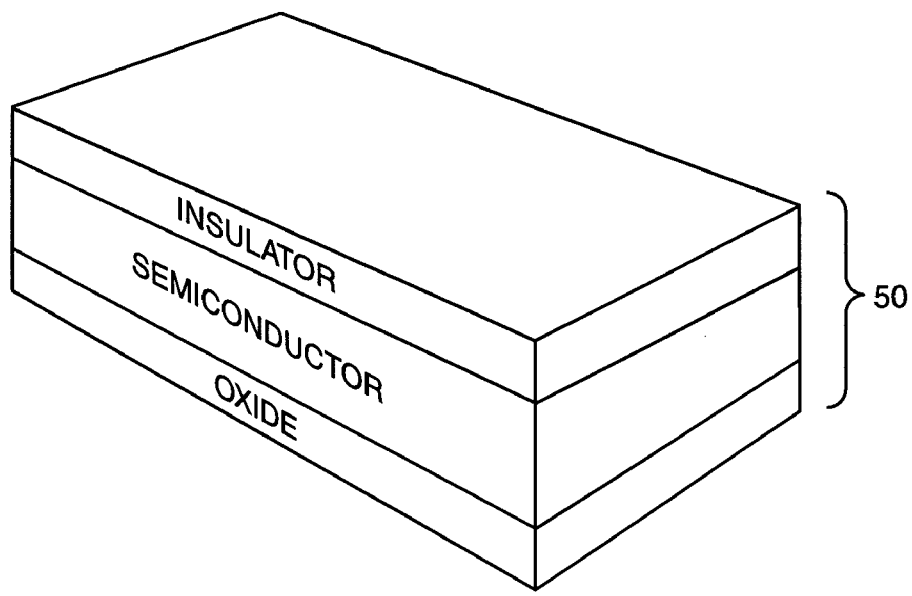
FIGS. 5 through 61 provide perspective views of one of the SRAM cells of FIGS. 4A through 4K throughout the fabrication process according to one embodiment of the present invention.
Figure 6:
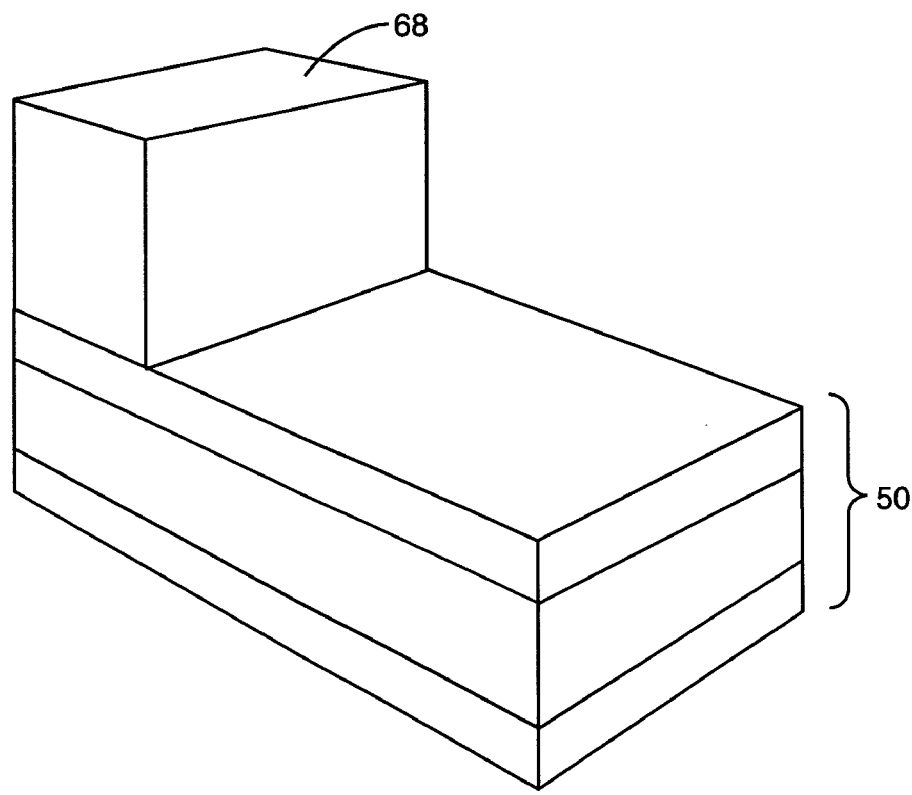
Figure 7:
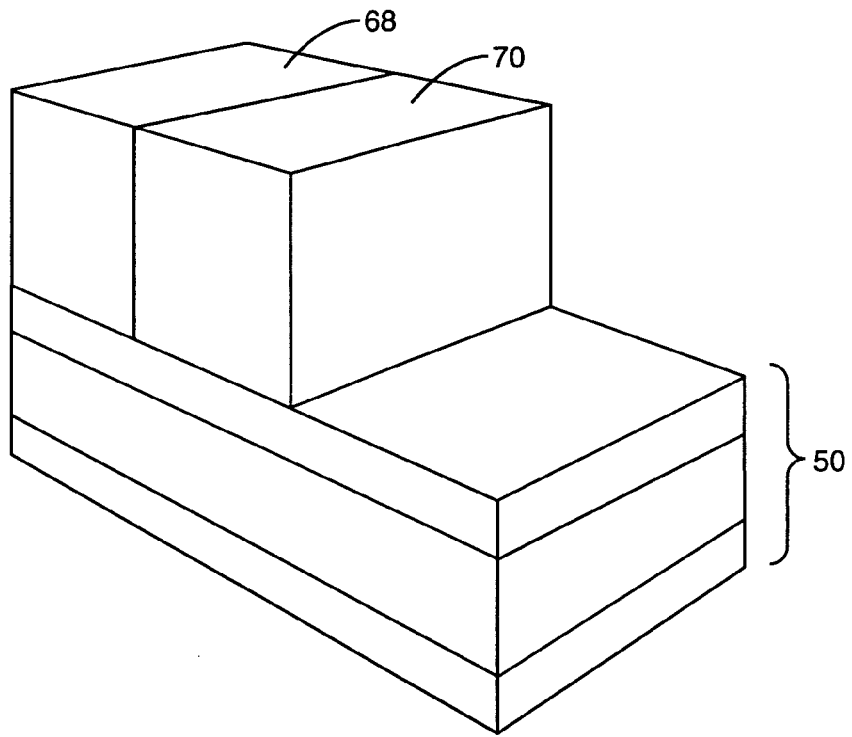
Figure 8:
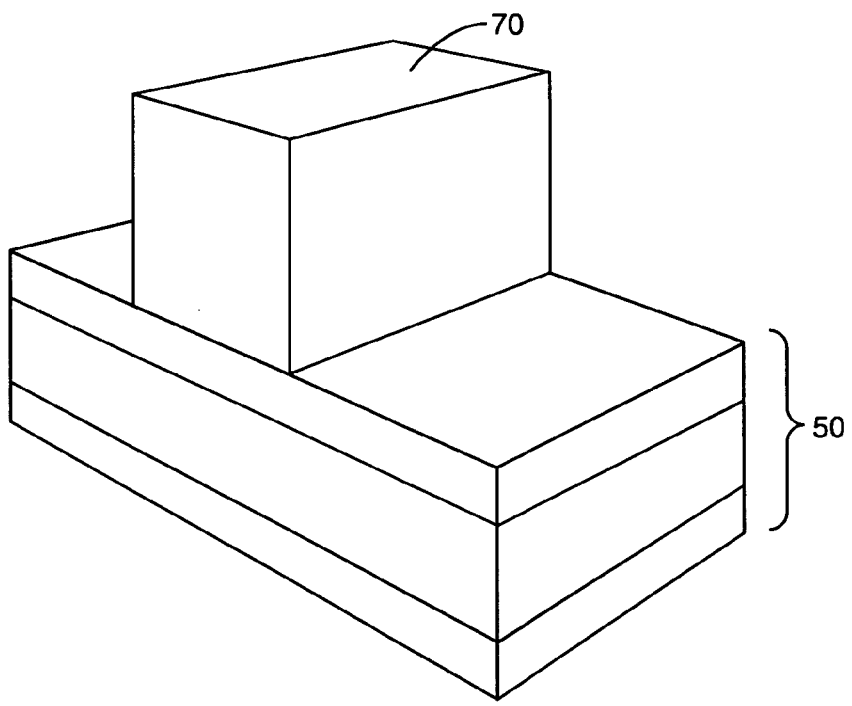
Figure 61:
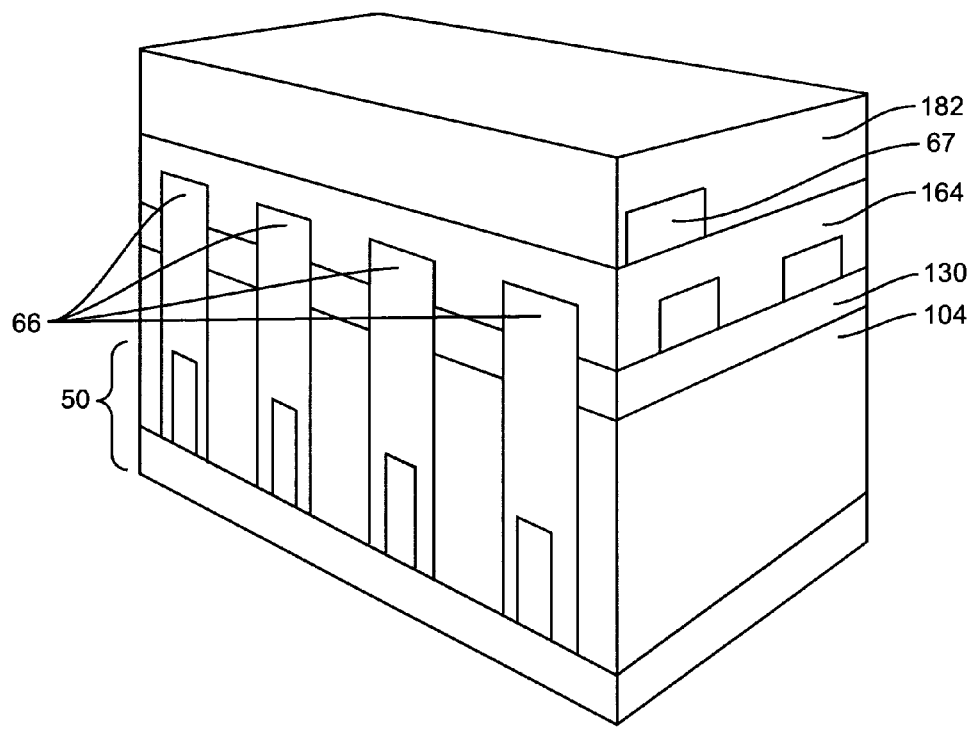

FIGS. 5 through 61 illustrate one of the SRAM cells 10 fabricated using the process described above with respect to FIGS. 4A through 4K. FIG. 5 illustrates the substrate 50, which in this example is an SOI substrate. FIGS. 6-12 illustrate one embodiment of several iterations of a positive spacer process used to create the lines 48 (FIG. 4A). More specifically, FIG. 6 illustrates an initial sacrificial structure 68, which is more specifically a linear sacrificial structure, formed on the substrate 50. This initial sacrificial structure 68 may be formed using, for example, a conventional photolithography process. Next, as shown in FIG. 7, a spacer material is deposited over the initial sacrificial structure 68 and anisotropically etched to provide a first spacer 70 along the side-wall of the initial sacrificial structure 68. Then, as shown in FIG. 8, the initial sacrificial structure 68 is removed using a selective etch.

Figure 9:
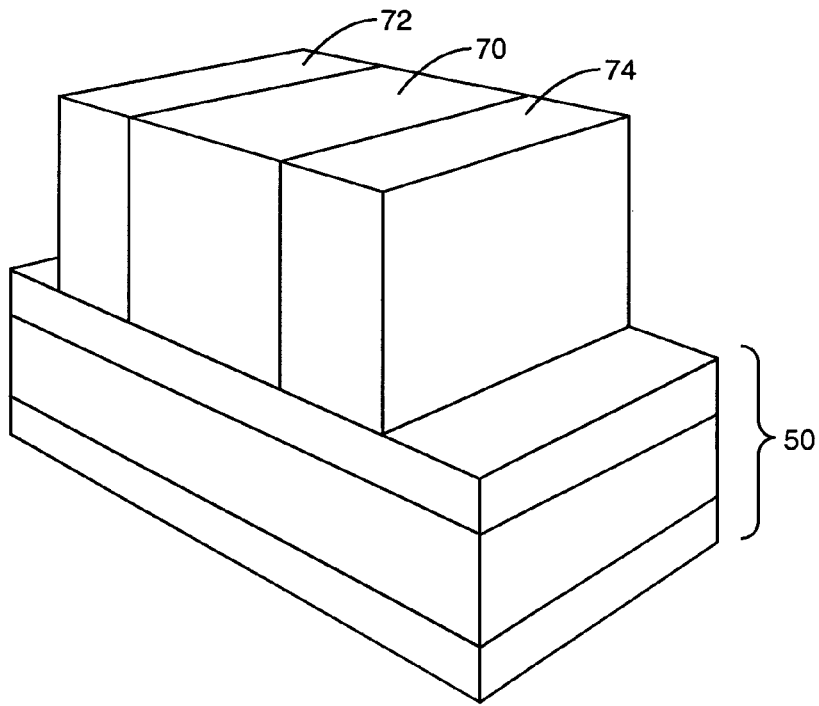
Figure 10:
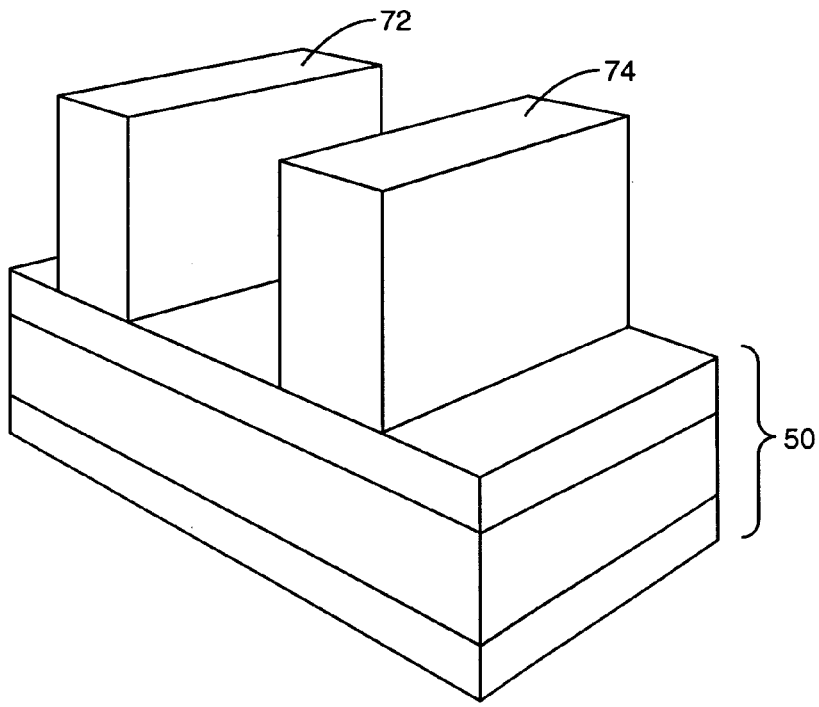
Figure 11:
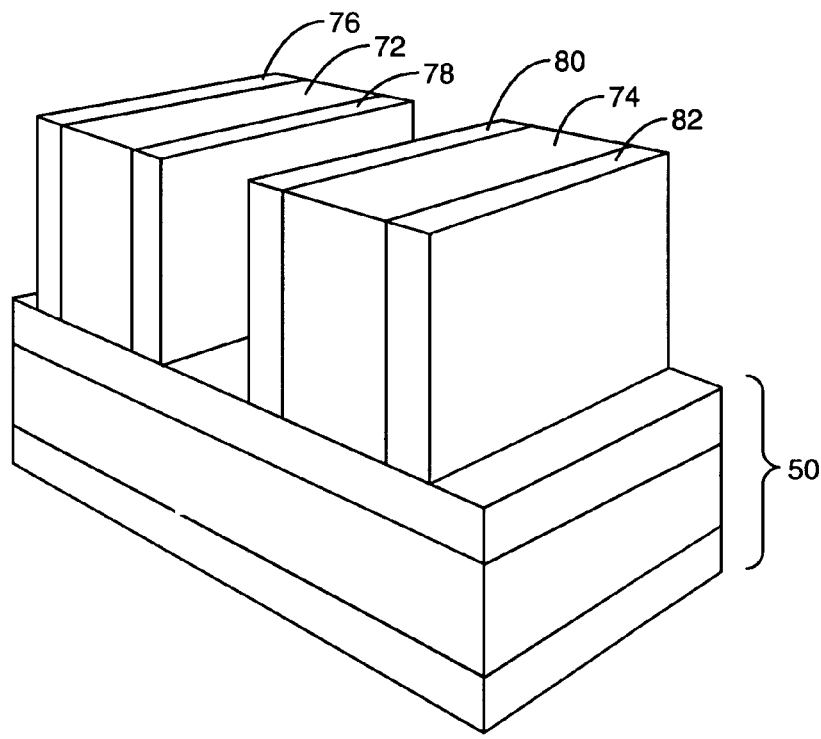
Figure 12:
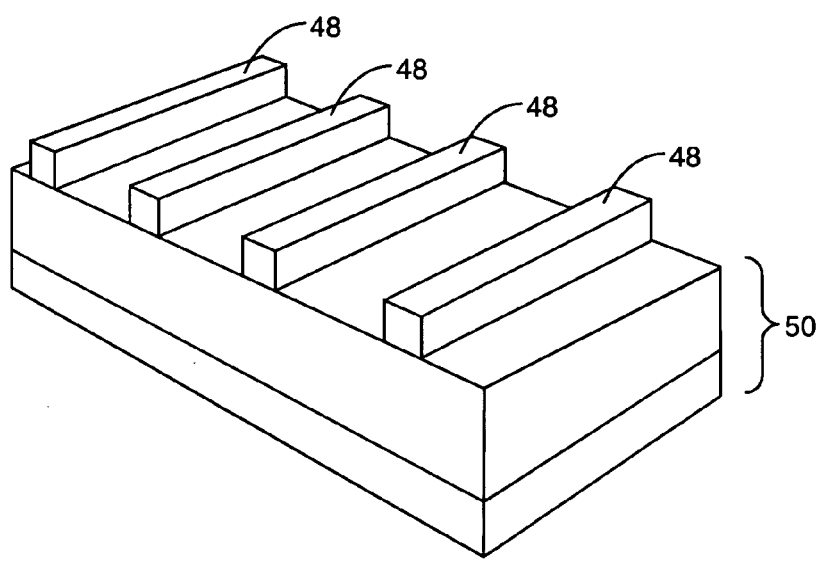

Next, the positive spacer process is repeated by depositing a second spacer material over the first spacer 70 and the exposed surface of the substrate 50. The second spacer material is different than that used to form the first spacer 70. The second spacer material is then anisotropically etched to provide second spacers 72 and 74 as shown in FIG. 9. The first spacer 70 is then selectively etched as shown in FIG. 10. In this example, the positive spacer process is again repeated by depositing a third spacer material over the second spacers 72 and 74 and the exposed surface of the substrate 50. The third spacer material is different than that used to form the second spacers 72 and 74, but it may be the same as that used to form the first spacer 70. The third spacer material is then anisotropically etched to provide third spacers 76 through 82, as shown in FIG. 11. As shown in FIG. 12, the second spacers 72 and 74 are selectively etched, and the third spacers 76 through 82 are processed to form the lines 48 (FIG. 4A).

Alternatively, the third spacers 76 through 82 are formed by another method of iterating a positive spacer process. For example, a hard mask of multiple layers may be used, such that after the first spacer 70 is formed, a layer of the hard mask is anisotropically etched. Instead of using the first spacer 70 as a sacrificial structure over which a second spacer material is deposited for forming the second spacers 72 and 74, the first spacer 70 is then removed, and the remaining pattern in the top layer of the hard mask is used in its place as the sacrificial structure. The third spacers 76 through 82 may be formed in a similar manner using a second layer of hard mask. In this embodiment, the material used for each spacer may be of identical composition.

Figure 13:
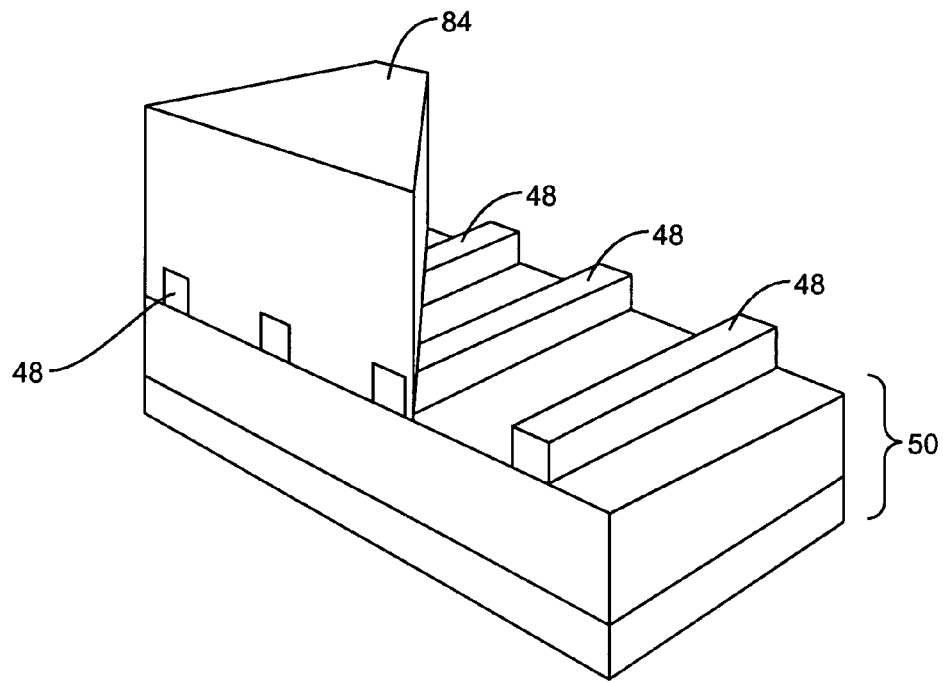
Figure 14:
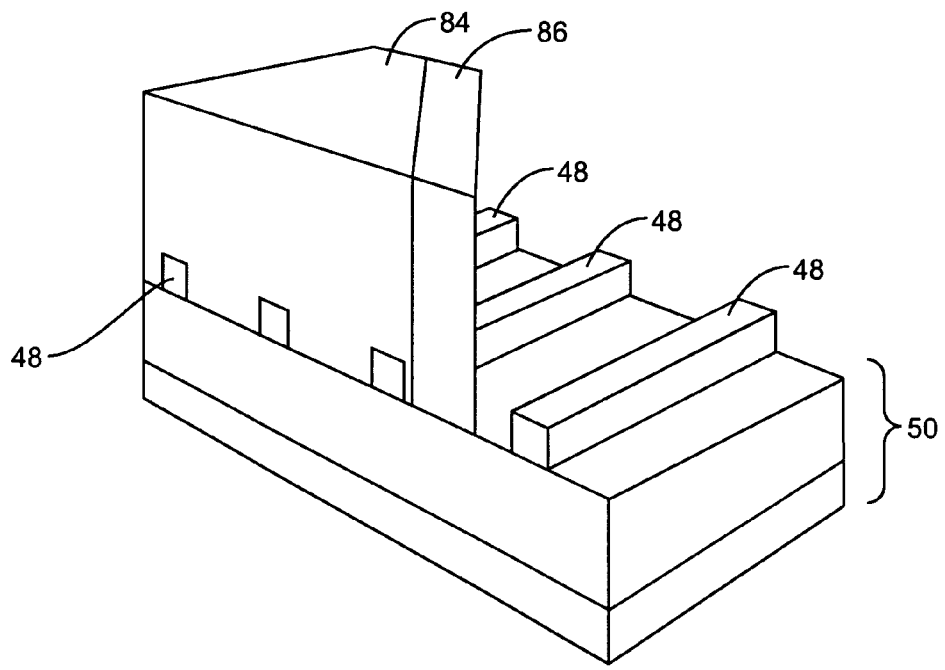
Figure 15:
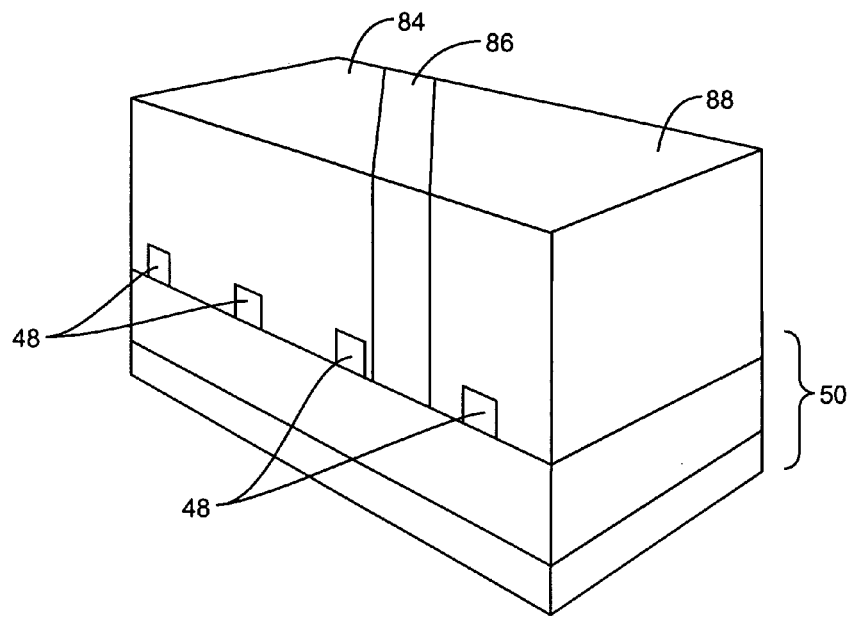
Figure 16:
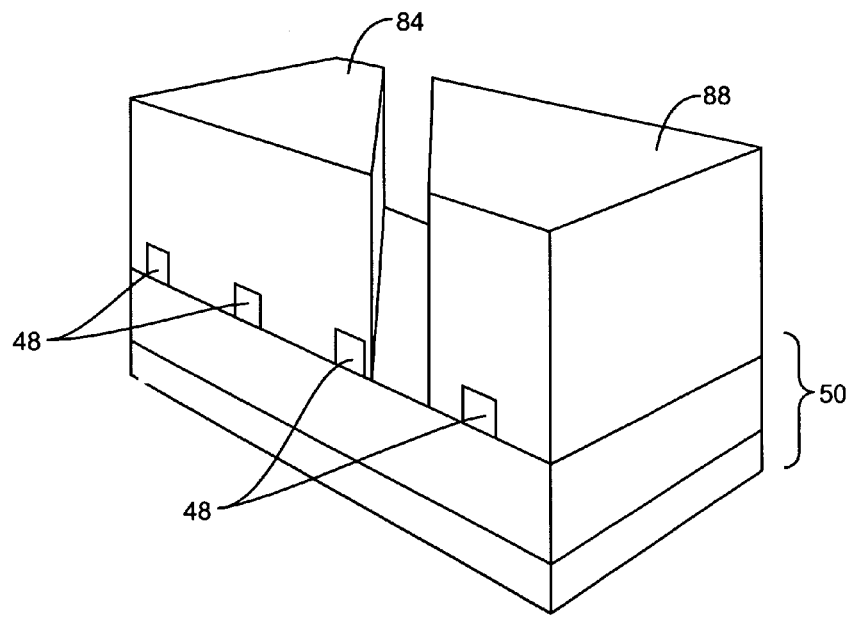
Figure 17:
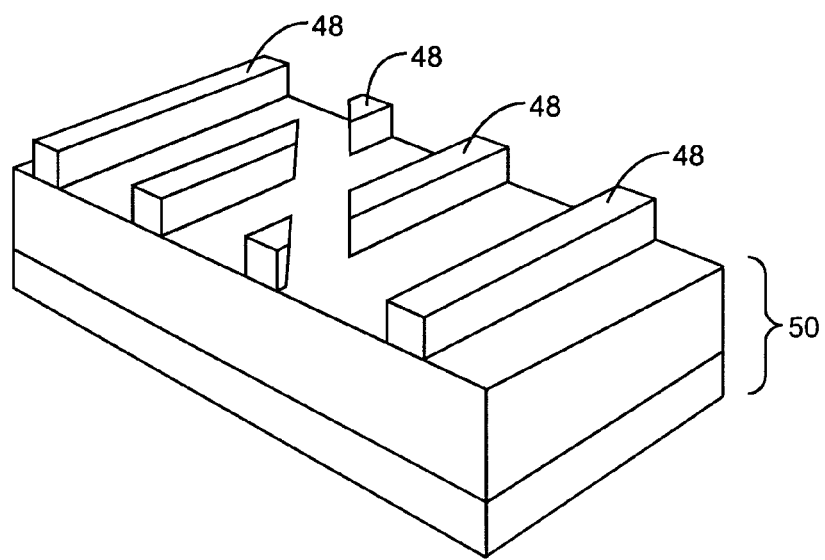
Figure 18:
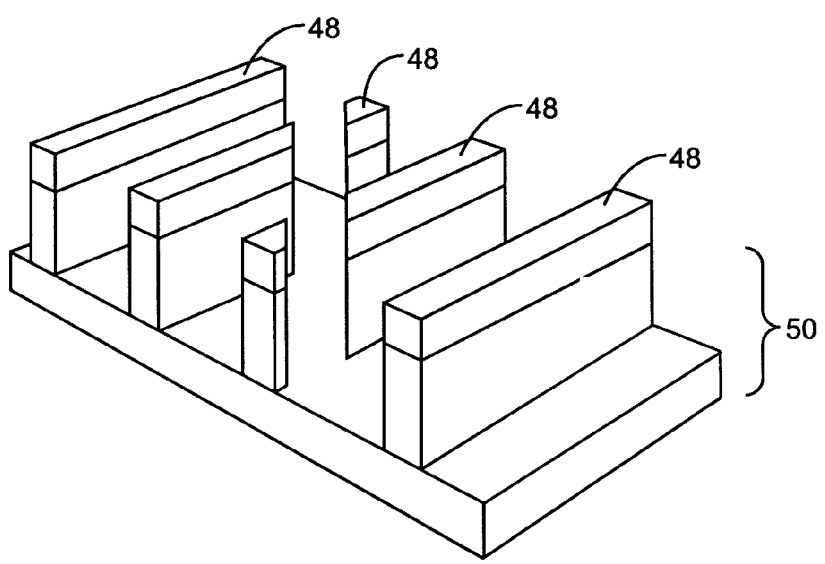

FIGS. 13 through 18 illustrate the formation of the cut-lines 52 (FIG. 4B) and the subsequent etching of the substrate 50 to form the active regions for the NMOS and PMOS transistors of the SRAM cell 10. More specifically, as shown in FIG. 13, an initial sacrificial structure 84 is formed on a desired diagonal in order to begin a negative spacer lithography process. In this embodiment, the initial sacrificial structure 84 is a linear sacrificial structure. The initial sacrificial structure 84 may be formed using conventional photolithography processes or one or more iterations of a positive spacer lithography process. A spacer material is then deposited over the initial sacrificial structure 84 and the exposed surfaces of the lines 48 and the substrate 50. The spacer material is anisotropically etched to provide a spacer 86 corresponding to the desired location of the cut-line 52 passing through the SRAM cell 10 as shown in FIG. 14. A sacrificial layer 88 is then deposited over the initial sacrificial structure 84, the spacer 86, and the exposed surfaces of the lines 48 and the substrate 50. The sacrificial layer 88 is preferably formed using the same material as the initial sacrificial structure 84. The sacrificial layer 88 is then processed, or thinned, to expose the spacer 86, as shown in FIG. 15. As shown in FIG. 16, the spacer 86 and the portion of the line 48 beneath the spacer 86 are then selectively etched. The initial sacrificial structure 84 and the sacrificial layer 88 are then selectively etched as shown in FIG. 17. Lastly, using the remaining portions of the lines 48 as a mask, the substrate 50 is etched to form the active regions for the NMOS and PMOS transistors forming the SRAM cell 10 as shown in FIG. 18.

Figure 19:
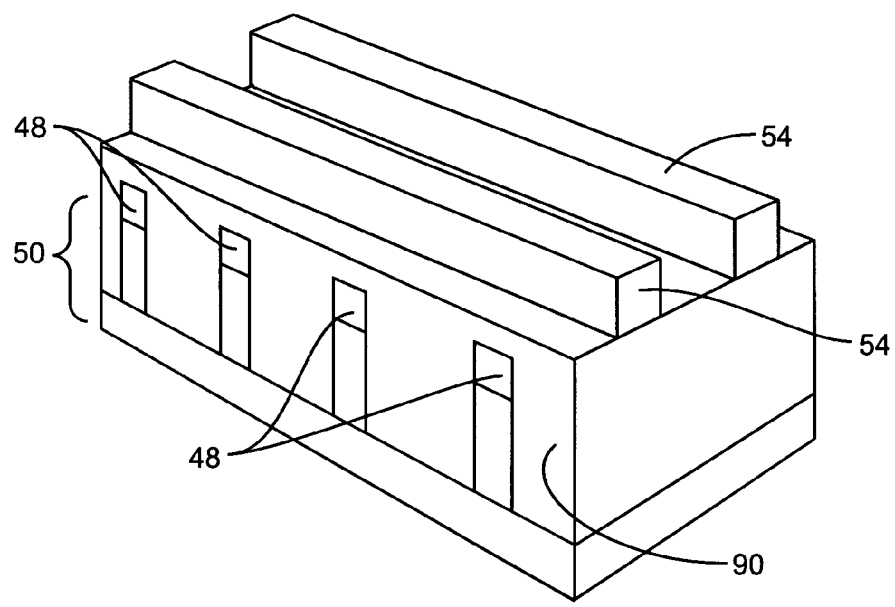
Figure 20:
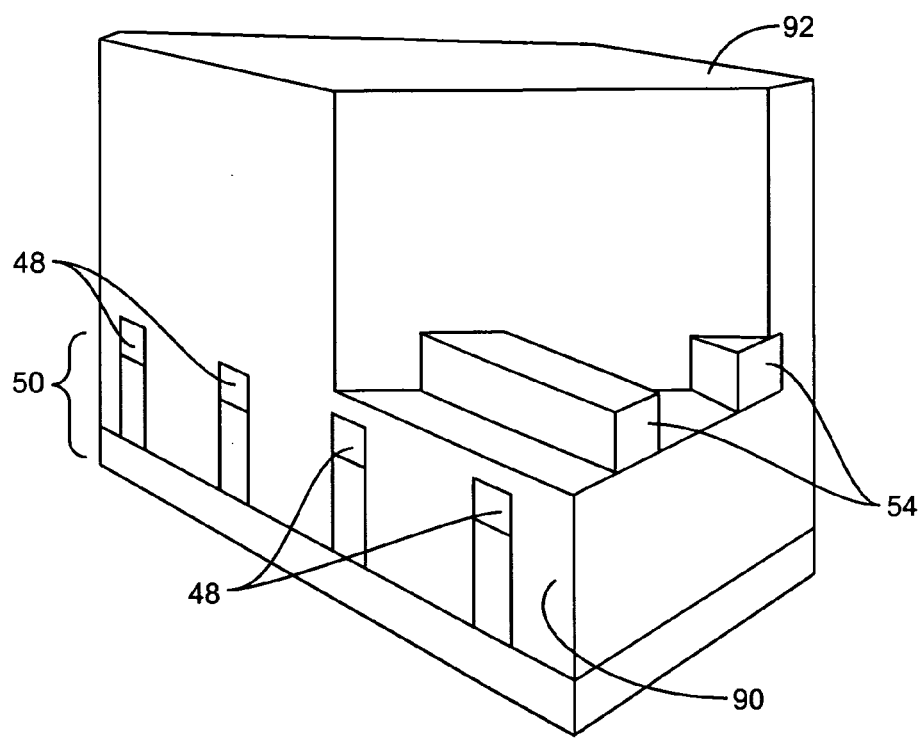
Figure 21:
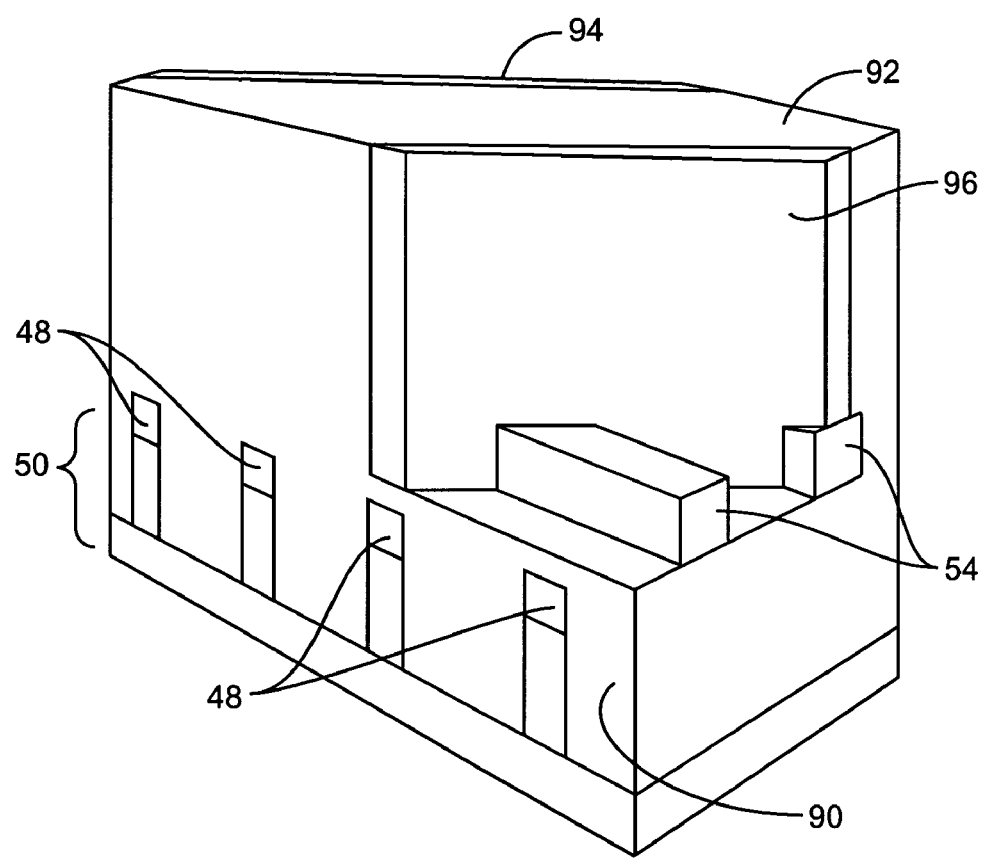
Figure 22:
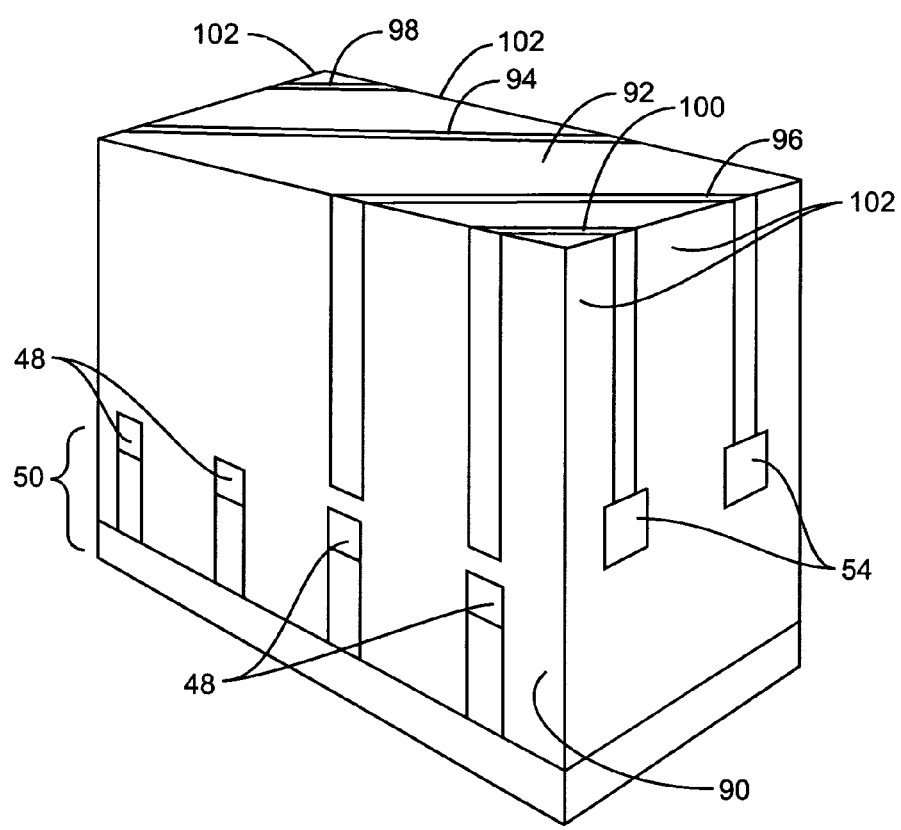
Figure 23:
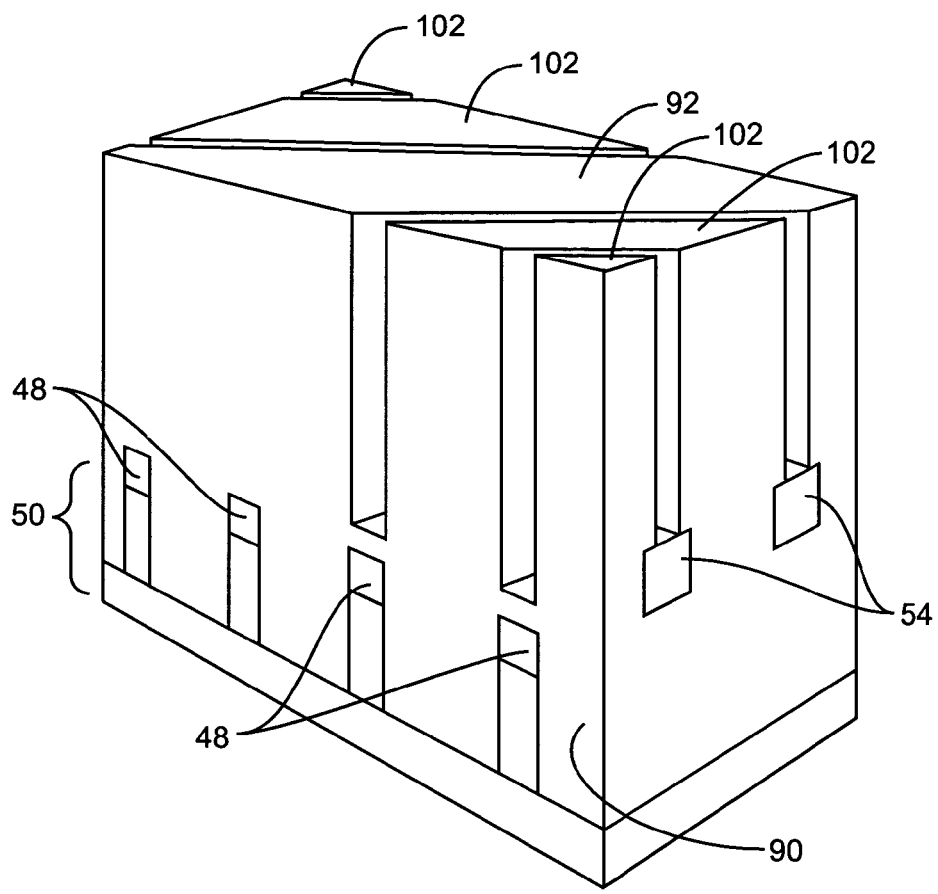
Figure 24:
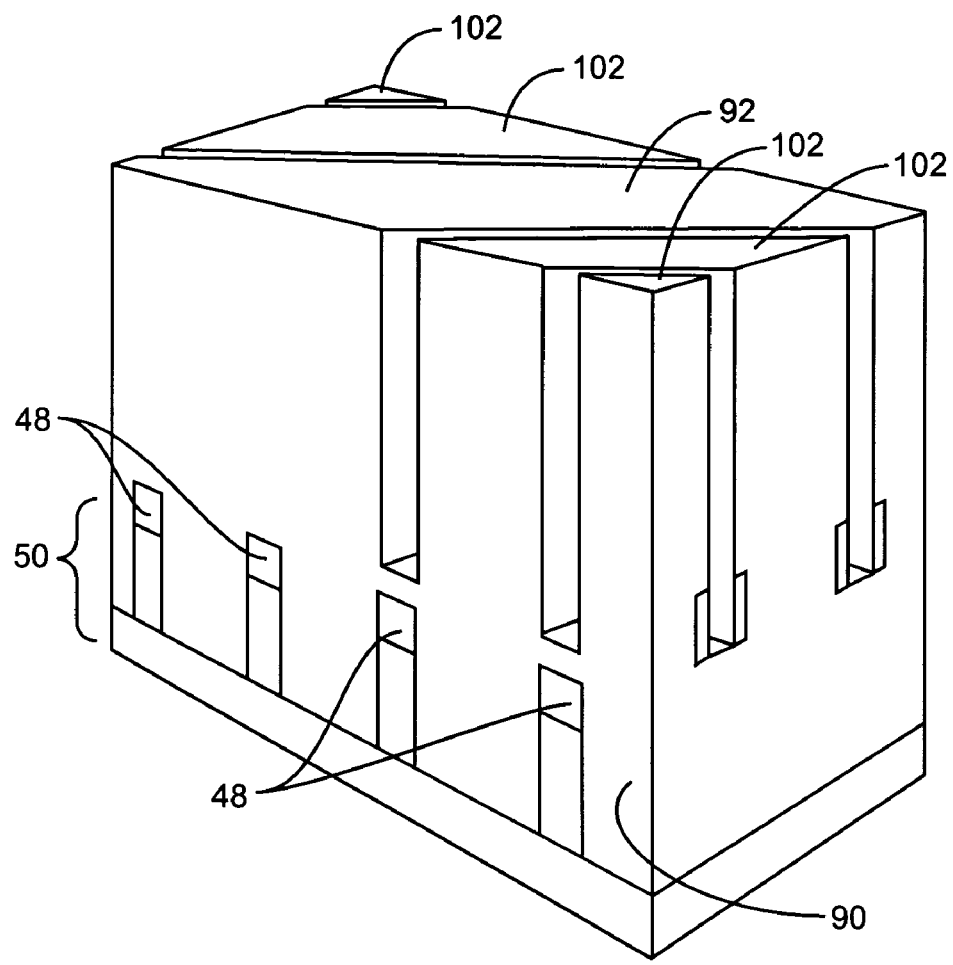
Figure 25:
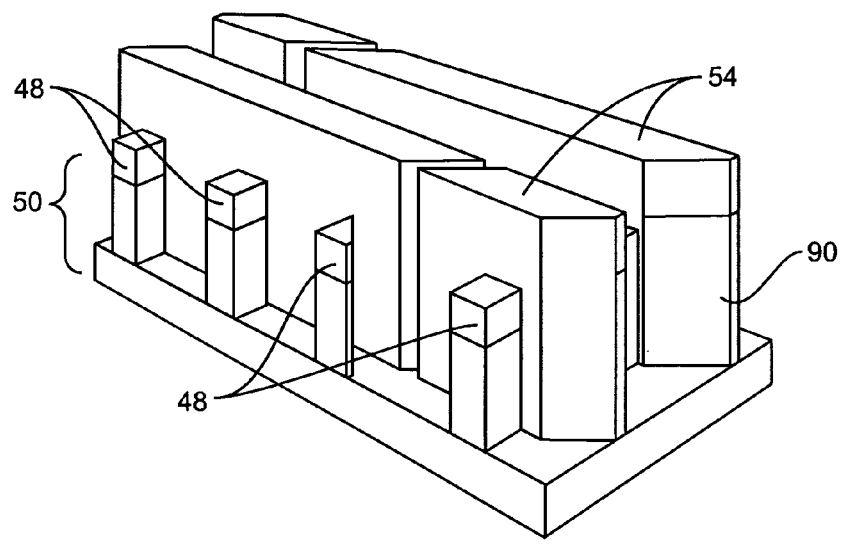

FIGS. 19 through 25 illustrate the formation and cutting of the lines 54 forming the gate regions of the transistors of the SRAM cell 10 (FIGS. 4C and 4D). More specifically, as shown in FIG. 19, a dielectric or insulator material 90 is deposited over the etched substrate 50 and the lines 54 are formed using a positive spacer process. As shown in FIG. 20, the negative spacer process used to cut the lines 54 is started by first forming an initial sacrificial structure 92 along a desired diagonal. The initial sacrificial structure 92 may be formed using a conventional photolithography process or one or more iterations of a positive spacer process. Next, as shown in FIG. 21, a spacer material is deposited over the initial sacrificial structure 92 and anisotropically etched to provide first spacers 94 and 96. As shown in FIG. 22, the process is continued to form second spacers 98 and 100 and sacrificial material 102. The first and second spacers 94 through 100 are then selectively etched, as shown in FIG. 23. Using the initial sacrificial structure 92 and the sacrificial material 102 as a mask, the lines 54 are etched to cut the lines 54, as shown in FIG. 24. Lastly, as shown in FIG. 25, the initial sacrificial structure 92 and the sacrificial material 102 are etched. Then using the lines 54, as cut, as a mask, the dielectric or insulator material 90 is etched. At this point, additional steps may be performed to differentiate NMOS and PMOS devices, as discussed above.

Figure 26:
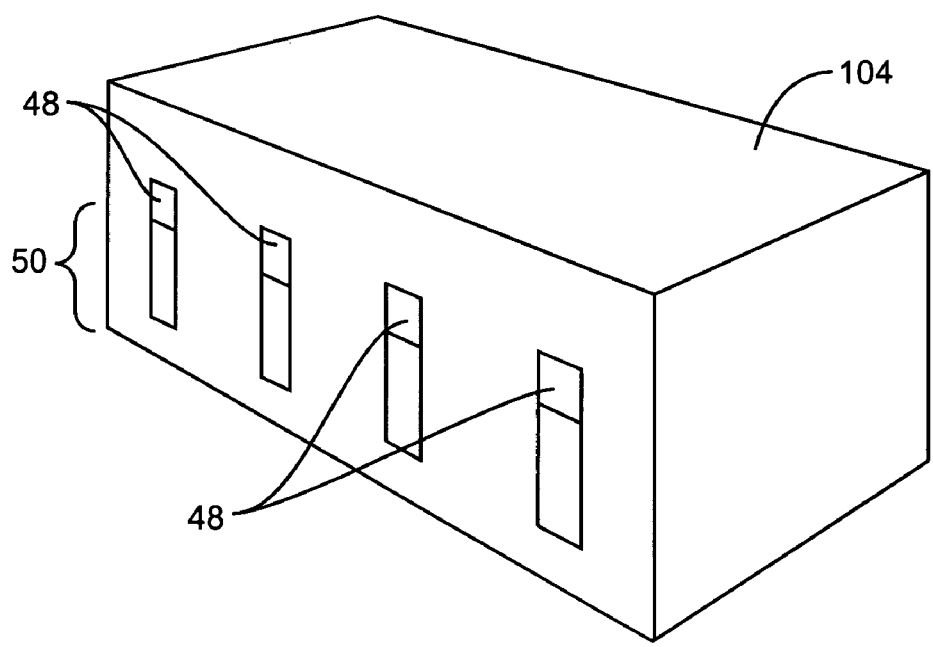
Figure 27:
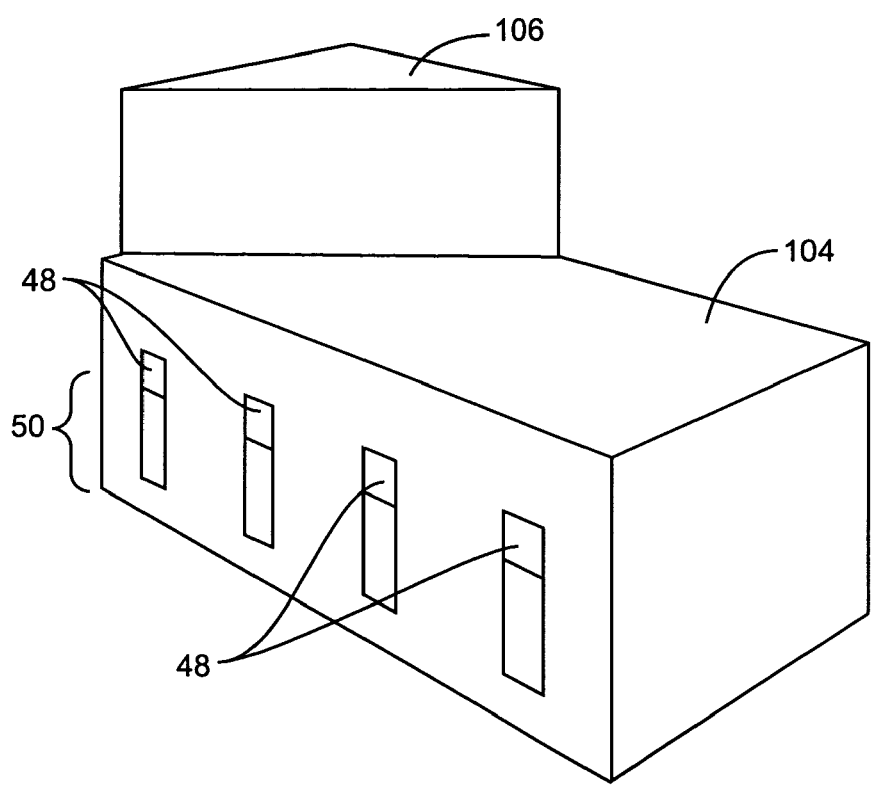
Figure 28:
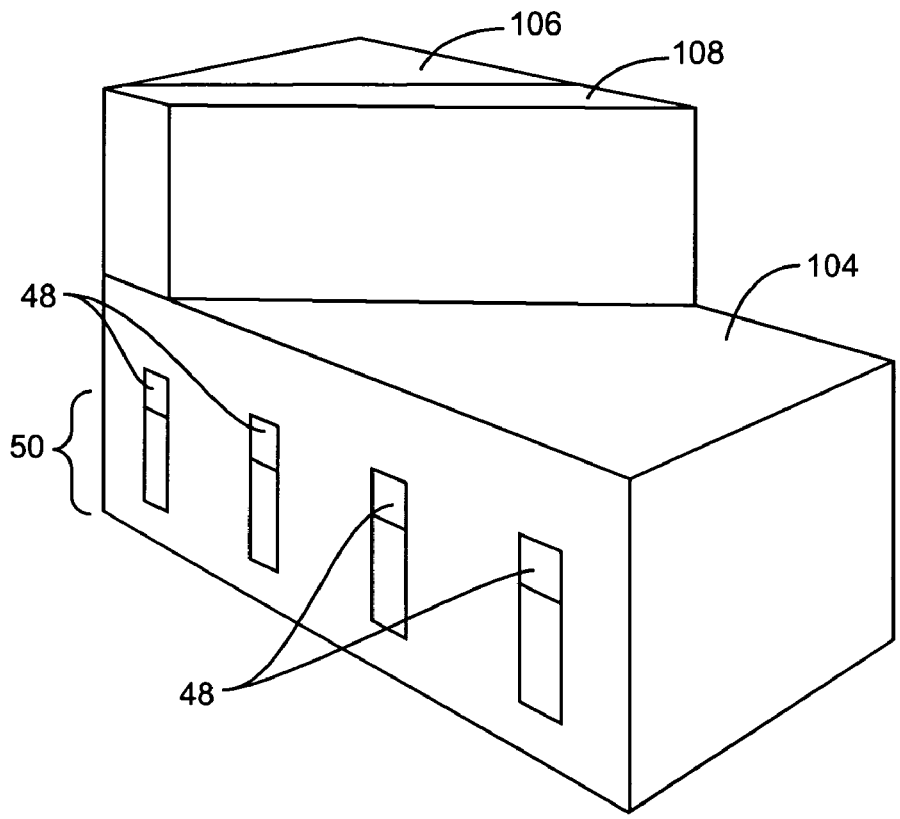
Figure 29:
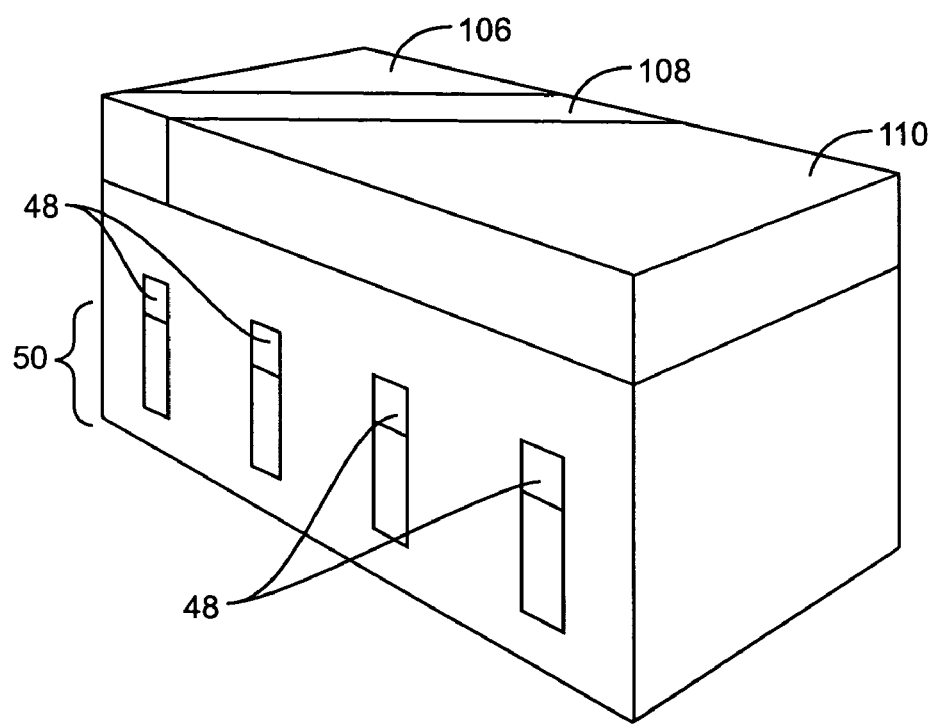

FIGS. 26 through 35 illustrate the formation of the contact holes 58 and 60 (FIGS. 4E and 4F). Before beginning the negative spacer process for forming the first contact hole 58 for the SRAM cell 10, a first interlayer dielectric material 104 is deposited and planarized, as shown in FIG. 26. Then to begin the negative spacer process for forming the first contact hole 58, a first initial sacrificial structure 106 is formed along the desired diagonal as shown in FIG. 27. As shown in FIG. 28, spacer material is then deposited over the first initial sacrificial structure 106 and the exposed surface of the interlayer dielectric material 104 and anisotropically etched to form a first spacer 108. As shown in FIG. 29, a first sacrificial material 110 is then deposited over the first initial sacrificial structure 106, the first spacer 108, and the exposed surface of the first interlayer dielectric material 104. The first sacrificial material 110 is then processed or thinned to expose the first spacer 108. Further processing may be performed in order to thin the first spacer 108 to a desired thickness.

Figure 30:
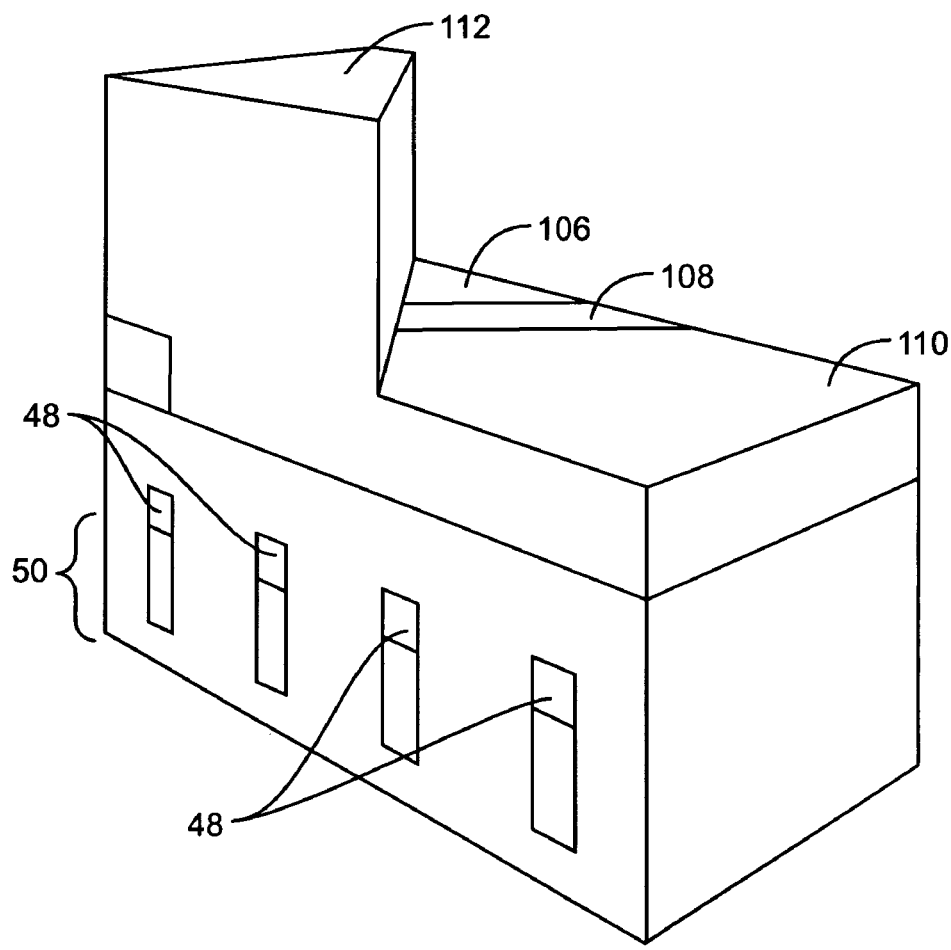
Figure 31:
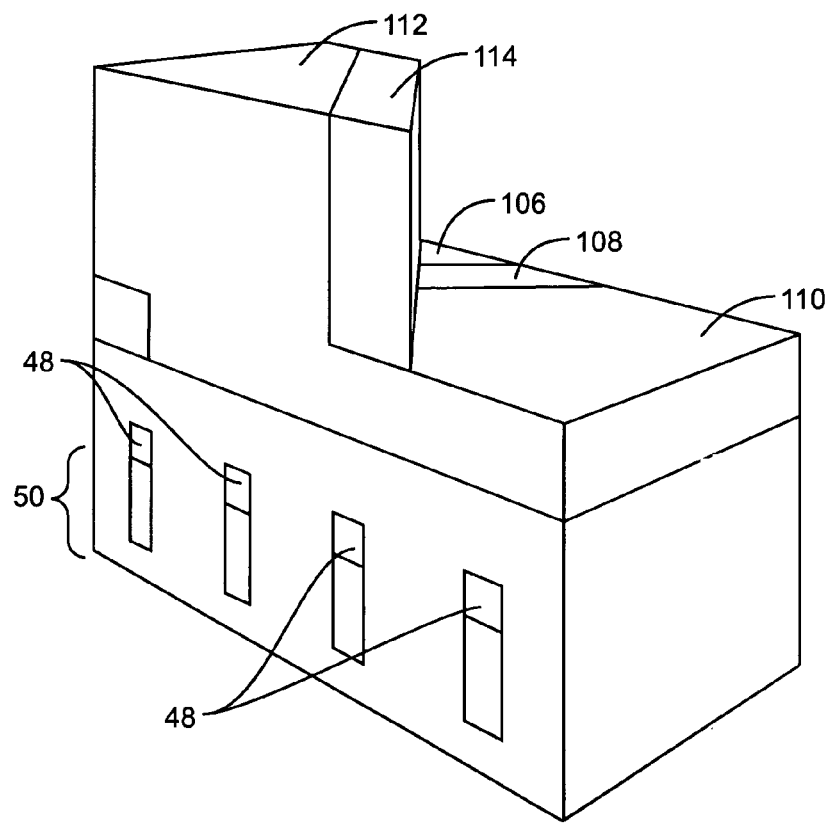
Figure 32:
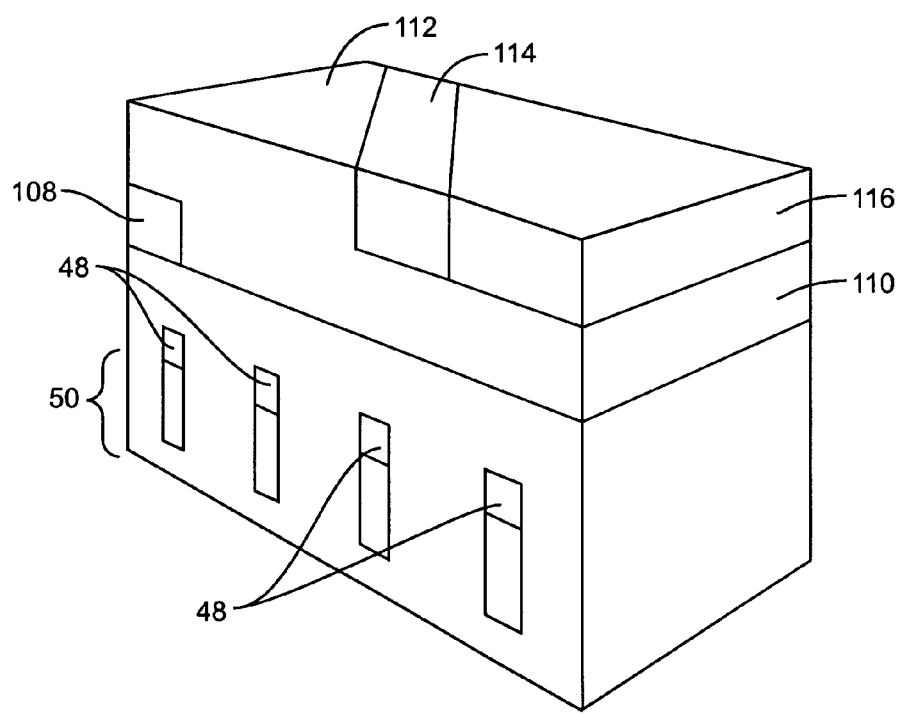
Figure 33:
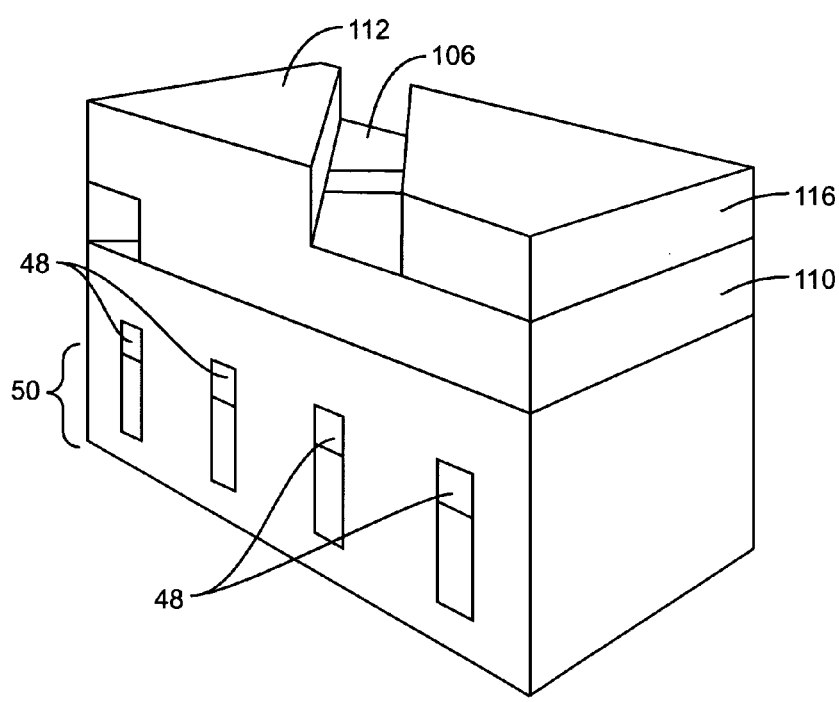
Figure 34:
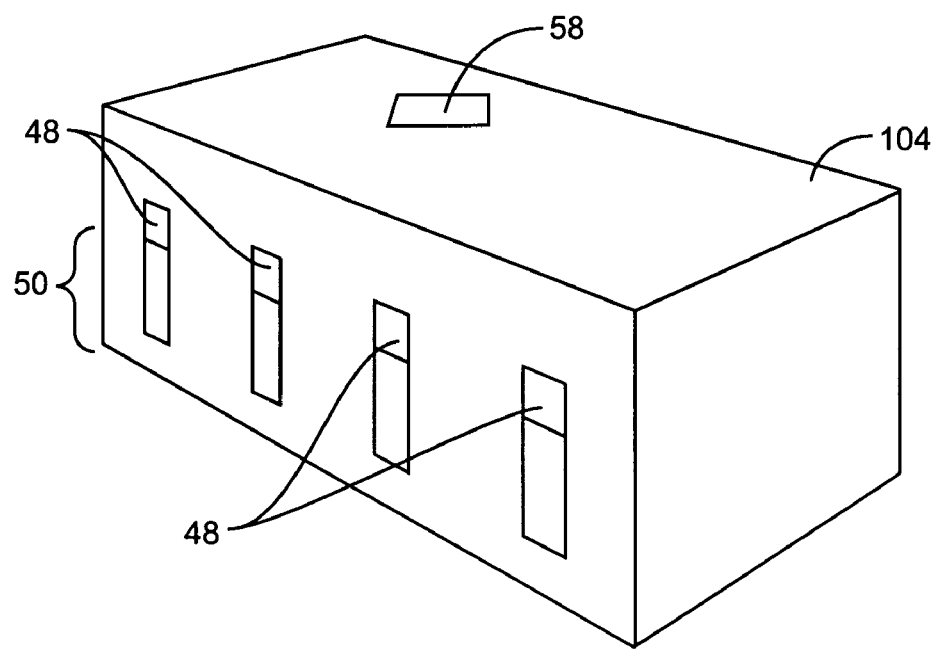
Figure 35:
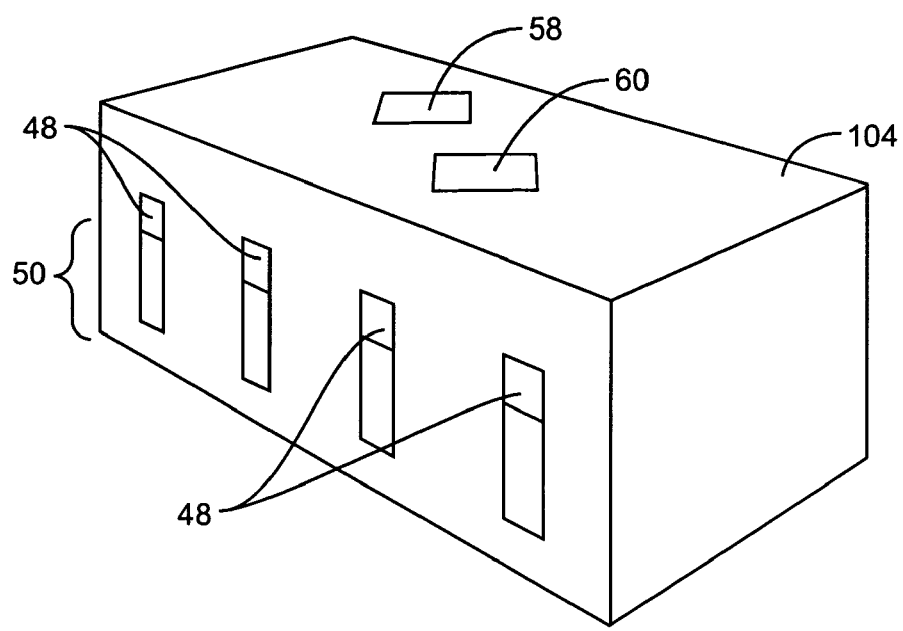

As shown in FIG. 30, a second initial sacrificial structure 112 is formed along a desired diagonal. Next, as shown in FIG. 31, a spacer material is deposited over the second initial sacrificial structure 112 and the exposed surface of the first initial sacrificial structure 106, the first spacer 108, and the first sacrificial material 110. The spacer material is anisotropically etched to provide a second spacer 114 that crosses over or intersects the first spacer 108 at the desired location of the first contact hole 58. A second sacrificial material 116 is then deposited over the second initial sacrificial structure 112, the second spacer 114, and the exposed surface of the first initial sacrificial structure 106, the first spacer 108, and the first sacrificial material 110. The second sacrificial material 116 is then processed or thinned in order to expose the second spacer 114, as shown in FIG. 32. The spacers 108 and 114 are then etched to provide a resulting mask for etching the first contact hole 58 for the SRAM cell 10, as shown in FIG. 33. The first interlayer dielectric material 104 and the substrate 50 are then etched to provide the first contact hole 58. The first contact hole 58 is thereafter filled with a conductive material such as metal. The initial sacrificial structures 106 and 112 and the sacrificial materials 110 and 116 are then removed. As shown in FIG. 35, the process is repeated to provide the second contact hole 60 for the SRAM cell 10.

Figure 36:
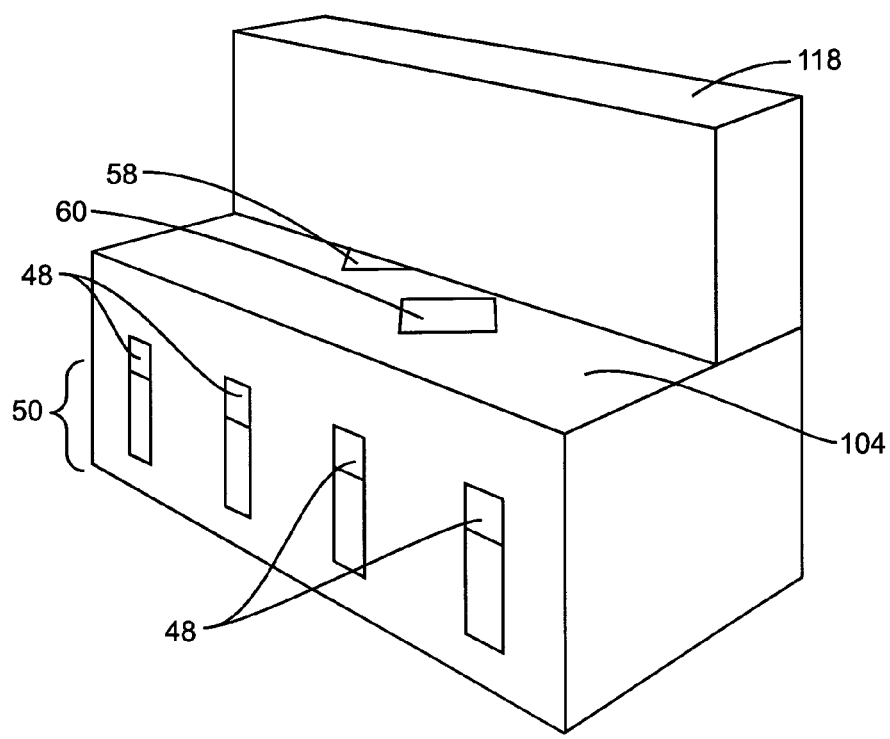
Figure 37:
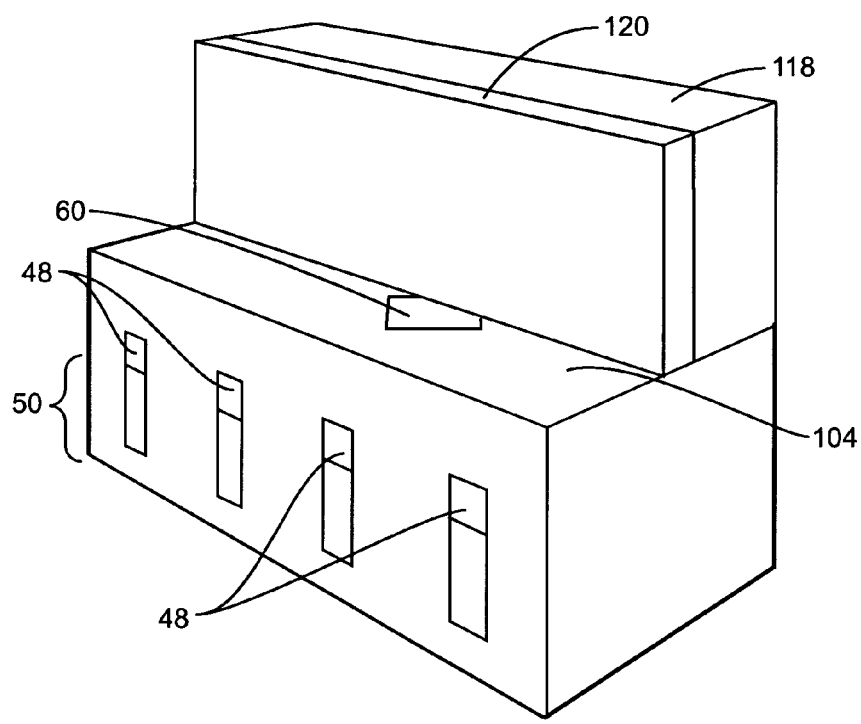
Figure 38:
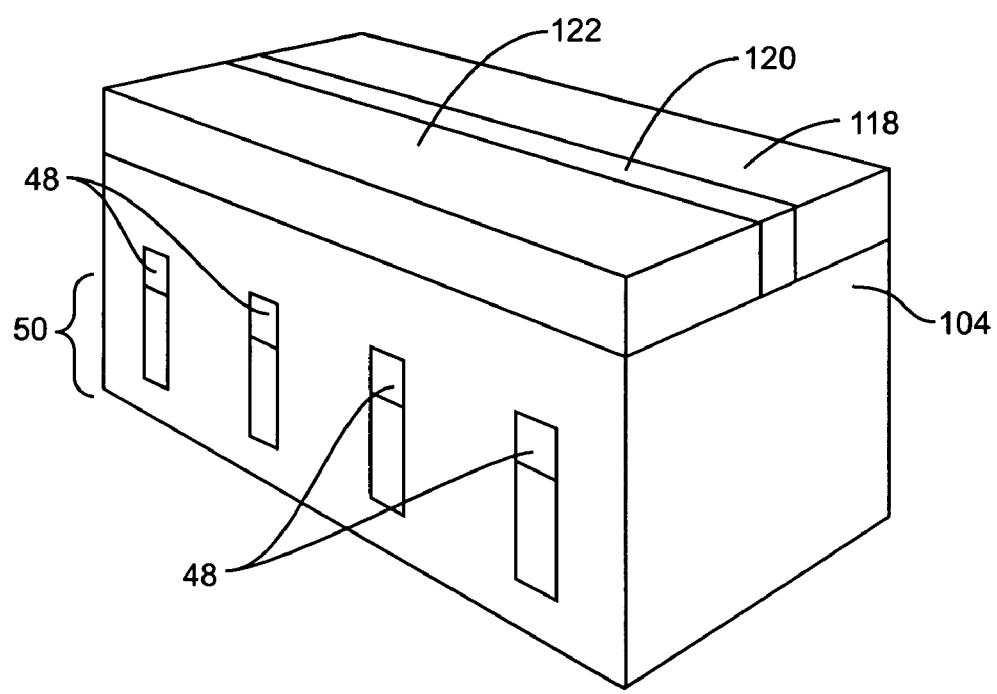

FIGS. 36 through 41 illustrate the formation the local interconnect lines 62 (FIG. 4G) for the SRAM cell 10. More specifically, as shown in FIG. 36, an initial sacrificial structure 118 is formed using a conventional photolithography process or one or more iterations of a positive spacer lithography process. Next, a spacer material is deposited over the initial sacrificial structure 118 and the exposed surface of the first interlayer dielectric material 104 including the contact holes 58 and 60. The spacer material is anisotropically etched to form a first spacer 120 along the side-wall of the initial sacrificial structure 118 as shown in FIG. 27. The location of the first spacer 120 corresponds to the desired location of the local interconnect 62 for the SRAM cell 10. As shown in FIG. 38, a sacrificial material 122 is then deposited over the initial sacrificial structure 118, the first spacer 120, and the exposed surface of the first interlayer dielectric material 104 including the second contact hole 60. The sacrificial material 122 is processed or thinned to expose the first spacer 120. Further processing may be performed to thin the first spacer 120 to a desired thickness.

Figure 39:
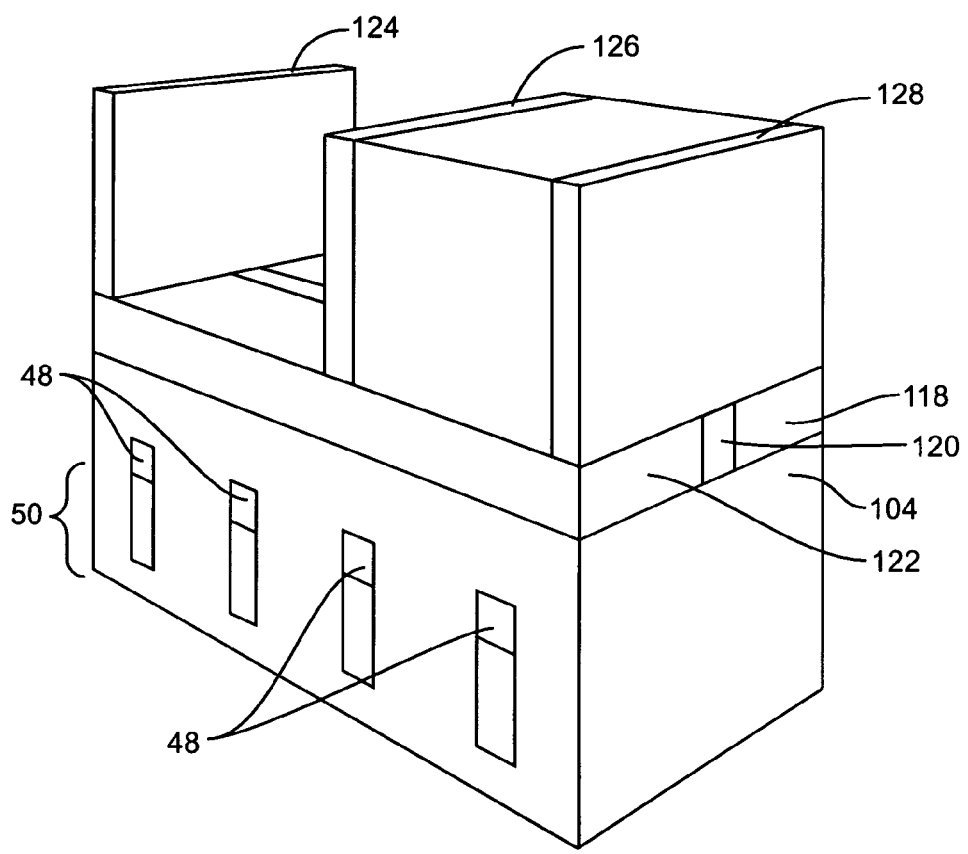
Figure 40:
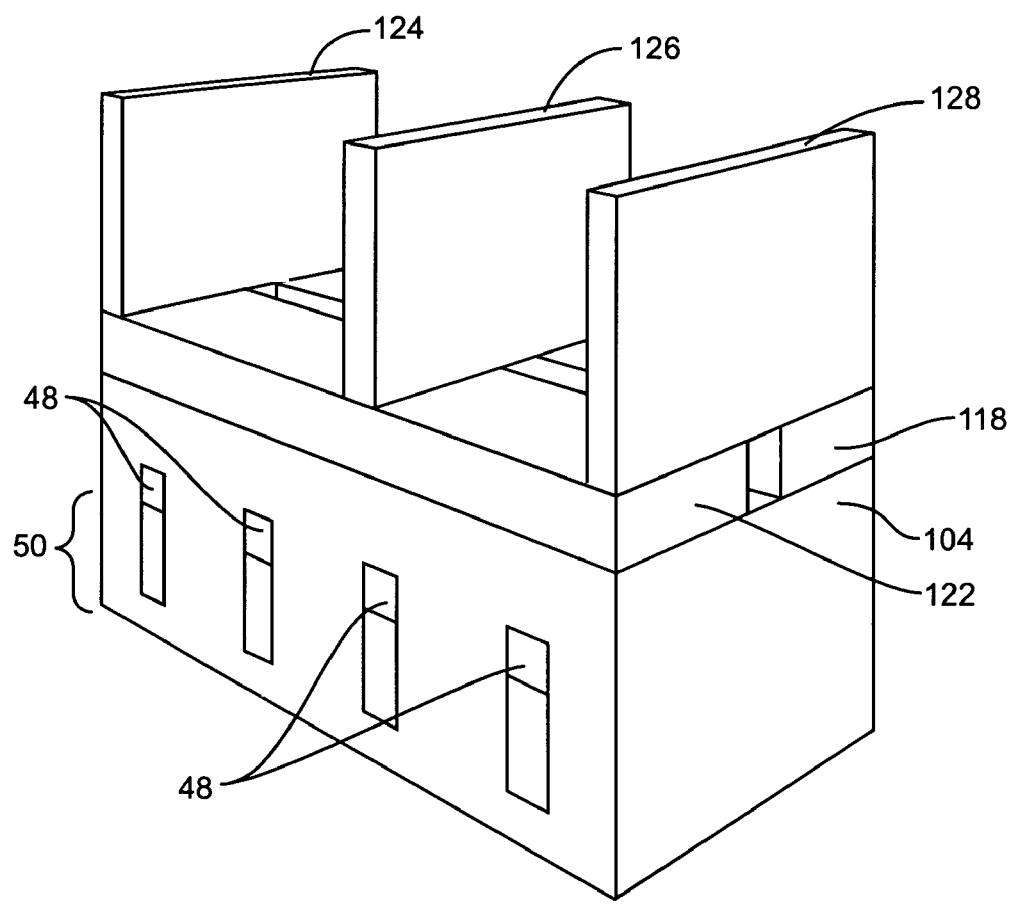
Figure 41:
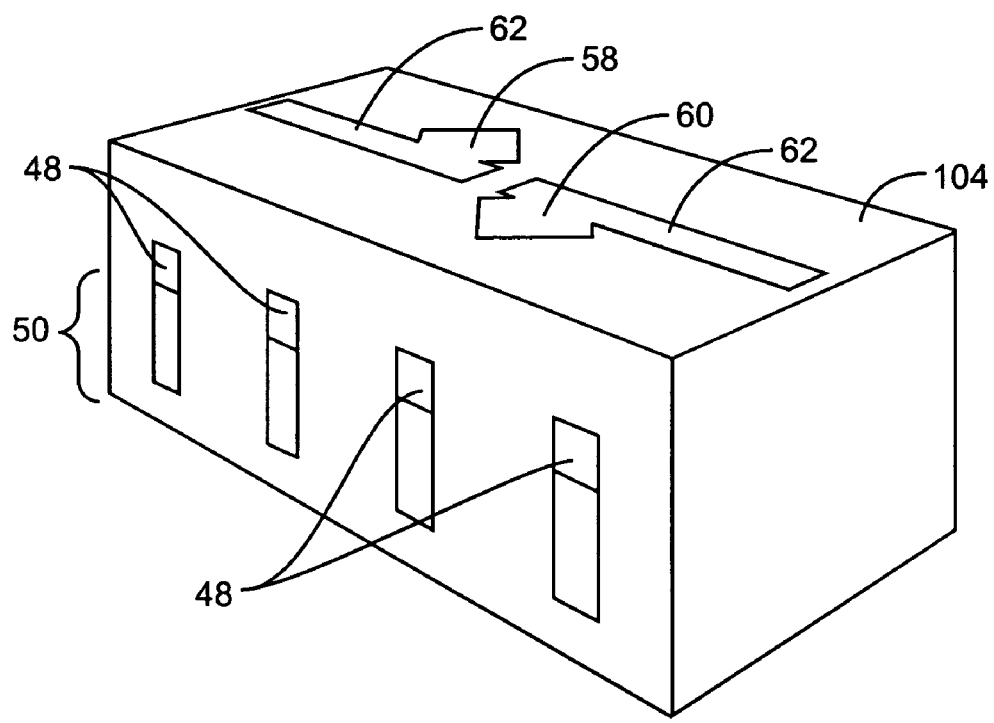

Next, as shown in FIG. 39, a positive spacer lithography process is performed to provide second spacers 124, 126, and 128 at desired breaking points for the local interconnects 62. The second spacers 124, 126, and 128 are a different material than that used to form the first spacer 120. Next, using the second spacers 124, 126, and 128 as a mask, the first spacer 120 is etched to expose the underlying first interlayer dielectric material 104 and substrate 50 at the desired locations of the local interconnects 62 for the SRAM cell 10, as shown in FIG. 40. As shown in FIG. 41, using the initial sacrificial structure 118, the sacrificial material 122, and the second spacers 124, 126, and 128 as a mask, the first interlayer dielectric material 104 and the substrate 50 are etched to provide the local interconnects 62. The initial sacrificial structure 118, the sacrificial material 122, and the second spacers 124, 126, and 128 are then removed. At some point before or after the removal of the initial sacrificial structure 118, the sacrificial material 122, and the second spacers 124, 126, and 128, the local interconnects 62 are filled with a conductive material such as metal.

Figure 42:
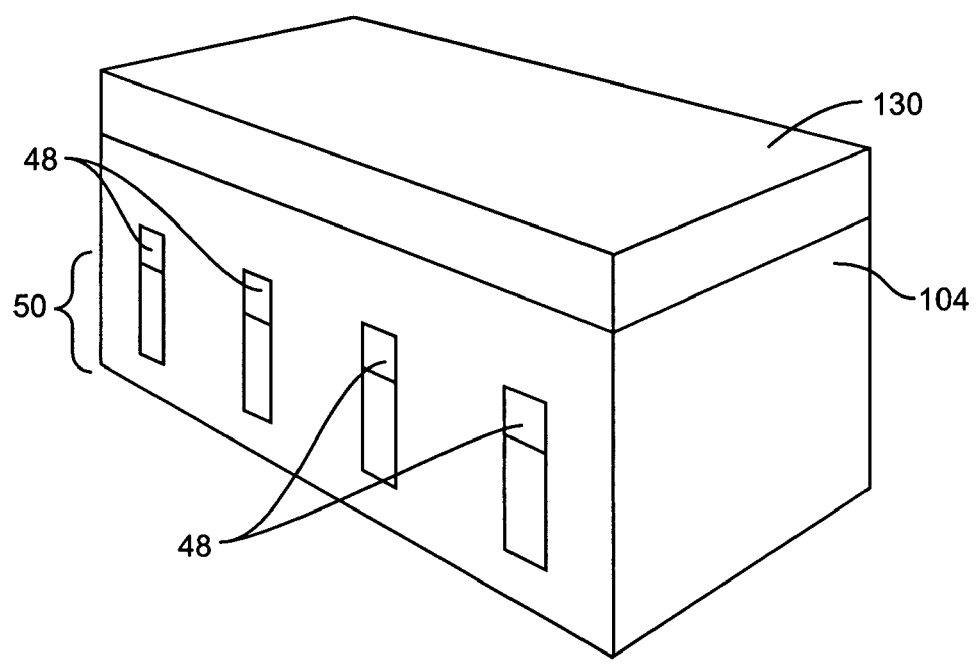
Figure 43:
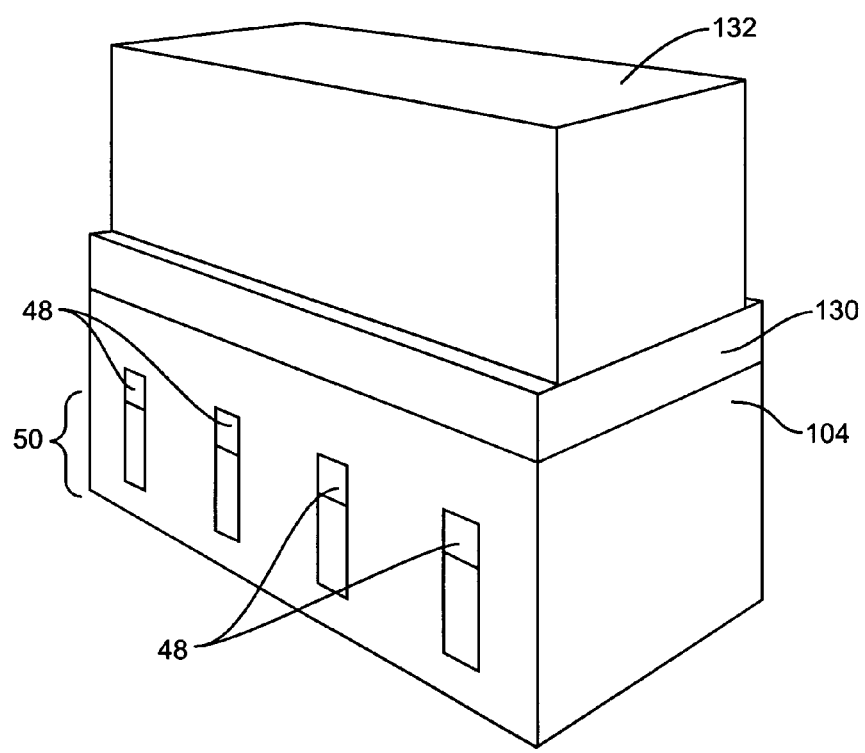
Figure 44:
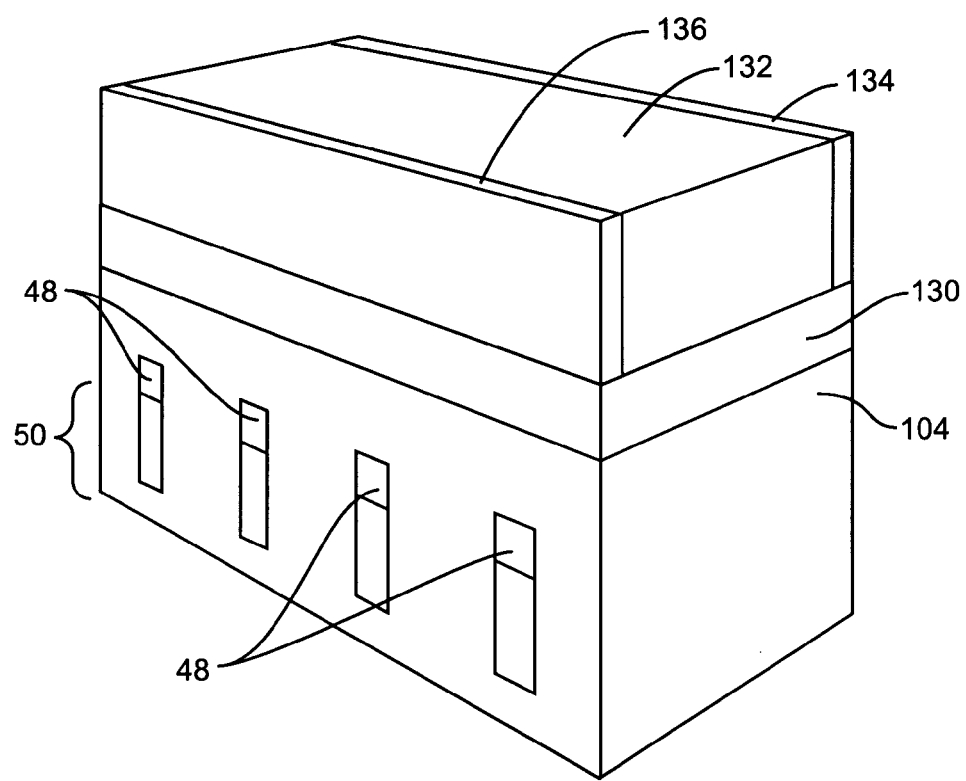
Figure 45:
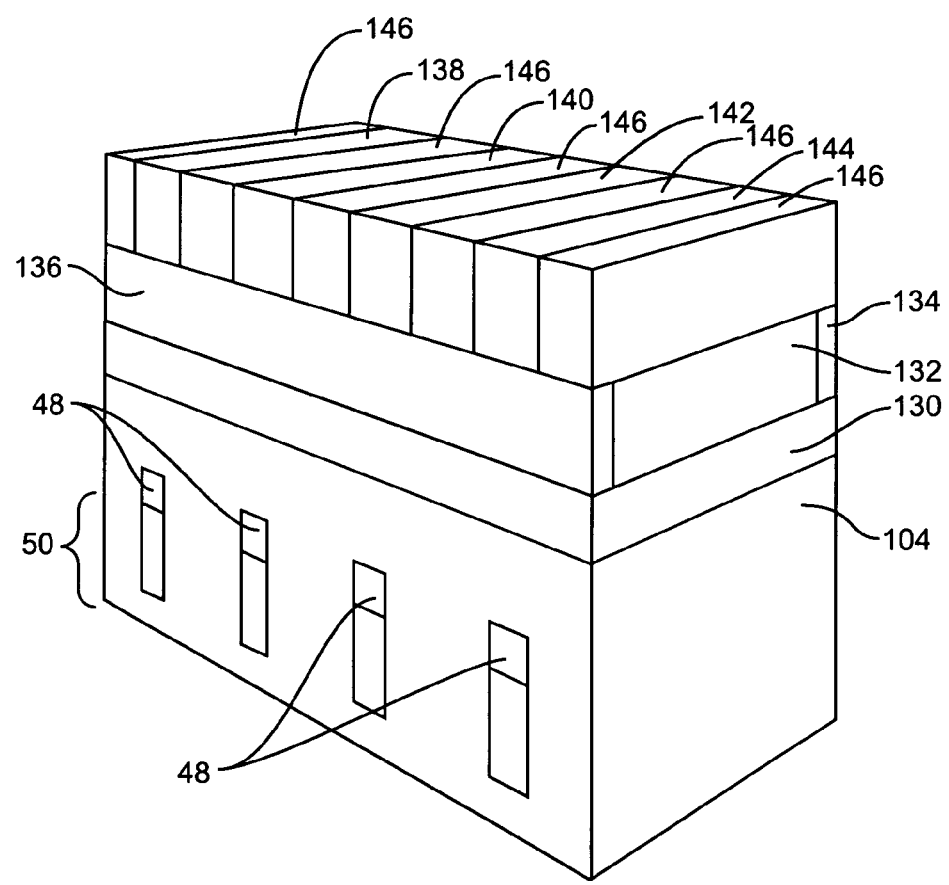
Figure 46:
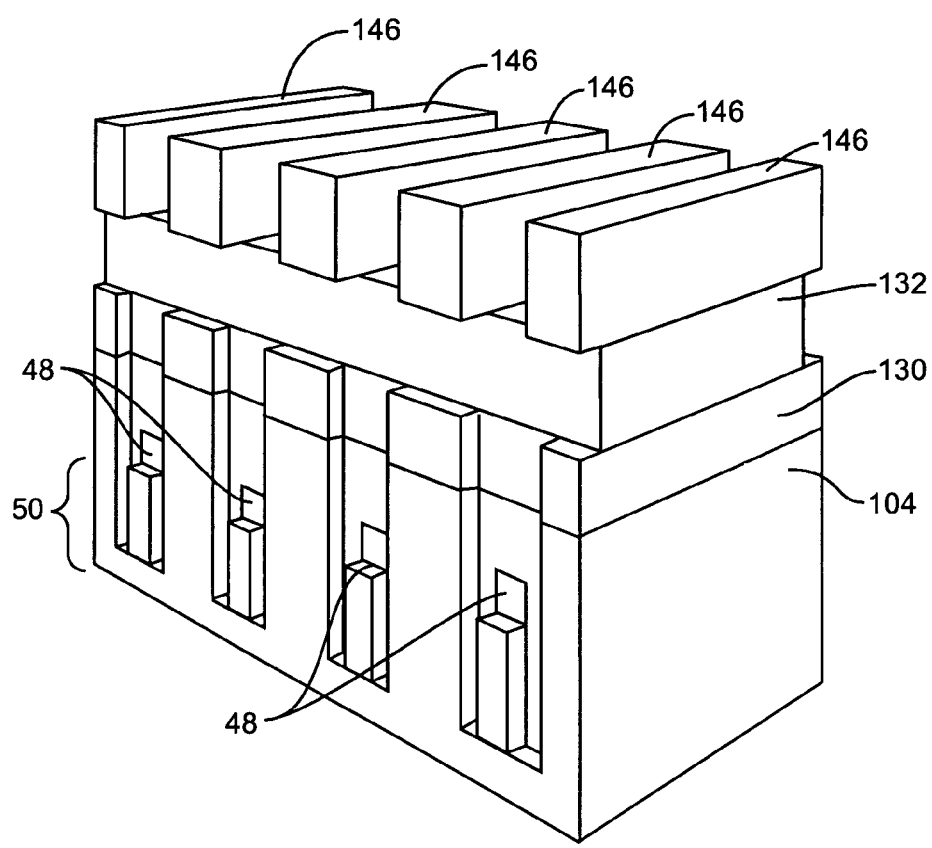
Figure 47:
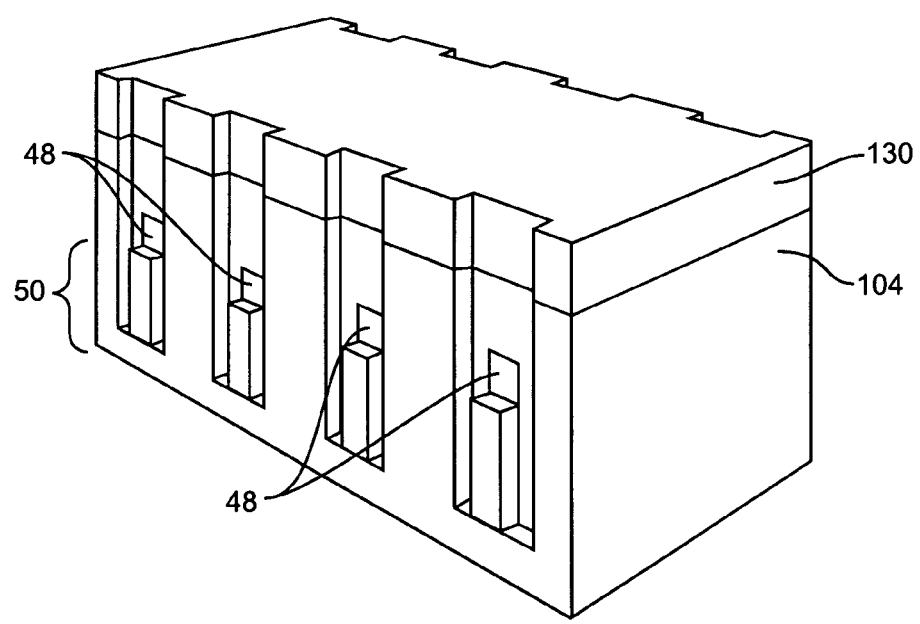
Figure 48:
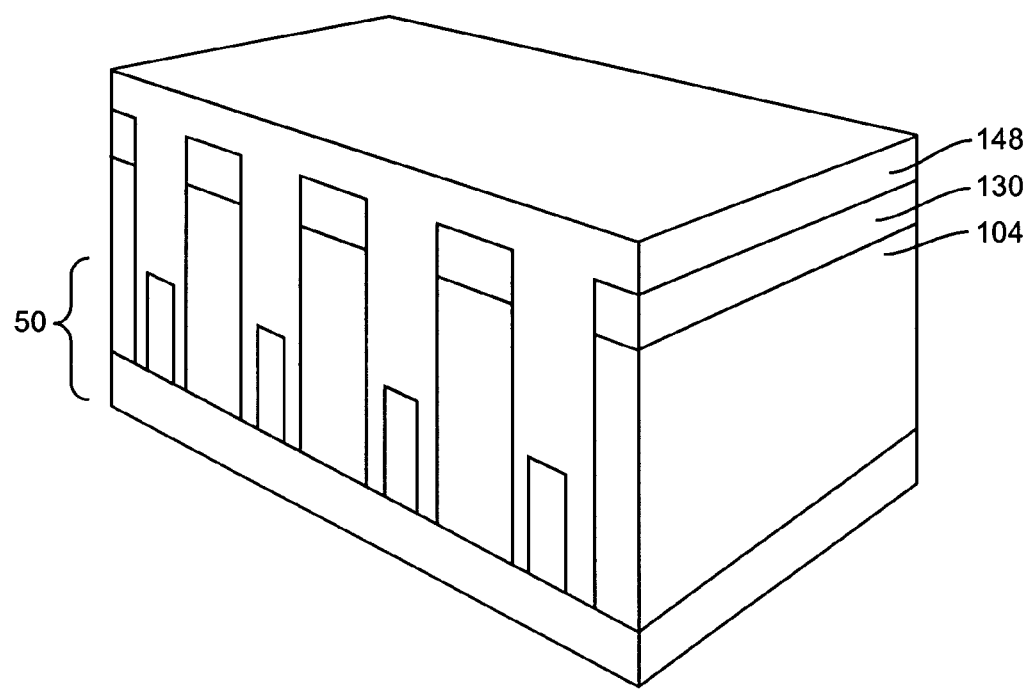

FIGS. 42 through 48 illustrate the formation of the contact holes 64 (FIG. 4H) for the SRAM cell 10. First, a second interlayer dielectric material 130 is deposited and planarized as shown in FIG. 42. Next, as shown in FIG. 43, an initial sacrificial structure 132 is formed using a conventional photolithography process or one or more iterations of a positive spacer lithography process. A spacer material is then deposited over the initial sacrificial structure 132 and the exposed surface of the second interlayer dielectric material 130 and anisotropically etched to form first spacers 134 and 136, as shown in FIG. 44. As shown in FIG. 45, multiple iterations of a positive spacer lithography process are then performed to provide second spacers 138 through 144 flanked by sacrificial material 146. As shown in FIG. 46, the first spacers 134 and 136 and the second spacers 138 through 144 are then etched, thereby providing a mask for etching the contact holes 64 for the SRAM cell 10. Etching is then performed to form the contact holes 64. The initial sacrificial structure 132 and the sacrificial material 146 are then removed as shown in FIG. 47. At some point either before or after removal of the initial sacrificial structure 132 and the sacrificial material 146, the contact holes 64 are filled with a conductive material such as metal. As shown in FIG. 48, a conductive layer 148 is formed. Note that the filling of the contact holes 64 with a conductive material and the formation of the conductive layer 148 may be performed as separate steps or performed using the same processing steps.

Figure 49:
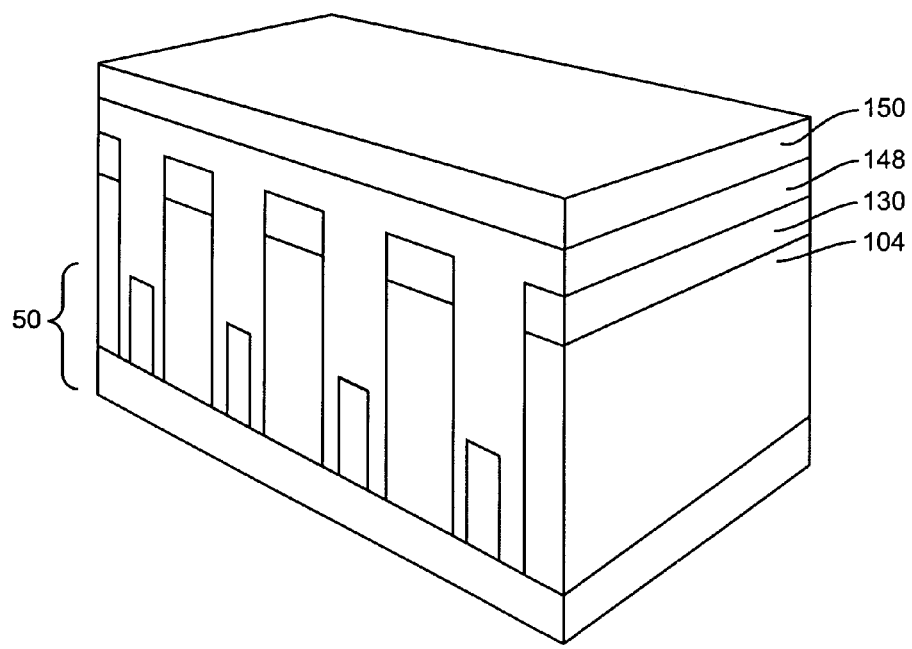
Figure 50:
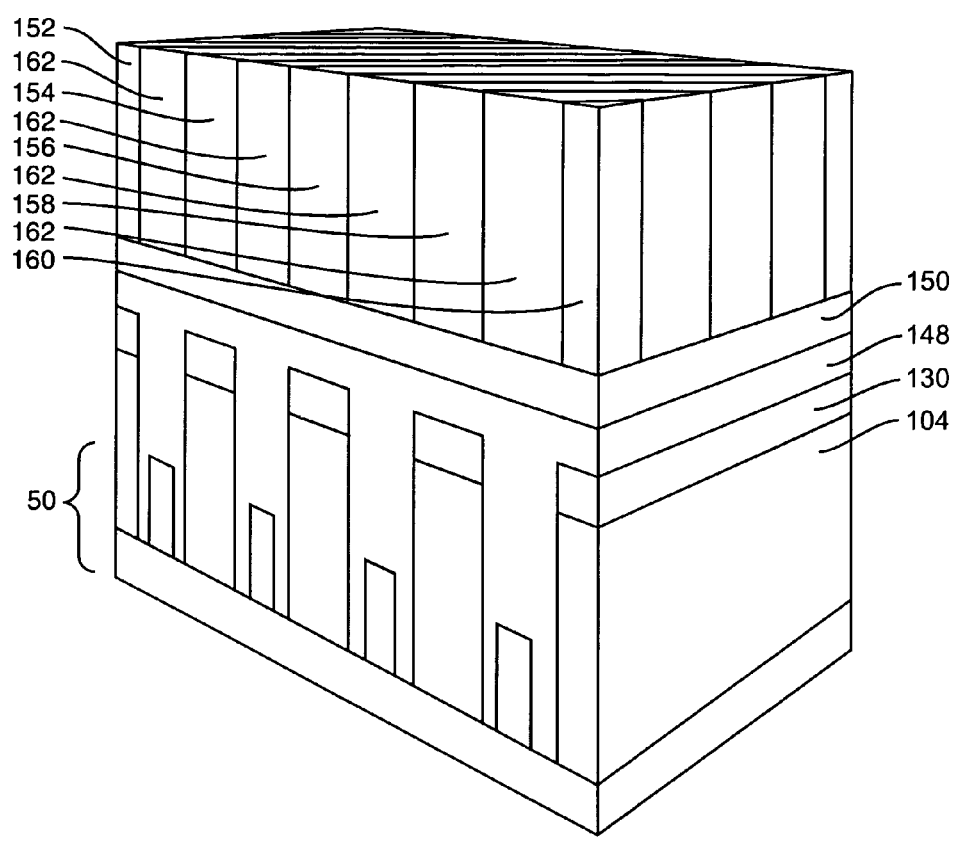
Figure 51:
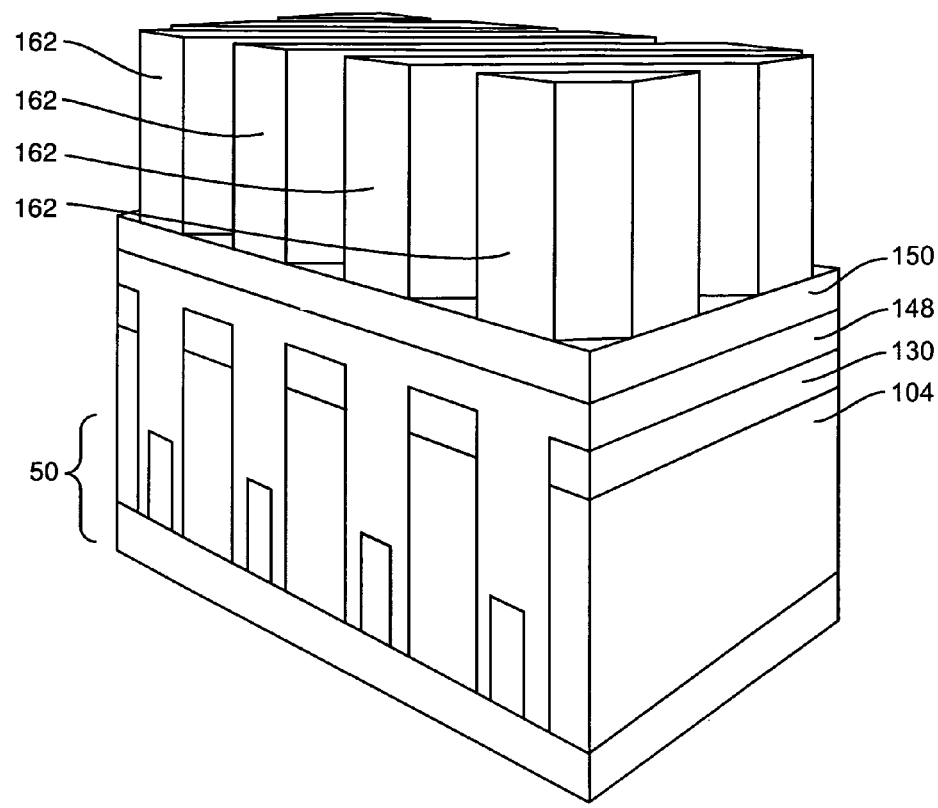
Figure 52:
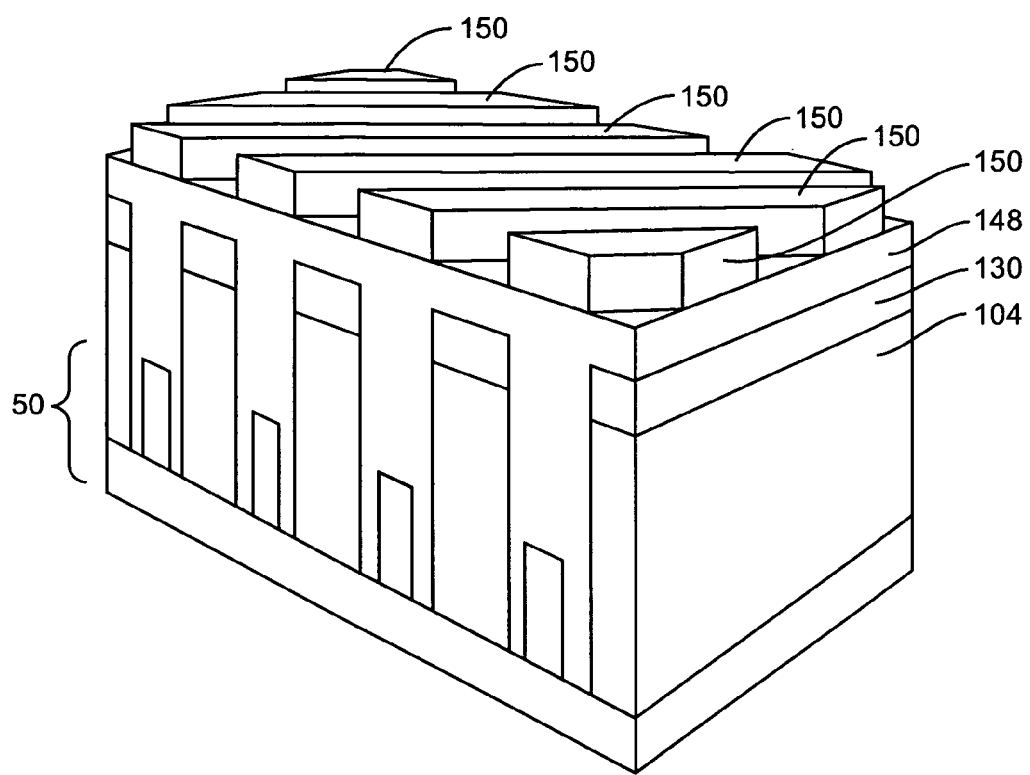
Figure 53:
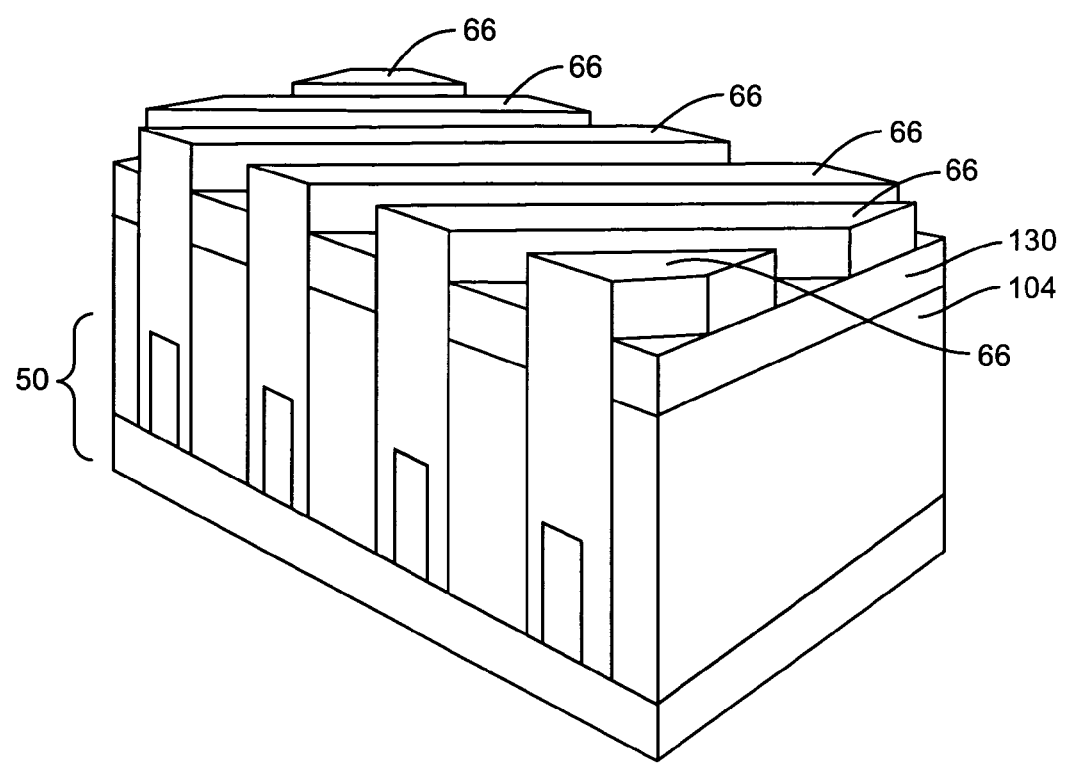

FIGS. 49 through 53 illustrate a negative spacer lithography process for cutting the conductive layer 148 to provide the contact lines 66 (FIG. 4I) for the SRAM cell 10. More specifically, as shown in FIG. 49, an insulation layer 150 is first formed on the conductive layer 148. Next, as shown in FIG. 50, a negative spacer lithography process begins by first forming spacers 152 through 160 flanked by sacrificial material 162. The spacers 152 through 160 are then etched as shown in FIG. 51. Using the remaining sacrificial material 162 as a mask, the insulation layer 150 is etched as shown in FIG. 52. Then, using the remaining insulation layer 150 as a mask, the conductive layer 148 is etched to provide the contact lines 66 for the SRAM cell 10, as shown in FIG. 53.

Figure 54:
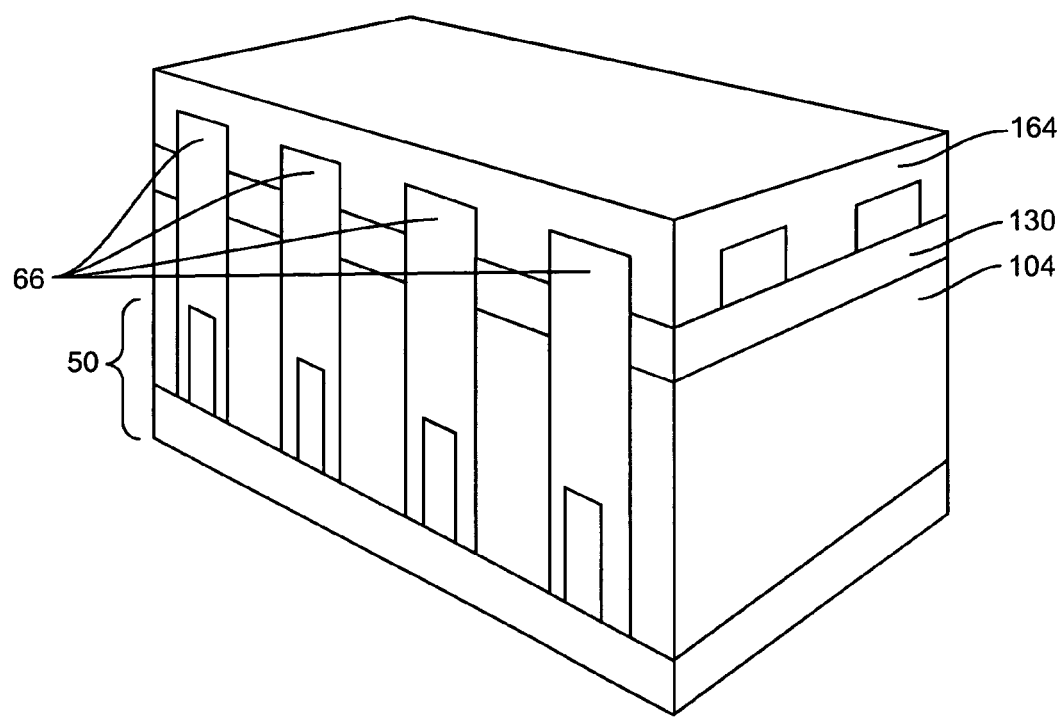
Figure 55:
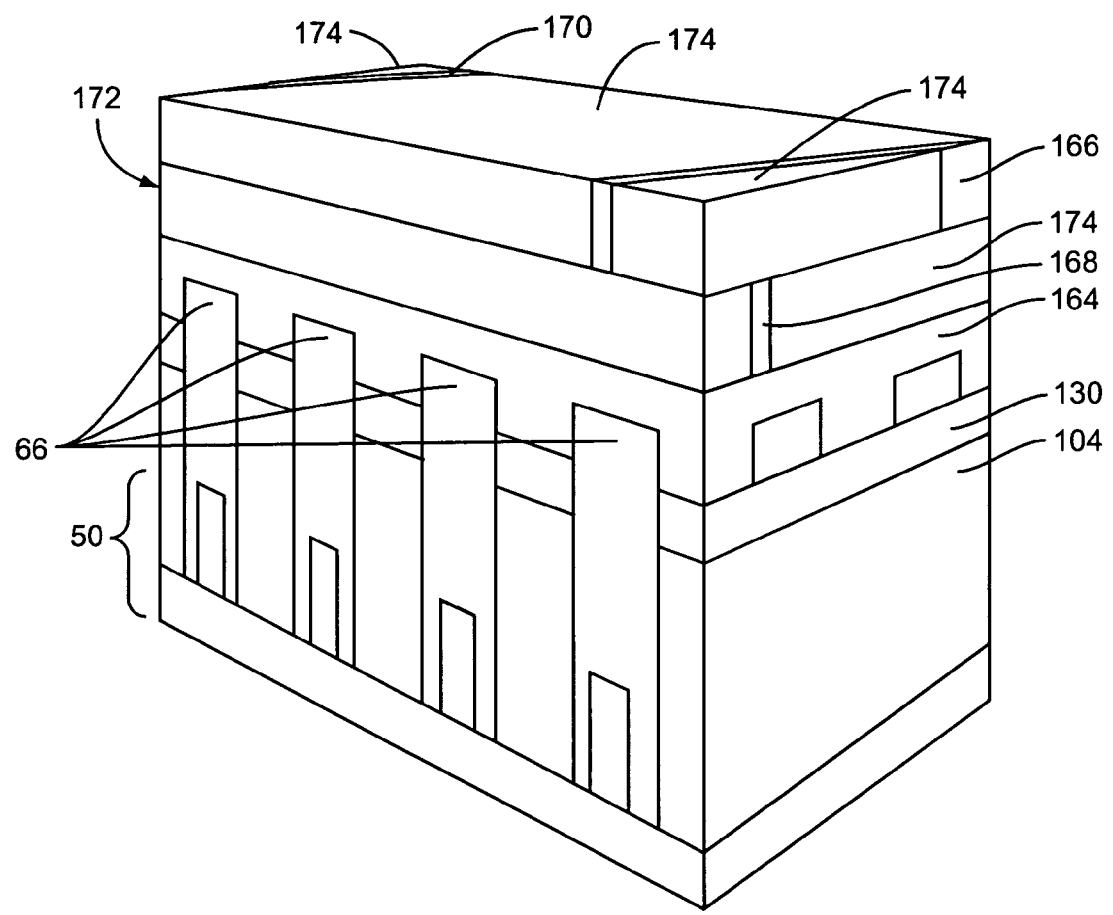
Figure 56:
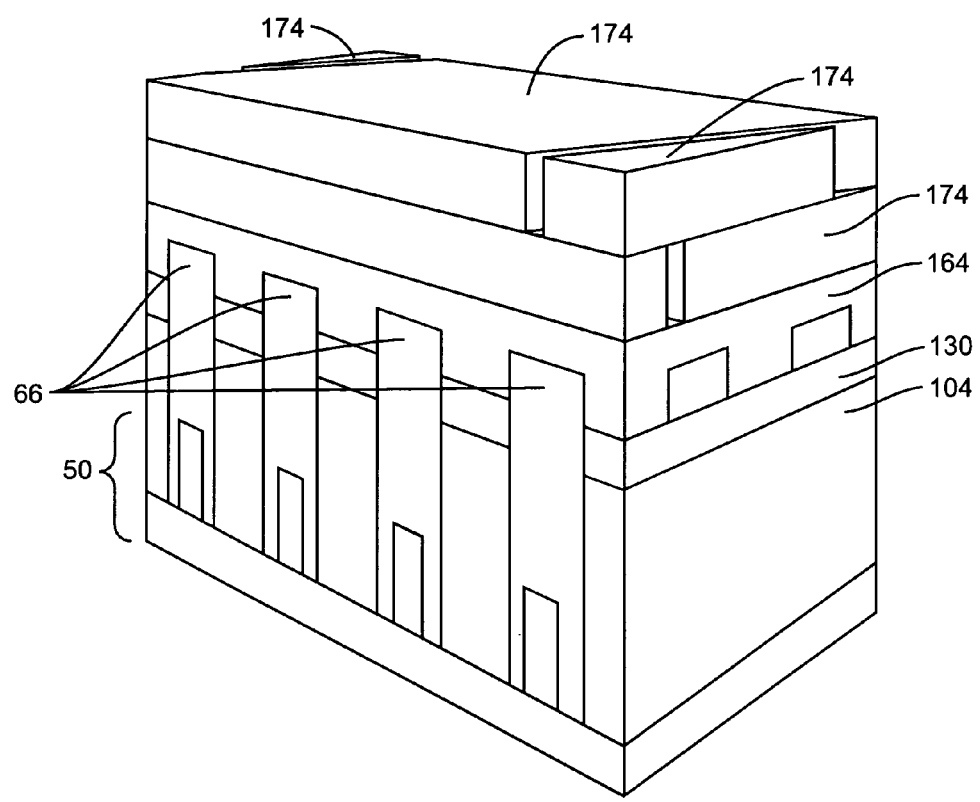

FIGS. 54 through 56 illustrate the formation of contact holes to the gate regions of the access transistors, which are to be interconnected to the word line (WL). First, as shown in FIG. 54, an interlayer dielectric material 164 is deposited and planarized. Next, as shown in FIG. 55, a negative spacer lithography process is utilized to form spacers 166 through 170. The spacers 166 through 170 are flanked, or surrounded, by sacrificial material 174. The intersection of the spacers 166 and 168 defines the location of the contact hole for connecting to the first access transistor, and the intersection of the spacers 168 and 170 defines the location of the contact hole for connecting to the second access transistor. As shown in FIG. 56, the spacers 166 through 170 are etched. Then, using the remaining sacrificial material 174 as a mask, etching is performed to form the contact holes to the gate regions of the access transistors 24 and 26. The contact holes are filled with conductive material such as metal.

Figure 57:
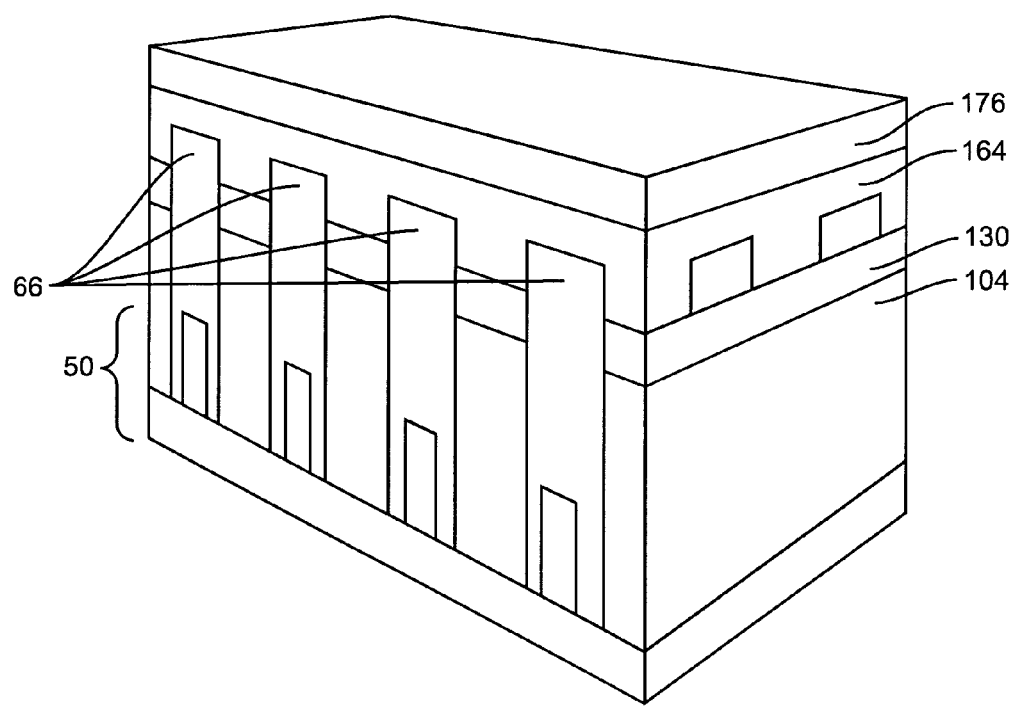
Figure 58:
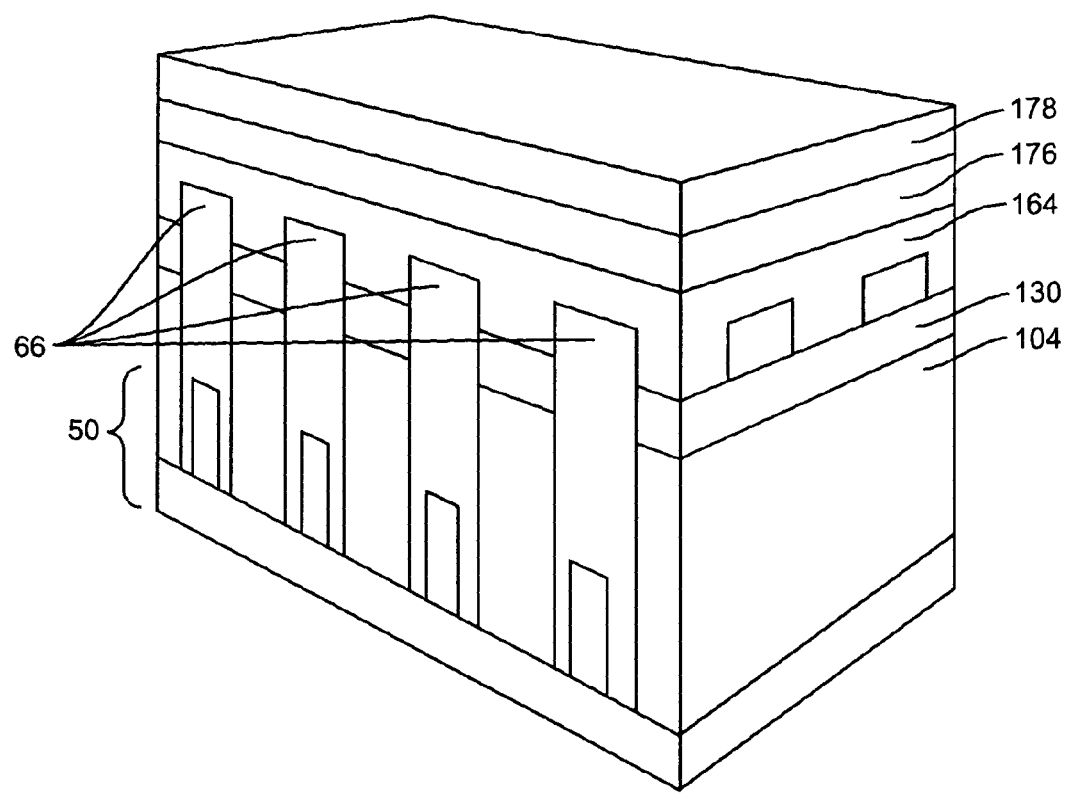
Figure 59:
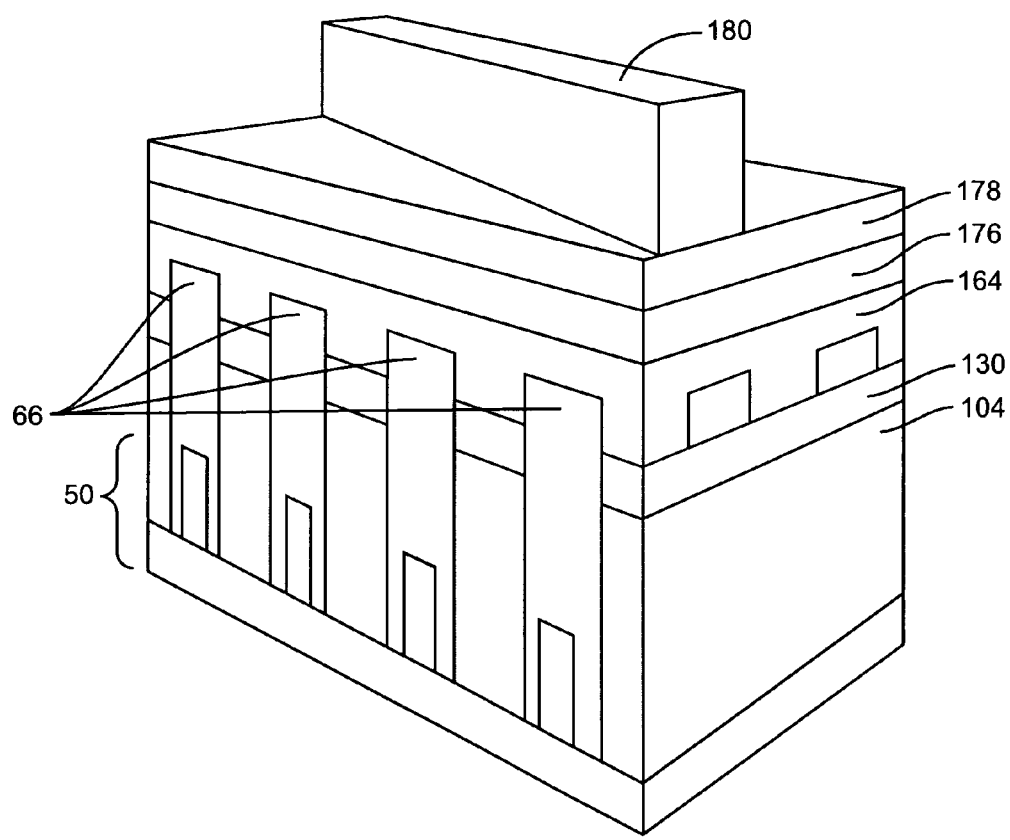
Figure 60:
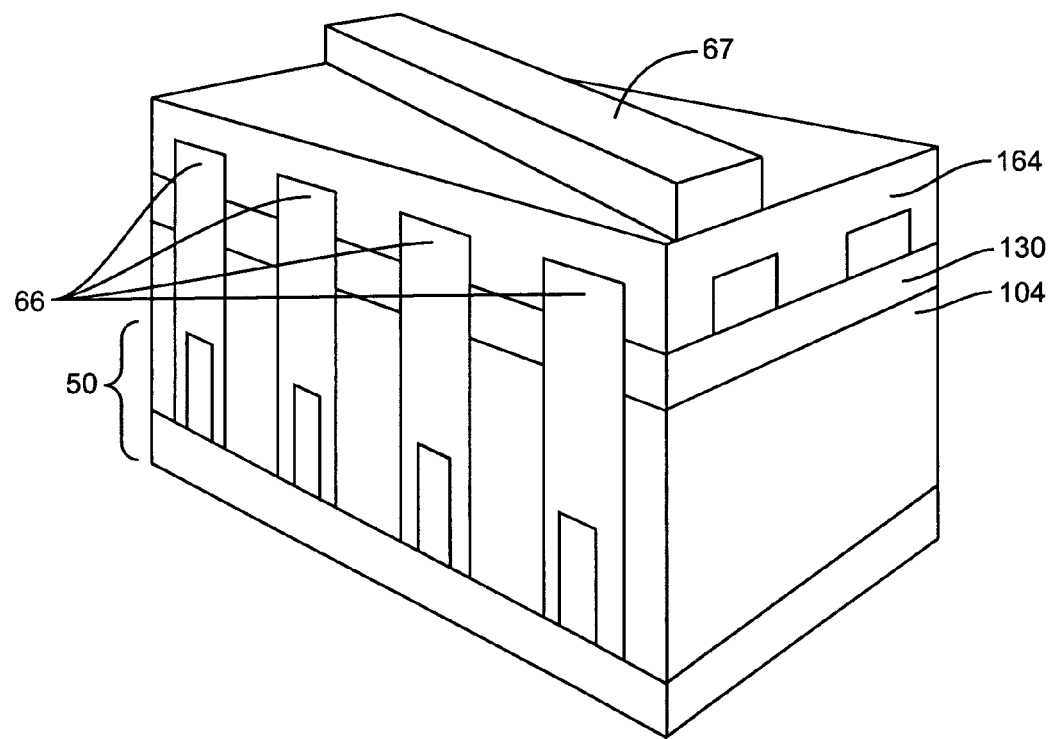

FIGS. 57 through 61 illustrate the formation of the contact line 66 (FIG. 4J) for the word line (WL) for the SRAM cell 10. More specifically, as shown in FIG. 57, a conductive layer 176 is deposited. In FIG. 58, an insulation layer 178 is deposited over the conductive layer 176. Next, a sacrificial structure 180 is formed on a diagonal corresponding to the desired location of the contact line 66, as shown in FIG. 59. The sacrificial structure 180 may be formed using a conventional photolithography process or a positive spacer lithography process. Using the sacrificial structure 180 as a mask, etching is performed in order to form the contact line 67 as shown in FIG. 60. An insulation layer 182 is then deposited as shown in FIG. 61 to complete the fabrication of the SRAM cell 10.

It should be noted that the process for fabricating SRAM cells 10 described above is exemplary and is not intended to limit the scope of the present invention. Numerous variations in the processing steps will be apparent to one of ordinary skill in the art upon reading this disclosure.

Those skilled in the art will recognize improvements and modifications to the preferred embodiments of the present invention. All such improvements and modifications are considered within the scope of the concepts disclosed herein and the claims that follow.

What is claimed is:

1. A method comprising:
   providing a substrate; and
   forming at least one negative feature in the substrate utilizing a negative spacer lithography process, wherein forming the at least one negative feature comprises:
      forming a first sacrificial structure on top of the substrate;
      depositing a first spacer material on top of the first sacrificial structure and a portion of the substrate exposed after formation of the first sacrificial structure;
      anisotropically etching the first spacer material to form at least one spacer adjacent to a side-wall of the first sacrificial structure;
      depositing a first sacrificial layer on top of the first sacrificial structure, the at least one spacer, and a portion of the substrate exposed after formation of the first sacrificial structure and the at least one spacer;
      thinning the first sacrificial layer to expose the at least one spacer;
      removing the at least one spacer; and
      etching the substrate using the first sacrificial structure and the first sacrificial layer remaining after removing the at least one spacer as a mask to provide the at least one negative feature.

2. A method comprising:
   providing a substrate; and
   forming at least one negative feature in the substrate utilizing a negative spacer lithography process, wherein the at least one negative feature comprises a cut-line, and forming the at least one negative feature comprises:
      forming a first linear sacrificial structure on top of the substrate;
      depositing a first spacer material on top of the first linear sacrificial structure and a portion of the substrate exposed after formation of the first linear sacrificial structure;
      anisotropically etching the first spacer material to form at least one spacer adjacent to a side-wall of the first linear sacrificial structure;
      depositing a first linear sacrificial layer on top of the first linear sacrificial structure, the at least one spacer, and a portion of the substrate exposed after formation of the first linear sacrificial structure and the at least one spacer;
      thinning the first linear sacrificial layer to expose the at least one spacer;
      removing the at least one spacer; and
      etching the substrate using the first linear sacrificial structure and the first linear sacrificial layer remaining after removing the at least one spacer as a mask to provide the cut-line.

3. The method of claim 2 wherein forming the first linear sacrificial structure comprises forming the first linear sacrificial structure on top of the substrate using a positive spacer lithography process.

4. The method of claim 2 wherein forming the first linear sacrificial structure comprises forming the first linear sacrificial structure on top of the substrate using a photolithography process.

5. The method of claim 2 wherein removing the at least one spacer comprises removing the at least one spacer using a selective etch.

6. A method comprising:
   providing a substrate; and
   forming at least one negative feature in the substrate utilizing a negative spacer lithography process, wherein the at least one negative feature comprises a hole, and forming the at least one negative feature comprises:
      forming a first linear sacrificial structure on top of the substrate;
      depositing a first spacer material on top of the first linear sacrificial structure and a portion of the substrate exposed after formation of the first linear sacrificial structure;
      anisotropically etching the first spacer material to form at least one first spacer adjacent to a side-wall of the first linear sacrificial structure;
      depositing a first sacrificial layer on top of the first linear sacrificial structure, the at least one first spacer, and a portion of the substrate exposed after formation of the first linear sacrificial structure and the at least one first spacer;
      thinning the first sacrificial layer to expose the at least one first spacer;
      forming a second linear sacrificial structure on top of the first linear sacrificial structure, the at least one first spacer, and the first sacrificial layer such that the second linear sacrificial structure crosses over the at least one first spacer;
      depositing a second spacer material on top of the second linear sacrificial structure and a portion of the first linear sacrificial structure, the at least one first spacer, and the first sacrificial layer exposed after formation of the second linear sacrificial structure;
      anisotropically etching the second spacer material to form at least one second spacer adjacent to a side-wall of the second linear sacrificial structure, the at least one second spacer crossing over the at least one first spacer at a desired location of the hole;
      depositing a second sacrificial layer on top of the second linear sacrificial structure, the at least one second spacer, and a portion of the first linear sacrificial structure, the at least one first spacer, and the first sacrificial layer exposed after formation of the second linear sacrificial structure and the at least one second spacer;
      thinning the second sacrificial layer to expose the at least one second spacer;
      removing, at least partially, the at least one first spacer and the at least one second spacer to expose a portion of the substrate corresponding to the desired location of the hole; and
      etching the substrate using the first and second linear sacrificial structures and the first and second sacrificial layers remaining after removing, at least partially, the at least one first spacer and the at least one second spacer as a mask to provide the hole.

7. The method of claim 6 wherein removing, at least partially, the at least one first spacer and the at least one second spacer comprises anisotropically etching the at least one first spacer and the at least one second spacer.

8. The method of claim 6 wherein removing, at least partially, the at least one first spacer and the at least one second spacer comprises isotropically etching the at least one first spacer and the at least one second spacer.

* * * * *

UNITED STATES PATENT AND TRADEMARK OFFICE
CERTIFICATE OF CORRECTION

PATENT NO. : 8,101,481 B1 Page 1 of 1
APPLICATION NO. : 12/036836
DATED : January 24, 2012
INVENTOR(S) : Andrew E. Carlson It is certified that error appears in the above-identified patent and that said Letters Patent is hereby corrected as shown below:

Please add the following to Column 1, Lines 3-4 as the first paragraph of the specification:

--This invention was made with government funds under contract number HR0011-07-3-0002 awarded by DARPA. The U.S. Government has certain rights in this invention.--

Signed and Sealed this
Fourteenth Day of May, 2013

Teresa Stanek Rea
*Acting Director of the United States Patent and Trademark Office*